(12) United States Patent
Song et al.

(10) Patent No.: US 12,484,355 B2
(45) Date of Patent: Nov. 25, 2025

(54) DISPLAY DEVICE

(71) Applicant: Samsung Display Co., LTD., Yongin-si (KR)

(72) Inventors: Myeong Hun Song, Pyeongtaek-si (KR); Ki Nyeng Kang, Sejong-si (KR); Je Min Lee, Asan-si (KR); Seung Jin Chu, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 868 days.

(21) Appl. No.: 17/590,975

(22) Filed: Feb. 2, 2022

(65) Prior Publication Data

US 2022/0406978 A1    Dec. 22, 2022

(30) Foreign Application Priority Data

Jun. 16, 2021    (KR) .......................... 10-2021-0077929

(51) Int. Cl.
*H10H 20/857*    (2025.01)
*H10H 20/832*    (2025.01)
*H10H 29/14*    (2025.01)

(52) U.S. Cl.
CPC ........ *H10H 20/857* (2025.01); *H10H 20/832* (2025.01); *H10H 29/142* (2025.01)

(58) Field of Classification Search
CPC .............. H01L 25/0753; H10H 20/813; H10H 20/832; H10H 20/857; H10H 29/142
USPC .......................................................... 257/79
See application file for complete search history.

(56) References Cited

U.S. PATENT DOCUMENTS

| | | | |
|---|---|---|---|
| 11,798,954 B2 | 10/2023 | Chang et al. | |
| 2015/0050758 A1 | 2/2015 | Ko et al. | |
| 2018/0062092 A1* | 3/2018 | Jeong ................... | H10K 77/111 |
| 2021/0384271 A1* | 12/2021 | Ahn ....................... | H10K 71/70 |

(Continued)

FOREIGN PATENT DOCUMENTS

| | | |
|---|---|---|
| KR | 10-2012-0096256 | 8/2012 |
| KR | 10-2019-0052327 | 5/2019 |
| KR | 10-2020-0034906 | 4/2020 |

(Continued)

OTHER PUBLICATIONS

International Search Report corresponding to International Application No. PCT/KR2022/008381 dated Sep. 21, 2022.

(Continued)

*Primary Examiner* — Ori Nadav
(74) *Attorney, Agent, or Firm* — Womble Bond Dickinson (US) LLP

(57) ABSTRACT

A display device includes a display area, and a pad area, a first electrode and a second electrode extending in a first direction in the display area and spaced apart from each other in a second direction, light emitting elements disposed on the first electrode and the second electrode in the display area, pad lines extending in the first direction in the pad area and spaced apart from each other in the second direction, dummy lines extending in the first direction in the pad area and spaced apart from the pad lines in the second direction, and dummy patterns electrically connected to at least part of the dummy lines. The dummy lines include first dummy lines and second dummy lines spaced apart from the first dummy lines in the first direction.

20 Claims, 30 Drawing Sheets

(56) References Cited

U.S. PATENT DOCUMENTS

2021/0399069 A1* 12/2021 Kim .................... H10K 59/131
2022/0102331 A1   3/2022 Do et al.

FOREIGN PATENT DOCUMENTS

| KR | 10-2020-0088951 | 7/2020 |
| KR | 10-2021-0039521 | 4/2021 |
| KR | 10-2021-0065238 | 6/2021 |

OTHER PUBLICATIONS

Written Opinion corresponding to International Application No. PCT/KR2022/008381, dated Sep. 21, 2022.

* cited by examiner

DISPLAY DEVICE

CROSS-REFERENCE TO RELATED APPLICATION

This application claims priority to and the benefit of Korean Patent Application No. 10-2021-0077929 under 35 U.S.C. § 119, filed on Jun. 16, 2021, in the Korean Intellectual Property Office (KIPO), the contents of which are incorporated herein by reference.

BACKGROUND

1. Technical Field

The disclosure relates to a display device.

2. Description of the Related Art

The importance of display devices has increased with the development of multimedia. Accordingly, various types of display devices such as an organic light emitting display (OLED) and a liquid crystal display (LCD) have been used.

There is a self-light emitting display device including a light emitting element as a device displaying an image of the display device. The self-light emitting display device is a light emitting element, and includes an organic light emitting display device using an organic material as a light emitting material, an inorganic light emitting display device using an inorganic material as a light emitting material as a light emitting element, or the like.

SUMMARY

Aspects of the disclosure provide a display device in which permeation of outside air is prevented.

However, aspects of the disclosure are not restricted to those set forth herein. The above and other aspects of the disclosure will become more apparent to one of ordinary skill in the art to which the disclosure pertains by referencing the detailed description of the disclosure given below.

In the display device according to an embodiment, lines exposed to the outside may be dummy lines separated from lines connected to the display area. In the display device, even though outside air flows into the dummy lines due to the exposure of the dummy lines to the outside, a permeation path of the outside air from the dummy lines to the display area is blocked, and thus, damage to the lines due to permeation of the outside air may be prevented.

The effects of the disclosure are not limited to the aforementioned effects, and various other effects are included in the specification.

According to an embodiment of the disclosure, a display device may comprise a display area in which pixels are arranged in a first direction and a second direction, a pad area disposed on a side of the display area in the first direction, a first electrode and a second electrode extending in the first direction in the display area and spaced apart from each other in the second direction, light emitting elements disposed on the first electrode and the second electrode in the display area, pad lines extending in the first direction in the pad area and spaced apart from each other in the second direction, dummy lines extending in the first direction in the pad area and spaced apart from the pad lines in the second direction, and dummy patterns electrically connected to at least part of the dummy lines. The dummy lines may include first dummy lines and second dummy lines spaced apart from the first dummy lines in the first direction, and the dummy patterns may include a first dummy pattern electrically connected to the first dummy line; and a second dummy pattern electrically connected to the second dummy line and spaced apart from the first dummy pattern in the first direction.

The display device may further comprise a first dummy electrode disposed on the first dummy pattern, and a second dummy electrode disposed on the second dummy pattern and spaced apart from the first dummy electrode.

First dummy patterns and second dummy patterns may be disposed to correspond to the first dummy lines and the second dummy lines, respectively, and the first dummy patterns and the second dummy patterns may be spaced apart from each other in the second direction, respectively.

The first dummy pattern may be electrically connected to the first dummy lines, and the second dummy pattern may be electrically connected to the second dummy lines.

The first dummy electrode, the second dummy electrode, and the first electrode may include a same material, or the first dummy electrode, the second dummy electrode, and the second electrode may include a same material.

The display device may further comprise pads disposed on the pad lines and electrically connected to the pad lines, respectively.

The dummy lines may be disposed on both sides of the pad area in the second direction, and the pad lines and the pads may be disposed between the dummy lines disposed on the both sides of the pad area.

The dummy patterns may be disposed so as not to be side by side with the pads in the second direction.

The dummy patterns may be disposed more adjacent to the display area than the pads are.

The dummy patterns may be disposed side by side with the pads in the second direction.

The display device may further comprise a connection line extending in the second direction and electrically connected to the second dummy lines. The connection line may be spaced apart from the pads in the first direction.

The pad lines may include first pad lines spaced apart from each other in the second direction, second pad lines disposed on a side of the first pad lines in the second direction, and a third pad line disposed between the first pad lines and the first dummy lines.

The display device may further comprise fan-out lines disposed on a side of the pad lines in the first direction and electrically connected to at least part of the pad lines, wherein the connection line may overlap the fan-out lines in a plan view.

The fan-out lines may include a first fan-out line electrically connected to the first pad lines, a second fan-out line electrically connected to the second pad lines and disposed inside the first fan-out line, and a third fan-out line electrically connected to the third pad line and disposed outside the first fan-out line.

According to an embodiment of the disclosure, a display device may comprise a gate insulating layer disposed on a first substrate, a first conductive layer including dummy lines disposed on the gate insulating layer, and pad lines spaced apart from the dummy lines, a first interlayer insulating layer disposed on the first conductive layer, a second conductive layer disposed on the first interlayer insulating layer and including dummy patterns electrically connected to at least part of the dummy lines and a pad base layer electrically connected to the pad line, a first passivation layer disposed on the second conductive layer, a third conductive layer including, on the first passivation layer, dummy electrodes disposed on the dummy patterns, and a pad upper layer disposed on the pad base layer, and a first insulating layer disposed on the third conductive layer. The dummy line includes a first dummy line, and a second dummy line spaced apart from the first dummy line, and the dummy pattern includes a first dummy pattern electrically connected to the first dummy line through a first contact hole penetrating through the first interlayer insulating layer, and a second dummy pattern spaced apart from the first dummy pattern and electrically connected to the second dummy line through a second contact hole penetrating through the first interlayer insulating layer.

The second conductive layer may include a connection line overlapping the second dummy line in a plan view, and the connection line may be electrically connected to the second dummy line through a third contact hole penetrating through the first interlayer insulating layer.

A side surface of the first dummy line may be exposed at an edge of a side of the substrate.

The display device may further comprise a second insulating layer disposed on the first insulating layer, and a third insulating layer disposed on the second insulating layer. The first insulating layer and the second insulating layer may expose a portion where the first dummy pattern and the second dummy pattern are spaced apart from each other, and the third insulating layer may overlap in a plan view the portion where the first dummy pattern and the second dummy pattern are spaced apart from each other.

The display device may further comprise a first pad capping layer disposed on the pad upper layer, and a second pad capping layer disposed on the first pad capping layer. The second insulating layer may be disposed between the first pad capping layer and the first insulating layer, and the third insulating layer may be disposed between the first pad capping layer and the second pad capping layer.

The dummy electrode may include a first dummy electrode disposed on the first dummy pattern and a second dummy electrode disposed on the second dummy pattern, and inner sides of the first dummy electrode and the second dummy electrode facing each other may be side by side with inner sides of the first dummy pattern and the second dummy pattern facing each other, respectively.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

The disclosure will now be described more fully hereinafter with reference to the accompanying drawings, in which embodiments of the disclosure are shown. This disclosure may, however, be embodied in different forms and should not be construed as limited to the embodiments set forth herein. Rather, these embodiments are provided so that this disclosure will be thorough and complete, and will convey the scope of the disclosure to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," and the like may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element.

It will be understood that the terms "contact," "connected to," and "coupled to" may include a physical and/or electrical contact, connection, or coupling, and vice versa.

The phrase "at least one of" is intended to include the meaning of "at least one selected from the group of" for the purpose of its meaning and interpretation. For example, "at least one of A and B" may be understood to mean "A, B, or A and B."

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

Hereinafter, embodiments will be described with reference to the accompanying drawings.

Figure 1:
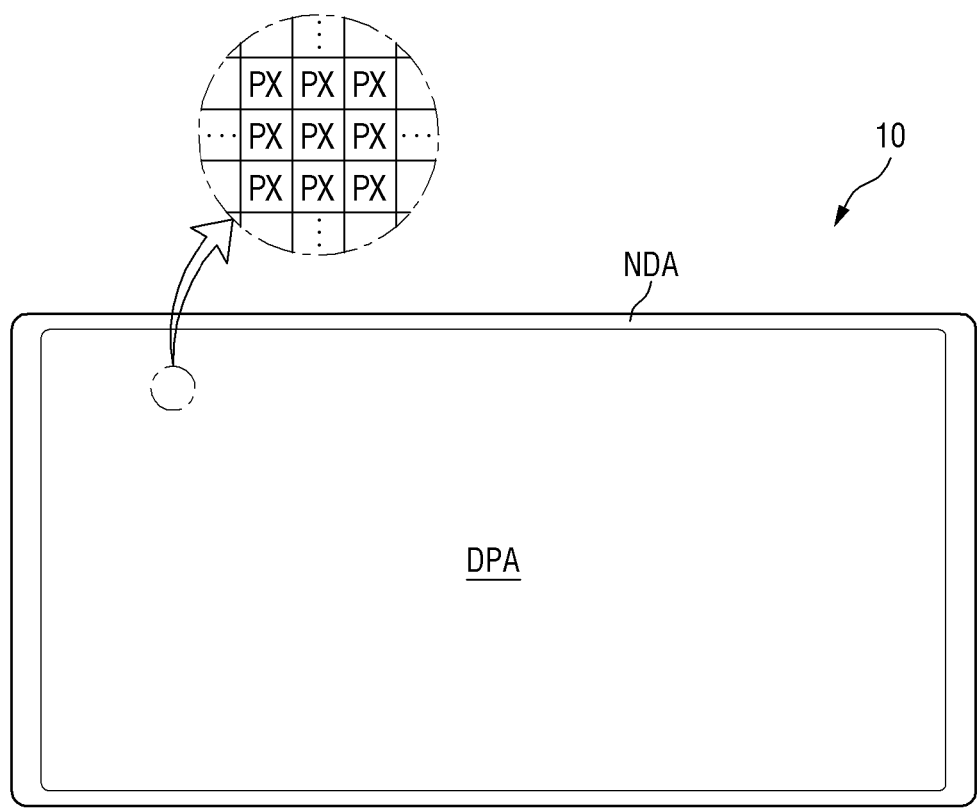
FIG. 1 is a schematic plan view of a display device according to an embodiment.

FIG. 1 is a schematic plan view of a display device according to an embodiment.

Referring to FIG. 1, a display device 10 displays a moving image or a still image. The display device 10 may refer to all electronic devices that provide display screens. For example, the display device 10 may include televisions, laptop computers, monitors, billboards, the Internet of Things (IoT) devices, mobile phones, smartphones, tablet personal computers (PCs), electronic watches, smartwatches, watch phones, head-mounted displays, mobile communication terminals, electronic organizers, electronic books, portable multimedia players (PMPs), navigation devices, game machines, digital cameras, camcorders, and the like, which provide display screens.

The display device 10 includes a display panel providing a display screen. Examples of the display panel include an inorganic light emitting diode display panel, an organic light emitting display panel, a quantum dot light emitting display panel, a plasma display panel, a field emission display panel, and the like. Hereinafter, a case where an inorganic light emitting diode display panel is applied as an example of the display panel will be described by way of example, but the disclosure is not limited thereto, and the same technical idea may be applied to other display panels if applicable.

A shape of the display device 10 may be variously changed. For example, the display device 10 may have a shape such as a rectangular shape with a width greater than a length, a rectangular shape with a length greater than a width, a square shape, a rectangular shape with rounded corners (vertices), other polygonal shapes, or a circular shape. A shape of a display area DPA of the display device 10 may also be similar to an overall shape of the display device 10. In FIG. 1, the display device 10 having a rectangular shape with an elongated length in a second direction DR2 is illustrated.

The display device 10 may include a display area DPA and a non-display area NDA. The display area DPA is an area in which an image may be displayed, and the non-display area NDA is an area in which an image is not displayed. The display area DPA may also be referred to as an active area, and the non-display area NDA may also be referred to as a non-active area. The display area DPA may occupy substantially the center of the display device 10.

The display area DPA may include pixels PX. The pixels PX may be arranged in a matrix direction. A shape of each pixel PX may be a rectangular shape or a square shape in a plan view, but the disclosure is not limited thereto, and may also have a rhombic shape of which each side is inclined with respect to a direction. The respective pixels PX may be alternately arranged in a stripe type or an island type. Each of the pixels PX may include one or more light emitting elements emitting light of a specific wavelength band to display a specific color.

The non-display area NDA may be disposed around the display area DPA. The non-display area NDA may entirely or partially surround the display area DPA. The display area DPA may have a rectangular shape, and the non-display area NDA may be disposed adjacent to four sides of the display area DPA. The non-display area NDA may form (or constitute) a bezel of the display device 10. Lines or circuit drivers included in the display device 10 may be disposed, or external devices may be mounted, in each of the non-display areas NDA.

Figure 2:
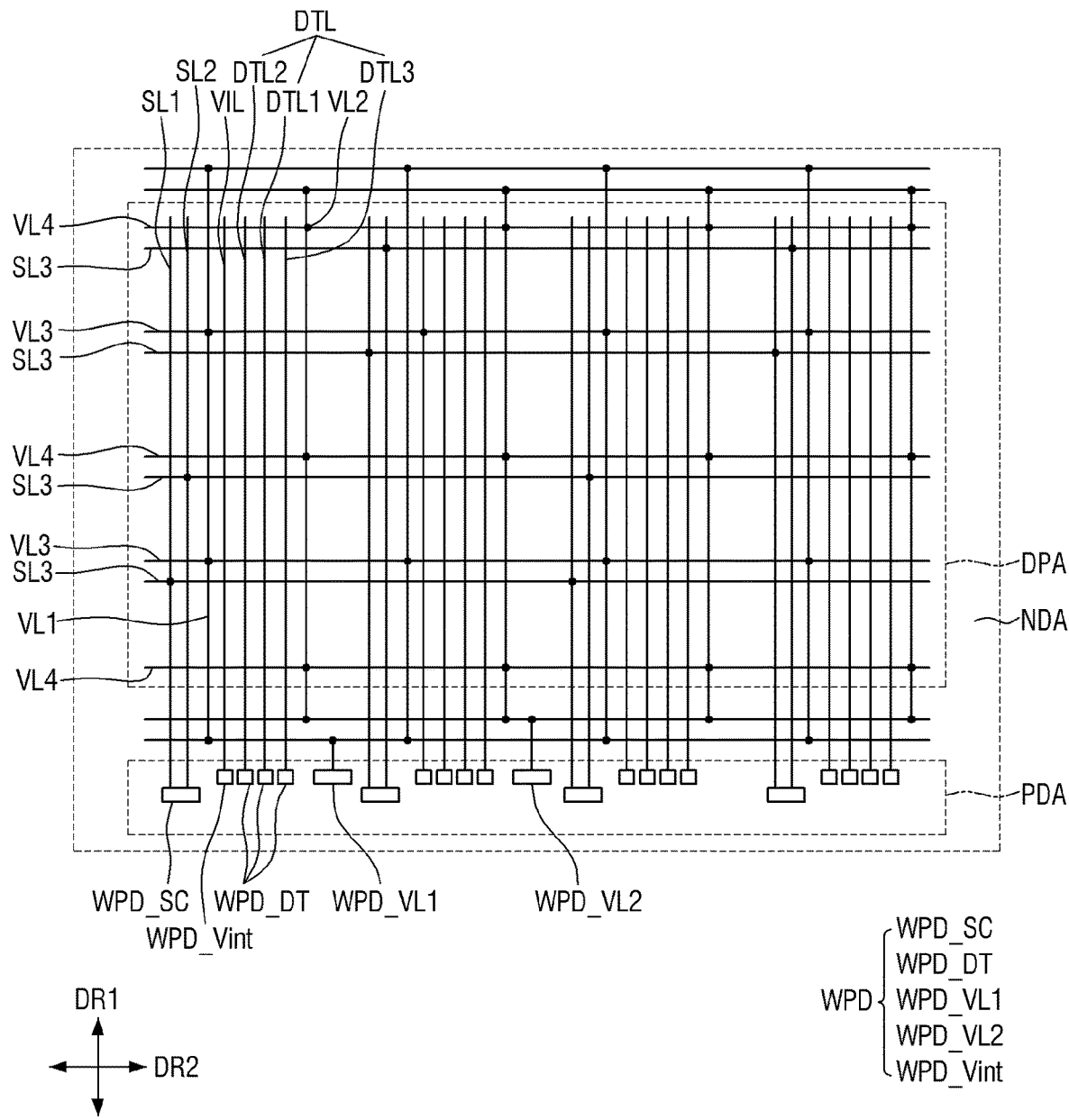
FIG. 2 is a schematic plan view illustrating a layout of lines included in the display device according to an embodiment.

FIG. 2 is a schematic plan view illustrating a layout of lines included in the display device according to an embodiment.

Referring to FIG. 2, the display device 10 may include lines. The display device 10 may include scan lines SL (e.g., SL1, SL2, and SL3), data lines DTL (e.g., DTL1, DTL2, and DTL3), an initialization voltage line VIL, and voltage lines VL (e.g., VL1, VL2, VL3, and VL4). Although not illustrated in FIG. 2, other lines may be further disposed in the display device 10.

First scan lines SL1 and second scan lines SL2 may be disposed to extend in a first direction DR1. The first scan line SL1 and the second scan line SL2 may be disposed to be adjacent to each other, and may be disposed to be spaced from the other first scan lines SL1 and second scan lines SL2 in the second direction DR2. The first scan lines SL1 and the second scan lines SL2 may be electrically connected to scan wiring pads WPD_SC electrically connected to a scan driver (not illustrated). The first scan lines SL1 and the second scan lines SL2 may be disposed to extend from a pad area PDA disposed in the non-display area NDA to the display area DPA.

A third scan line SL3 may be disposed to extend in the second direction DR2, and may be disposed to be spaced from the other third scan lines SL3 in the first direction DR1. One third scan line SL3 may be electrically connected to one or more first scan lines SL1 or one or more second scan lines SL2. In an embodiment, the first scan line SL1 and the second scan line SL2 may be formed of a conductive layer disposed on a different layer from the third scan line SL3. The scan lines SL may have a mesh structure in the entirety of the display area DPA, but the disclosure is not limited thereto.

In the specification, the term "connection" may mean not only that any one member is connected to another member through physical contact with another member, but also that any one member is connected to another member through the other member. In addition, it may be understood that any one portion and another portion as one integrated member are interconnected through the integrated member. Furthermore, a connection between any one member and another member may be interpreted as an electrical connection through the other member in addition to a connection through direct contact therebetween.

The data lines DTL may be disposed to extend in the first direction DR1. The data lines DTL may include first data lines DTL1, second data lines DTL2, and third data lines DTL3, and one of first to third data lines DTL1, DTL2, and DTL3 form one pair and are disposed adjacent to each other. Each of the data lines DTL1, DTL2, and DTL3 may be disposed to extend from the pad area PDA disposed in the non-display area NDA to the display area DPA. However, the disclosure is not limited thereto, and the data lines DTL may be disposed to be spaced apart from each other at equal intervals between a first voltage line VL1 and a second voltage line VL2 to be described below.

The initialization voltage lines VIL may be disposed to extend in the first direction DR1. The initialization voltage lines VIL may be disposed between the data lines DTL and the first and second scan lines SL1 and SL2. The initialization voltage lines VIL may be disposed to extend from the pad area PDA disposed in the non-display area NDA to the display area DPA.

First voltage lines VL1 and second voltage lines VL2 are disposed to extend in the first direction DR1, and third voltage lines VL3 and fourth voltage lines VL4 are disposed to extend in the second direction DR2. The first voltage lines VL1 and the second voltage lines VL2 may be alternately disposed in the second direction DR2, and the third voltage lines VL3 and the fourth voltage lines VL4 may be alternately disposed in the first direction DR1. The first voltage lines VL1 and the second voltage lines VL2 may be disposed to extend in the first direction DR1 to cross the display area DPA, and some of each of the third voltage lines VL3 and the fourth voltage lines VL4 and may be disposed in the display area DPA, and the others of each of the third voltage lines VL3 and the fourth voltage lines VL4 may be disposed in the non-display areas NDA positioned on both sides of the display area DPA in the first direction DR1. The first voltage line VL1 and the second voltage line VL2 may be formed of a conductive layer disposed on a different layer from the third voltage line VL3 and the fourth voltage line VL4. The first voltage line VL1 is electrically connected to at least one third voltage line VL3, and the second voltage line VL2 is electrically connected to at least one fourth voltage line VL4, such that the voltage lines VL may have a mesh structure in the entirety of the display area DPA. However, the disclosure is not limited thereto.

The first scan line SL1, the second scan line SL2, the data line DTL, the initialization voltage line VIL, the first voltage line VL1, and the second voltage line VL2 may be electrically connected to at least one wiring pad WPD. Each wiring pad WPD may be disposed in the non-display area NDA. In an embodiment, each of the wiring pads WPD may be disposed in the pad area PDA positioned on the lower side of the display area DPA, which is the other side of the display area DPA in the first direction DR1. The first scan line SL1 and the second scan line SL2 are electrically connected to a scan wiring pad WPD_SC disposed in the pad area PDA, and the data lines DTL are electrically connected to different data wiring pads WPD_DT, respectively. The initialization voltage line VIL is electrically connected to an initialization line pad WPD_Vint, the first voltage line VL1 is electrically connected to a first voltage line pad WPD VL1, and the second voltage line VL2 is electrically connected to a second voltage line pad WPD_VL2. An external device may be mounted on the wiring pad WPD. The external device may be mounted on the wiring pad WPD through an anisotropic conductive film, ultrasonic bonding, or the like. FIG. 2 illustrates that each of the wiring pads WPD is disposed in the pad area PDA disposed on the lower side of the display area DPA, but the disclosure is not limited thereto. Some of wiring pads WPD may also be disposed on the upper side of the display area DPA or on any one of the left side and the right side thereof.

Each pixel PX or sub-pixel SPXn (where n is an integer of 1 to 3) of the display device 10 includes a pixel driving circuit. The above-described lines may apply driving signals to the respective pixel driving circuits while passing through the respective pixels PX or around the respective pixels PX. The pixel driving circuit may include a transistor and a capacitor. The numbers of transistors and capacitors in each pixel driving circuit may be variously modified. According to an embodiment, each sub-pixel SPXn of the display device 10 may have a 3T1C structure in which the pixel driving circuit includes three transistors and a capacitor. Hereinafter, the pixel driving circuit will be described as using the 3T1C structure as an example, but the disclosure is not limited thereto, and various other modified structures such as a 2T1C structure, a 7T1C structure, and a 6T1C structure may be applied.

Figure 3:
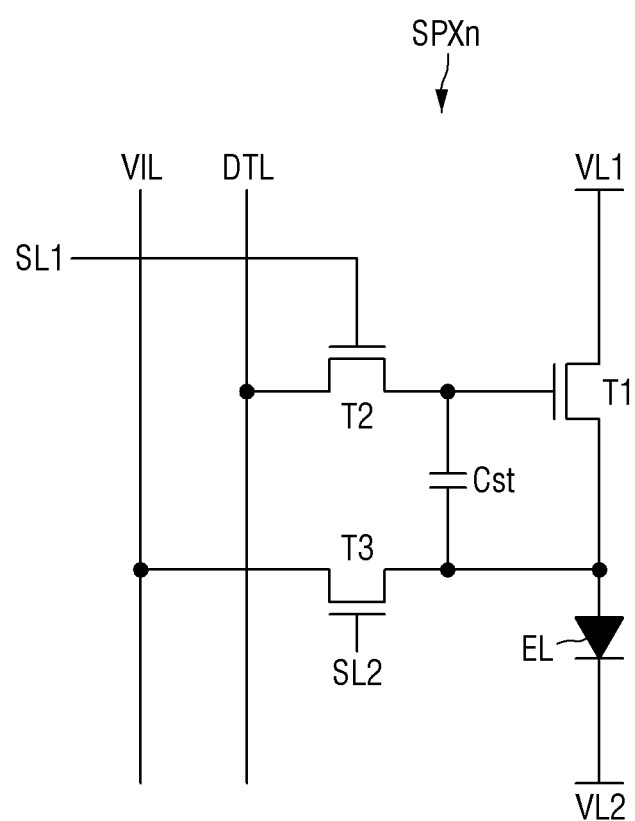
FIG. 3 is a schematic diagram of an equivalent circuit of a sub-pixel of the display device according to an embodiment.

FIG. 3 is a schematic diagram of an equivalent circuit of a sub-pixel according to an embodiment.

Referring to FIG. 3, each sub-pixel SPXn of the display device 10 according to an embodiment includes three transistors T1, T2, and T3 and a storage capacitor Cst, in addition to a light emitting diode EL.

The light emitting diode EL emits light according to a current supplied through a first transistor T1. The light emitting diode EL includes a first electrode, a second electrode, and at least one light emitting element disposed therebetween. The light emitting element may emit light of a specific wavelength band by electrical signals transferred from the first electrode and the second electrode.

One end (or first end) of the light emitting diode EL is electrically connected to a source electrode of the first transistor T1, and the other end (or second end) of the light emitting diode EL may be electrically connected to the second voltage line VL2 to which a low-potential voltage (hereinafter referred to as a second source voltage) lower than a high-potential voltage (hereinafter referred to as a first source voltage) of the first voltage line VL1 is supplied.

The first transistor T1 adjusts a current flowing from the first voltage line VL1, to which the first source voltage is supplied, to the light emitting diode EL according to a voltage difference between a gate electrode and the source electrode thereof. As an example, the first transistor T1 may be a driving transistor for driving the light emitting diode EL. The gate electrode of the first transistor T1 may be electrically connected to a source electrode of a second transistor T2, the source electrode of the first transistor T1 may be electrically connected to the first electrode of the light emitting diode EL, and a drain electrode of the first transistor T1 may be electrically connected to the first voltage line VL1 to which the first source voltage is applied.

The second transistor T2 is turned on by a scan signal of the first scan line SL1 to electrically connect the data line DTL to the gate electrode of the first transistor T1. A gate electrode of the second transistor T2 may be electrically connected to the first scan line SL1, the source electrode of the second transistor T2 may be electrically connected to the gate electrode of the first transistor T1, and a drain electrode of the second transistor T2 may be electrically connected to the data line DTL.

A third transistor T3 is turned on by a scan signal of the second scan line SL2 to electrically connect the initialization voltage line VIL to one end of the light emitting diode EL. A gate electrode of the third transistor T3 is electrically connected to the second scan line SL2, a drain electrode of the third transistor T3 may be electrically connected to the initialization voltage line VIL, and a source electrode of the third transistor T3 may be electrically connected to one end of the light emitting diode EL or the source electrode of the first transistor T1.

In an embodiment, the source electrode and the drain electrode of each of the transistors T1, T2, and T3 are not limited to those described above, and vice versa. Each of the transistors T1, T2, and T3 may be formed as a thin-film transistor. It has been mainly described in FIG. 3 that each of the transistors T1, T2, and T3 is formed as an N-type metal oxide semiconductor field effect transistor (MOSFET), but the disclosure is not limited thereto. For example, each of the transistors T1, T2, and T3 may be formed as a P-type MOSFET, or some of the transistors T1, T2, and T3 may be formed as an N-type MOSFET and the others of the transistors T1, T2, and T3 may be formed as a P-type MOSFET.

The storage capacitor Cst is formed between the gate electrode and the source electrode of the first transistor T1. The storage capacitor Cst stores a voltage corresponding to a difference between a gate voltage and a source voltage of the first transistor T1.

Hereinafter, a structure of a pixel PX of the display device 10 according to an embodiment will be described in detail with reference to other drawings.

Figure 4:
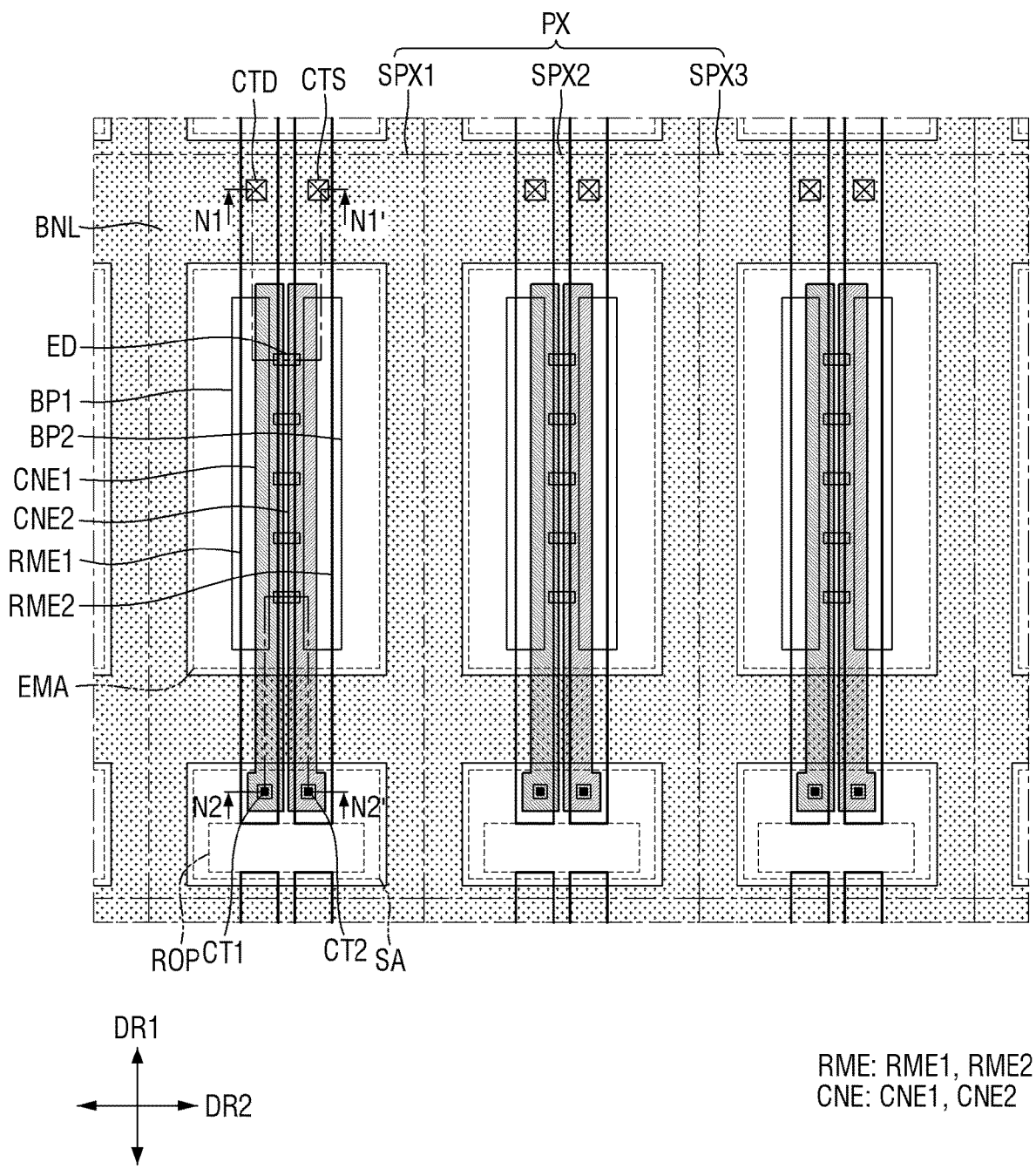
FIG. 4 is a schematic plan view illustrating one pixel of the display device according to an embodiment.

FIG. 4 is a schematic plan view illustrating a pixel of the display device according to an embodiment. FIG. 4 illustrates a layout, in a plan view, of electrodes RME (e.g., RME1 and RME2), bank patterns BP1 and BP2, a bank layer BNL, light emitting elements ED, and connection electrodes CNE (e.g., CNE1 and CNE2) disposed in a pixel PX of the display device 10.

Referring to FIG. 4, each of the pixels PX of the display device 10 may include sub-pixels SPXn. For example, a pixel PX may include a first sub-pixel SPX1, a second sub-pixel SPX2, and a third sub-pixel SPX3. The first sub-pixel SPX1 may emit light of a first color, the second sub-pixel SPX2 may emit light of a second color, and the third sub-pixel SPX3 may emit light of a third color. As an example, the first color may be blue, the second color may be green, and the third color may be red. However, the disclosure is not limited thereto, and the respective sub-pixels SPXn may also emit light of a same color. In an embodiment, the respective sub-pixels SPXn may emit blue light. FIG. 4 illustrates that a pixel PX includes three sub-pixels SPXn, but the disclosure is not limited thereto, and the pixel PX may include a larger number of sub-pixels SPXn.

Each of the sub-pixels SPXn of the display device 10 may include an emission area EMA and a non-emission area. The emission area EMA may be an area in which the light emitting elements ED are disposed to emit light of a specific wavelength band. The non-emission area may be an area in which the light emitting elements ED are not disposed and light emitted from the light emitting elements ED does not arrive, and thus, the light is not emitted.

The emission area EMA may include an area in which the light emitting elements ED are disposed and an area which is adjacent to the light emitting element ED and in which the light emitted from the light emitting elements ED is emitted. For example, the emission area EMA may also include an area in which the light emitted from the light emitting elements ED is reflected or refracted by other members and then emitted. The light emitting elements ED may be disposed in each sub-pixel SPXn, and an emission area including an area in which the light emitting elements ED are disposed and an area adjacent to the light emitting elements ED may be formed.

FIG. 4 illustrates that the emission areas EMA of the respective sub-pixels SPXn have a uniform area, but the disclosure is not limited thereto. In some embodiments, the respective emission areas EMA of the respective sub-pixels SPXn may also have different areas according to a color or a wavelength band of light emitted from the light emitting elements ED disposed in corresponding sub-pixels SPXn.

Each sub-pixel SPXn may further include a sub-area SA disposed in the non-emission area. The sub-area SA of the corresponding sub-pixel SPXn may be disposed on the lower side of the emission area EMA, which is the other side of the emission area EMA in the first direction DR1. The emission areas EMA and the sub-areas SA may be alternately arranged in the first direction DR1, and the sub-area SA may be disposed between the emission areas EMA of different sub-pixels SPXn spaced apart from each other in the first direction DR1. For example, the emission areas EMA and the sub-areas SA may be alternately arranged in the first direction DR1, and each of the emission areas EMA and the sub-areas SA may be repeatedly arranged in the second direction DR2. However, the disclosure is not limited thereto, and the emission areas EMA and the sub-areas SA of the pixels PX may also have an arrangement different from that of FIG. 4.

Light is not emitted from the sub-areas SA because the light emitting elements ED are not disposed in the sub-areas SA, but portions of electrodes RME disposed in each of the sub-pixels SPXn may be disposed in the sub-areas SA. The electrodes RME disposed in different sub-pixels SPXn may be disposed in a separation part ROP of the sub-area SA to be separated from each other.

Each of lines and circuit elements of a circuit layer disposed in each pixel PX and electrically connected to the light emitting diode EL may be electrically connected to the first to third sub-pixels SPX1, SPX2, and SPX3. However, the lines and the circuit elements are not disposed to correspond to an area occupied by each sub-pixel SPXn or emission area EMA, but may be disposed regardless of a position of the emission area EMA within a pixel PX.

The bank layer BNL may be disposed to surround the sub-pixels SPXn, the emission areas EMA, and the sub-areas SA. The bank layer BNL may be disposed at boundaries between the sub-pixels SPXn adjacent to each other in the first direction DR1 and the second direction DR2, and may also be disposed at boundaries between the emission areas EMA and the sub-areas SA. The sub-pixels SPXn, the emission areas EMA, and the sub-areas SA of the display device 10 may be areas divided by a layout of the bank layer BNL. Intervals between the sub-pixels SPXn, the emission areas EMA, and the sub-areas SA may vary according to a width of the bank layer BNL The bank layer BNL may be disposed in a lattice-shaped pattern in the entirety of the display area DPA by including portions of the bank layer BNL extending in the first direction DR1 and the second direction DR2 in a plan view. The bank layer BNL may be disposed across boundaries between the respective sub-pixels SPXn to divide neighboring sub-pixels SPXn. The bank layer BNL may be disposed to surround the emission area EMA and the sub-area SA disposed for each sub-pixel SPXn to divide the emission area EMA and the sub-area SA.

Figure 5:
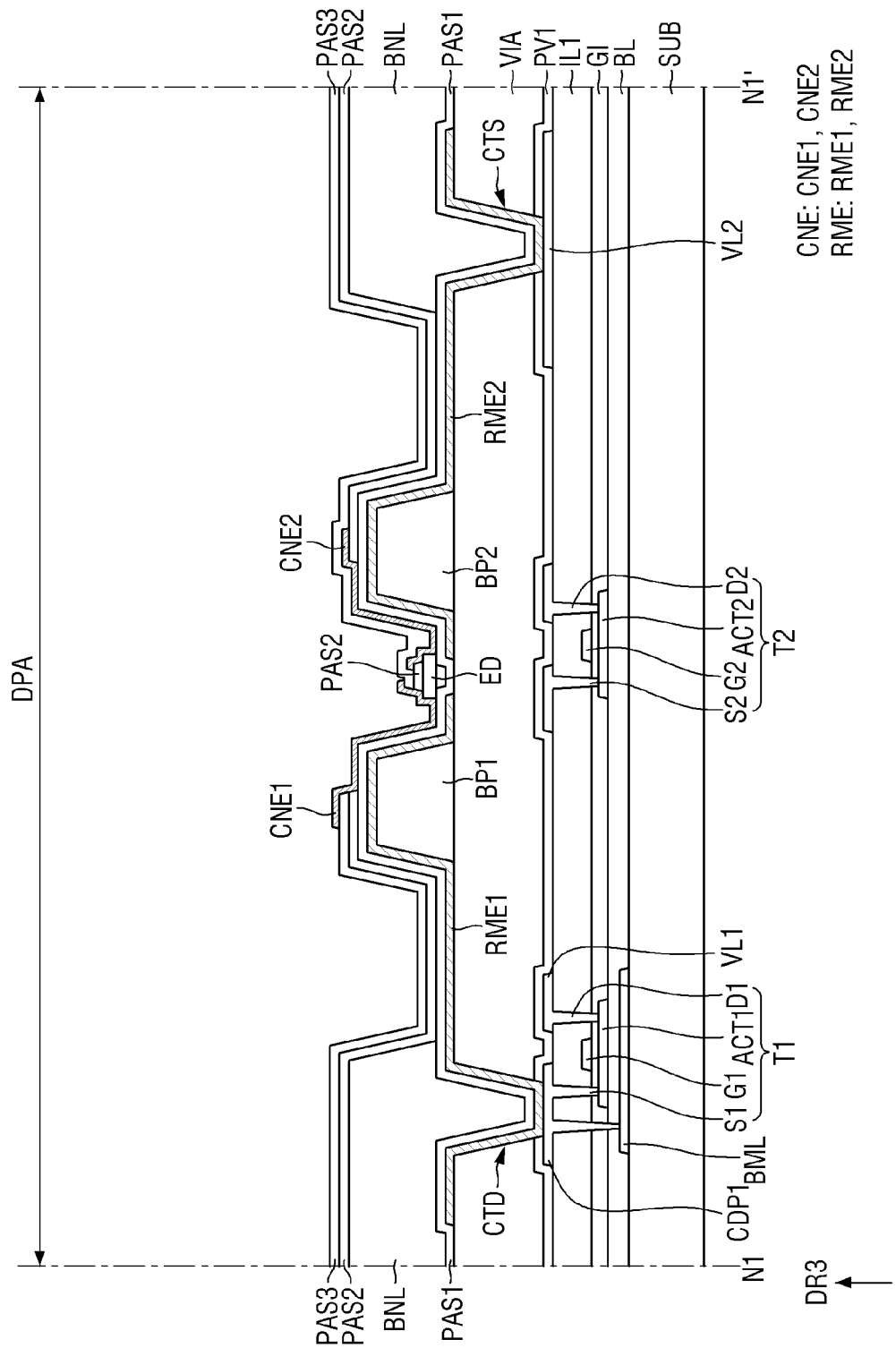
FIG. 5 is a schematic cross-sectional view taken along line N1-N1' of FIG. 4.
Figure 6:
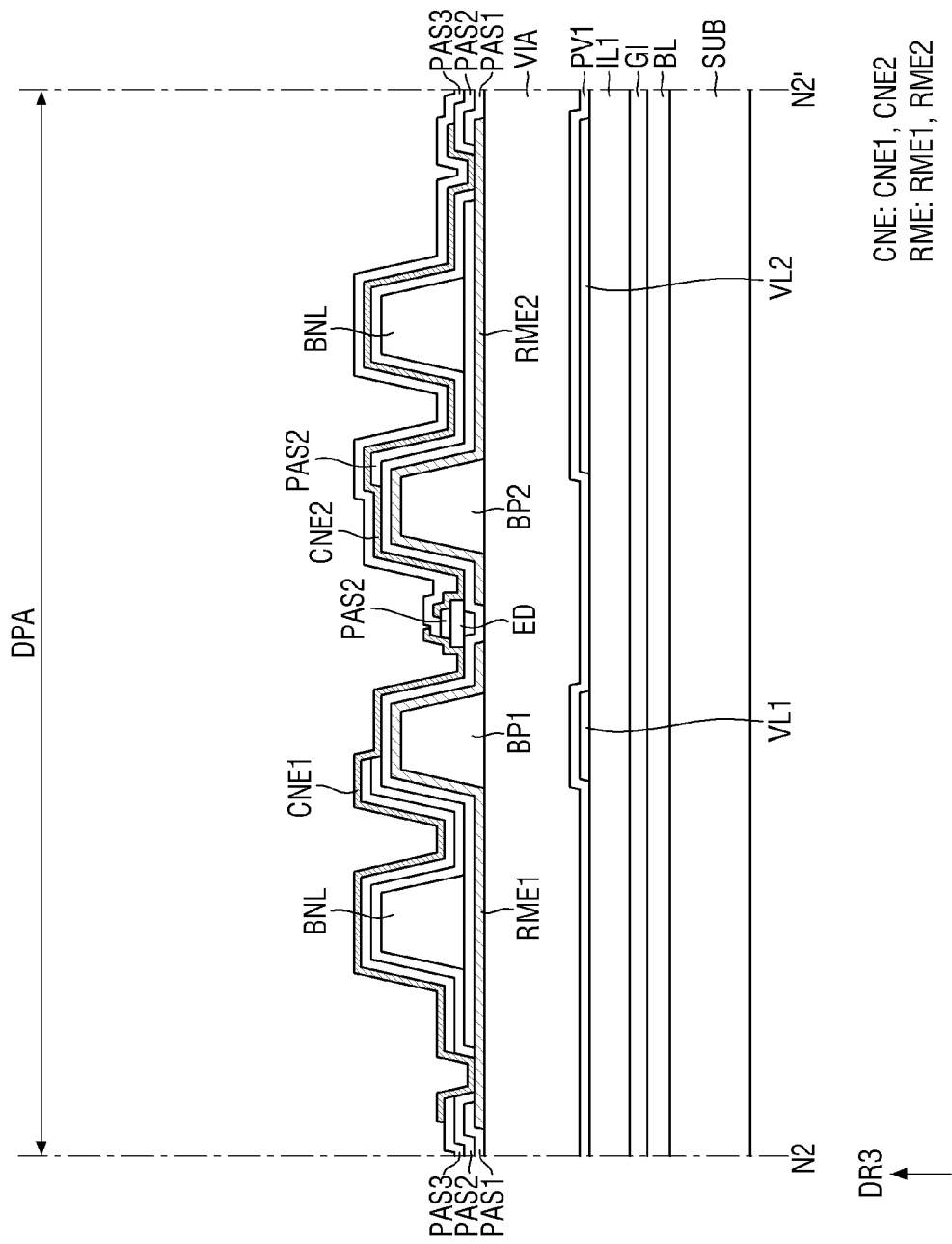
FIG. 6 is a schematic cross-sectional view taken along line N2-N2' of FIG. 4.

FIG. 5 is a schematic cross-sectional view taken along line N1-N1' of FIG. 4. FIG. 6 is a schematic cross-sectional view taken along line N2-N2' of FIG. 4. FIG. 5 illustrates a cross section crossing both ends of the light emitting element ED and electrode contact holes CTD and CTS disposed in the first sub-pixel SPX1, and FIG. 6 illustrates a cross section crossing both ends of the light emitting element ED and contact parts CT1 and CT2 disposed in the first sub-pixel SPX1.

Referring to FIGS. 5 and 6 in conjunction with FIG. 4, the display device 10 may include a first substrate SUB, and a semiconductor layer, conductive layers, and insulating layers disposed on the first substrate SUB. The semiconductor layer, the conductive layers, and the insulating layers may constitute a circuit layer and a display element layer of the display device 10, respectively.

The first substrate SUB may be an insulating substrate. The first substrate SUB may be made of an insulating material such as glass, quartz, or a polymer resin. The first substrate SUB may be a rigid substrate, or may be a flexible substrate that may be bent, folded, or rolled. The first substrate SUB may include a display area DPA and a non-display area NDA surrounding the display area DPA, and the display area DPA may include an emission area EMA and a sub-area SA, which is a portion of a non-emission area.

A first conductive layer may be disposed on the first substrate SUB. The first conductive layer includes a lower metal layer BML, and the lower metal layer BML is disposed to overlap a first active layer ACT1 of a first transistor T1. The lower metal layer BML may include a material blocking light to prevent light from being incident on the first active layer ACT1 of the first transistor T1. However, the lower metal layer BML may be omitted.

A buffer layer BL may be disposed on the lower metal layer BML and the first substrate SUB. The buffer layer BL may be formed on the first substrate SUB in order to protect transistors of the pixel PX from moisture permeating through the first substrate SUB vulnerable to moisture permeation, and may perform a surface planarization function.

The semiconductor layer is disposed on the buffer layer BL. The semiconductor layer may include the first active layer ACT1 of the first transistor T1 and a second active layer ACT2 of a second transistor T2. The first active layer ACT1 and the second active layer ACT2 may be disposed to partially overlap a first gate electrode G1 and a second gate electrode G2 of a second conductive layer, respectively, to be described below.

The semiconductor layer may include polycrystalline silicon, single crystal (or monocrystalline) silicon, an oxide semiconductor, or the like. In an embodiment, the semiconductor layer may include polycrystalline silicon. The oxide semiconductor may be an oxide semiconductor containing indium (In). For example, the oxide semiconductor may be at least one of indium tin oxide (ITO), indium zinc oxide (IZO), indium gallium oxide (IGO), indium zinc tin Oxide (IZTO), indium gallium tin oxide (IGTO), indium gallium zinc oxide (IGZO), and indium gallium zinc tin oxide (IGZTO).

It has been illustrated in the drawings that one first transistor T1 is disposed in the sub-pixel SPXn of the display device 10, but the disclosure is not limited thereto, and the display device 10 may include a larger number of transistors.

A first gate insulating layer GI is disposed on the semiconductor layer and the buffer layer BL. The first gate insulating layer GI may serve as a gate insulating film of each of the transistors T1 and T2.

A second conductive layer is disposed on the first gate insulating layer GI. The second conductive layer may include the first gate electrode G1 of the first transistor T1 and the second gate electrode G2 of the second transistor T2. The first gate electrode G1 may be disposed to overlap a channel region of the first active layer ACT1 in a third direction DR3, which is a thickness direction, and the second gate electrode G2 may be disposed to overlap a channel region of the second active layer ACT2 in the third direction DR3, which is the thickness direction. Although not illustrated in the drawings, the second conductive layer may further include one electrode of the storage capacitor.

A first interlayer insulating layer IL1 is disposed on the second conductive layer. The first interlayer insulating layer IL1 may function as an insulating film between the second conductive layer and other layers disposed on the second conductive layer, and protect the second conductive layer.

A third conductive layer is disposed on the first interlayer insulating layer IL1. The third conductive layer may include a first voltage line VL1 and a second voltage line VL2, a first conductive pattern CDP1, and source electrodes S1 and S2 and drain electrodes D1 and D2 of each of the transistors T1 and T2 disposed in the display area DPA. Although not illustrated in the drawings, the third conductive layer may further include the other electrode of the storage capacitor.

A high-potential voltage (or a first source voltage) transferred to a first electrode RME1 may be applied to the first voltage line VL1, and a low-potential voltage (or a second source voltage) transferred to a second electrode RME2 may be applied to the second voltage line VL2. A portion of the first voltage line VL1 may contact (or may be in contact with) the first active layer ACT1 of the first transistor T1 through a contact hole penetrating through the first interlayer insulating layer IL1 and the first gate insulating layer GI. The first voltage line VL1 may serve as a first drain electrode D1 of the first transistor T1. The second voltage line VL2 may be directly electrically connected to a second electrode RME2 to be described below.

The first conductive pattern CDP1 may contact the first active layer ACT1 of the first transistor T1 through the contact hole penetrating through the first interlayer insulating layer IL1 and the first gate insulating layer GI. The first conductive pattern CDP1 may contact the lower metal layer BML, through another contact hole. The first conductive pattern CDP1 may serve as a first source electrode S1 of the first transistor T1. The first conductive pattern CDP1 may be electrically connected to a first electrode RME1 or a first connection electrode CNE1 to be described below. The first transistor T1 may transfer the first source voltage applied from the first voltage line VL1 to the first electrode RME1 or the first connection electrode CNE1.

A second source electrode S2 and a second drain electrode D2 may contact the second active layer ACT2 of the second transistor T2 through contact holes penetrating through the first interlayer insulating layer IL1 and the first gate insulating layer GI, respectively. The second transistor T2 may be any of the switching transistors described above with reference to FIG. 3. The second transistor T2 may transfer a signal applied from the data line DTL of FIG. 3 to the first transistor T1 or transfer a signal applied from the initialization voltage line VIL of FIG. 3 to the other electrode of the storage capacitor.

A first passivation layer PV1 is disposed on the third conductive layer. The first passivation layer PV1 may function as an insulating film between the third conductive layer and other layers and protect the third conductive layer.

Each of the buffer layer BL, the first gate insulating layer GI, the first interlayer insulating layer ILL and the first passivation layer PV1 described above may be formed as inorganic layers that are alternately stacked. For example, each of the buffer layer BL, the first gate insulating layer GI, the first interlayer insulating layer ILL and the first passivation layer PV1 may be formed as a double layer in which inorganic layers including at least one of silicon oxide ($SiO_x$), silicon nitride ($SiN_x$), and silicon oxynitride (Si- $O_xN_y$) are stacked or as multiple layers in which these layers are alternately stacked. However, the disclosure is not limited thereto, each of the buffer layer BL, the first gate insulating layer GI, the first interlayer insulating layer ILL and the first passivation layer PV1 may also be formed as an inorganic layer including the above-described insulating material. In some embodiments, the first interlayer insulating layer IL1 may also be made of an organic insulating material such as polyimide (PI).

Each of the second conductive layer and the third conductive layer may be formed as a single layer or multiple layers made of at least one of molybdenum (Mo), aluminum (Al), chromium (Cr), gold (Au), titanium (T1), nickel (Ni), neodymium (Nd), and copper (Cu), or alloys thereof. However, the disclosure is not limited thereto.

A via layer VIA is disposed on the third conductive layer in the display area DPA. The via layer VIA may include an organic insulating material, for example, polyimide (PI) to compensate for a step due to lower conductive layers and make an upper surface flat. However, in some embodiments, the via layer VIA may be omitted.

The bank patterns BP1 and BP2, electrodes RME (e.g., RME1 and RME2), the bank layer BNL, the light emitting elements ED, and connections electrodes CNE (e.g., CNE1 and CNE2) are disposed on the via layer VIA, as a display element layer. Insulating layers PAS1, PAS2, and PAS3 may be disposed on the via layer VIA.

Bank patterns BP1 and BP2 may be disposed in the emission area EMA of each sub-pixel SPXn. The bank patterns BP1 and BP2 may have a predetermined width in the second direction DR2 and may extend in the first direction DR1.

For example, the bank patterns BP1 and BP2 may include a first bank pattern BP1 and a second bank pattern BP2 spaced apart from each other in the second direction DR2 in the emission area EMA of each sub-pixel SPXn. The first bank pattern BP1 may be disposed on the left side, which is one side of the center of the emission area EMA in the second direction DR2, and the second bank patterns BP2 may be spaced apart from the first bank pattern BP1 and be disposed on the right side, which is the other side (or another side) of the center of the emission area EMA in the second direction DR2. The first bank patterns BP1 and the second bank patterns BP2 may be alternately disposed in the second direction DR2 and be disposed in island-shaped patterns in the display area DPA. The light emitting elements ED may be disposed between the first bank pattern BP1 and the second bank pattern BP2.

Lengths of the first bank pattern BP1 and the second bank pattern BP2 in the first direction DR1 may be the same as each other, but be smaller than a length, in the first direction DR1, of the emission area EMA surrounded by the bank layer BNL. The first bank pattern BP1 and the second bank pattern BP2 may be spaced apart from a portion of the bank layer BNL extending in the second direction DR2. However, the disclosure is not limited thereto, and the bank patterns BP1 and BP2 may also be integrated with the bank layer BNL or partially overlap a portion of the bank layer BNL extending in the second direction DR2. In this case, lengths of the bank patterns BP1 and BP2 in the first direction DR1 may be the same as or greater than the length, in the first direction DR1, of the emission area EMA surrounding the bank layer BNL.

The first bank pattern BP1 and the second bank pattern BP2 may have a same width in the second direction DR2. However, the disclosure is not limited thereto, and the first bank pattern BP1 and the second bank pattern BP2 may also have different widths. For example, a bank pattern may have a greater width than another bank pattern, and the bank pattern having the greater width may be disposed over the emission areas EMA of other sub-pixels SPXn adjacent to each other in the second direction DR2. In this case, the bank pattern disposed over emission areas EMA and a portion of the bank layer BNL extending in the first direction DR1 may overlap the second bank pattern BP2 in the thickness direction. It has been illustrated in the drawings that two bank patterns BP1 and BP2 having the same width are disposed for each sub-pixel SPXn, but the disclosure is not limited thereto. The number and a shape of bank patterns BP1 and BP2 may be modified according to the number or a layout structure of electrodes RME.

The bank patterns BP1 and BP2 may be disposed on the via layer VIA. For example, the bank patterns BP1 and BP2 may be directly disposed on the via layer VIA, and may have at least portions protruding from an upper surface of the via layer VIA. The protruding portions of the bank patterns BP1 and BP2 may have inclined or curved side surfaces, and light emitted from the light emitting element ED may be reflected by the electrodes RME disposed on the bank patterns BP1 and BP2 and emitted in an upward direction of the via layer VIA. Unlike illustrated in the drawings, the bank patterns BP1 and BP2 may have a semi-circular or semi-elliptical shape with a curved outer surface in a cross-sectional view. The bank patterns BP1 and BP2 may include an organic insulating material such as polyimide (PI), but the disclosure is not limited thereto.

The electrodes RME (e.g., RME1 and RME2) have extend in a direction and are disposed for each sub-pixel SPXn. The electrodes RME1 and RME2 may extend in the first direction DR1 to be disposed in the emission area EMA and the sub-area SA of the sub-pixel SPXn, and may be disposed to be spaced apart from each other in the second direction DR2. The electrodes RME may be electrically connected to a light emitting element ED to be described below, but the disclosure is not limited thereto, and may not be electrically connected to the light emitting element ED.

The display device 10 may include the first electrode RME1 and the second electrode RME2 disposed in each sub-pixel SPXn. The first electrode RME1 is disposed on the left side of the center of the emission area EMA, and the second electrode RME2 is spaced apart from the first electrode RME1 in the second direction DR2 and disposed on the right side of the center of the emission area EMA. The first electrode RME1 may be disposed on the first bank pattern BP1, and the second electrode RME2 may be disposed on the second bank pattern BP2. The first electrode RME1 and the second electrode RME2 may be partially disposed in the corresponding sub-pixel SPXn and the sub-area SA beyond the bank layer BNL. The first electrodes RME1 and the second electrodes RME2 of different sub-pixels SPXn may be spaced apart from each other with respect to the separation part ROP positioned in the sub-area SA of a sub-pixel SPXn.

It has been illustrated in the drawings that the two electrodes RME extend in the first direction DR1 for each sub-pixel SPXn, but the disclosure is not limited thereto. For example, in the display device 10, a larger number of electrodes RME may be disposed in a sub-pixel SPXn, or the electrodes RME may be partially bent and have different widths according to positions thereof.

The first electrode RME1 and the second electrode RME2 may be disposed on at least the inclined side surfaces of the bank patterns BP1 and BP2, respectively. In an embodiment, a width of the electrodes RME measured in the second direction DR2 may be smaller than a width of the bank patterns BP1 and BP2 measured in the second direction DR2, and an interval between the first electrode RME1 and the second electrode RME2 spaced apart from each other in the second direction DR2 may be smaller than an interval between the bank patterns BP1 and BP2. At least portions of the first electrode RME1 and the second electrode RME2 may be directly disposed on the via layer VIA, such that the first electrode RME1 and the second electrode RME2 may be disposed on a same plane.

The light emitting element ED disposed between the bank patterns BP1 and BP2 may emit light toward both ends thereof, and the emitted light may be directed to the electrodes RME disposed on the bank patterns BP1 and BP2. The respective electrodes RME may have a structure in which portions thereof disposed on the bank patterns BP1 and BP2 may reflect the light emitted from the light emitting element ED. The first electrode RME1 and the second electrode RME2 may be disposed to cover (or overlap) at least one side surface of the bank patterns BP1 and BP2 to reflect the light emitted from the light emitting element ED.

The respective electrodes RME may be in direct contact with (or directly contact) the third conductive layer through the electrode contact holes CTD and CTS at portions thereof overlapping the bank layer BNL between the emission area EMA and the sub-area SA. A first electrode contact hole CTD may be formed in an area in which the bank layer BNL and the first electrode RME1 overlap each other, and a second electrode contact hole CTS may be formed in an area in which the bank layer BNL and the second electrode RME2 overlap each other. The first electrode RME1 may contact the first conductive pattern CDP1 through the first electrode contact hole CTD penetrating through the via layer VIA and the first passivation layer PV1. The second electrode RME2 may contact the second voltage line VL2 through the second electrode contact hole CTS penetrating through the via layer VIA and the first passivation layer PV1. The first electrode RME1 may be electrically connected to the first transistor T1 through the first conductive pattern CDP1 to receive the first source voltage applied thereto, and the second electrode RME2 may be electrically connected to the second voltage line VL2 to receive the second source voltage applied thereto. However, the disclosure is not limited thereto. In an embodiment, the respective electrodes RME1 and RME2 may not be electrically connected to the voltage lines VL1 and VL2 of the third conductive layer, and connection electrodes CNE to be described below may be directly connected to the third conductive layer.

The electrodes RME may include a conductive material having high reflectivity. For example, the electrodes RME may include a metal such as silver (Ag), copper (Cu), or aluminum (Al), include an alloy including aluminum (Al), nickel (Ni), lanthanum (La), or the like, or have a structure in which a metal layer made of titanium (T1), molybdenum (Mo), and niobium (Nb) and the alloy are stacked. In some embodiments, the electrodes RME may be formed as a double layer or multiple layers in which an alloy including aluminum (Al) and one or more metal layers made of titanium (T1), molybdenum (Mo), and/or niobium (Nb) are stacked.

However, the disclosure is not limited thereto, and each of the electrodes RME may further include a transparent conductive material. For example, each electrode RME may include a material such as ITO, IZO, or ITZO. In some embodiments, each electrode RME may have a structure in which one or more metal layers made of the transparent conductive material and one or more metal layers made of a metal having high reflectivity are stacked or may be formed as a layer including the transparent conductive material and the metal having the high reflectivity. For example, each electrode RME may have a stacked structure such as ITO/Ag/ITO, ITO/Ag/IZO, or ITO/Ag/ITZO/IZO. The electrodes RME may be electrically connected to the light emitting elements ED, and may reflect some of the light emitted from the light emitting elements ED in an upward direction of the first substrate SUB.

A first insulating layer PAS1 may be disposed in the entirety of the display area DPA and may be disposed on the via layer VIA and the electrodes RME. The first insulating layer PAS1 may protect the electrodes RME and insulate different electrodes RME from each other. In particular, the first insulating layer PAS1 is disposed to cover (or overlap) the electrodes RME before the bank layer BNL is formed, and may thus prevent the electrodes RME from being damaged in a process of forming the bank layer BNL. The first insulating layer PAS1 may prevent the light emitting element ED disposed on the first insulating layer PAS1 from being damaged by directly contacting other members. Hence, the light emitting element ED is disposed on the first electrode RME1 and the second electrode RME2 in the display area DPA.

In an embodiment, the first insulating layer PAS1 may have a step (or height or thickness difference) formed so that a portion of an upper surface thereof is recessed between the electrodes RME spaced apart from each other in the second direction DR2. The light emitting element ED may be disposed on the upper surface of the first insulating layer PAS1 on which the step is formed, and a space may be formed between the light emitting element ED and the first insulating layer PAS1.

The bank layer BNL may be disposed on the first insulating layer PAS1. The bank layer BNL may include portions extending in the first direction DR1 and the second direction DR2, and surround each of the sub-pixels SPXn. The bank layer BNL may divide the emission area EMA and the sub-area SA of each sub-pixel SPXn while surrounding the emission area EMA and the sub-area SA of each sub-pixel SPXn, and may divide the display area DPA and the non-display area NDA while surrounding the outermost portion of the display area DPA. The bank layer BNL may be entirely disposed in the display area DPA to form a lattice-shape pattern, and an area opened by the bank layer BNL in the display area DPA may be the emission area EMA and the sub-area SA.

The bank layer BNL may have a predetermined height, similar to the bank patterns BP1 and BP2. In some embodiments, a height of an upper surface of the bank layer BNL may be greater than that of the bank patterns BP1 and BP2, and a thickness thereof may be the same as or greater than that of the bank patterns BP1 and BP2. The bank layer BNL may prevent ink from overflowing into adjacent sub-pixels SPXn in an inkjet printing process of processes of manufacturing the display device 10. Similar to the bank patterns BP1 and BP2, the bank layer BNL may include an organic insulating material such as polyimide.

The light emitting elements ED may be disposed in the emission area EMA. The light emitting elements ED may be disposed between the bank patterns BP1 and BP2 and be arranged to be spaced apart from each other in the first direction DR1. In an embodiment, each of the light emitting elements ED may extend in a direction and may have both ends respectively disposed on different electrodes RME. The light emitting elements ED may have a length greater than the interval between the electrodes RME spaced apart from each other in the second direction DR2. The light emitting elements ED may be arranged so that an extension direction thereof is substantially perpendicular to the first direction DR1 in which the electrodes RME extend. However, the disclosure is not limited thereto, and the light emitting elements ED may be disposed so that the extension direction thereof is the second direction DR2 or a direction obliquely inclined with respect to the second direction DR2.

The light emitting elements ED may be disposed on the first insulating layer PAS1. The light emitting element ED may extend in a direction and may be disposed such that the extension direction is parallel to an upper surface of the first substrate SUB. As described below, the light emitting element ED may include semiconductor layers disposed in a direction in which it extends, and the semiconductor layers may be sequentially disposed in a direction parallel to the upper surface of the first substrate SUB. However, the disclosure is not limited thereto, and in case that the light emitting element ED has another structure, the semiconductor layers may also be disposed in a direction perpendicular to the first substrate SUB.

The light emitting elements ED disposed in each sub-pixel SPXn may emit light of different wavelength bands according to materials of the above-described semiconductor layers. However, the disclosure is not limited thereto, and the light emitting elements ED disposed in each sub-pixel SPXn may include semiconductor layers made of a same material to emit light of a same color.

The light emitting elements ED may contact the connection electrodes CNE (e.g., CNE1 and CNE2) to be electrically connected to the electrodes RME and to the conductive layers under the via layer VIA, and may receive electrical signals applied thereto to emit light of a specific wavelength band.

A second insulating layer PAS2 may be disposed on the light emitting elements ED, the first insulating layer PAS1, and the bank layer BNL. The second insulating layer PAS2 includes a pattern part extending in the first direction DR1 between the bank patterns BP1 and BP2 and disposed on the light emitting elements ED. The pattern part may be disposed to partially surround outer surfaces of the light emitting elements ED, and may not cover (or overlap) both sides or both ends of each of the light emitting elements ED. The pattern part may form a linear or island-shaped pattern in each sub-pixel SPXn in a plan view. The pattern part of the second insulating layer PAS2 may protect the light emitting elements ED and fix the light emitting elements ED in the processes of manufacturing the display device 10. The second insulating layer PAS2 may be disposed to fill a space between the light emitting elements ED and the second insulating layer PAS2 under the light emitting elements ED. A portion of the second insulating layer PAS2 may be disposed on the bank layer BNL and in the sub-areas SA.

The connection electrodes CNE (e.g., CNE1 and CNE2) may be disposed on the electrodes RME and the bank patterns BP1 and BP2. The connection electrodes CNE may each extend in a direction and may be disposed to be spaced apart from each other. Each of the connection electrodes CNE may contact the light emitting element ED and be electrically connected to the third conductive layer.

The connection electrodes CNE may include a first connection electrode CNE1 and a second connection electrode CNE2 disposed in each sub-pixel SPXn. The first connection electrode CNE1 may extend in the first direction DR1 and may be disposed on the first electrode RME1 or the first bank pattern BP1. The first connection electrode CNE1 may partially overlap the first electrode RME1 and may be disposed from the emission area EMA to the sub-area SA beyond the bank layer BNL. The second connection electrode CNE2 may extend in the first direction DR1 and may be disposed on the second electrode RME2 or the second bank pattern BP2. The second connection electrode CNE2 may partially overlap the second electrode RME2 and may be disposed from the emission area EMA to the sub-area SA beyond the bank layer BNL. Each of the first connection electrode CNE1 and the second connection electrode CNE2 may contact the light emitting elements ED and may be electrically connected to the electrodes RME or the conductive layer under the electrodes RME.

For example, the first connection electrode CNE1 and the second connection electrode CNE2 may be disposed on side surfaces of the second insulating layer PAS2, respectively, and may contact the light emitting elements ED. The first connection electrode CNE1 may partially overlap the first electrode RME1 and may contact one ends (or first ends) of the light emitting elements ED. The second connection electrode CNE2 may partially overlap the second electrode RME2 and may contact the other ends (or second ends) of the light emitting elements ED. The connection electrodes CNE are disposed over the emission area EMA and the sub-area SA. The connection electrodes CNE may contact the light emitting elements ED at portions thereof disposed in the emission area EMA, and be electrically connected to the third conductive layer at portions thereof disposed in the sub-area SA.

According to an embodiment, in the display device 10, each of the connection electrodes CNE may contact the electrodes RME through the contact parts CT1 and CT2 disposed in the sub-area SA. The first connection electrode CNE1 may contact the first electrode RME1 through a first contact part CT1 penetrating through the first insulating layer PAS1, the second insulating layer PAS2, and a third insulating layer PAS3 in the sub-area SA. The second connection electrode CNE2 may contact the second electrode RME2 through a second contact part CT2 penetrating through the first insulating layer PAS1 and the second insulating layer PAS2 in the sub-area SA. Each of the connection electrodes CNE may be electrically connected to the third conductive layer through each of the electrodes RME. The first connection electrode CNE1 may be electrically connected to the first transistor T1 to receive the first source voltage applied thereto, and the second connection electrode CNE2 may be electrically connected to the second voltage line VL2 to receive the second source voltage applied thereto. The respective connection electrodes CNE may contact the light emitting elements ED in the emission area EMA to transfer the source voltages to the light emitting elements ED.

However, the disclosure is not limited thereto. In some embodiments, the connection electrodes CNE may directly contact the third conductive layer, or may be electrically connected to the third conductive layer through other patterns rather than the electrodes RME.

The connection electrodes CNE may include a conductive material. For example, the connection electrodes CNE may include ITO, IZO, ITZO, aluminum (Al), or the like. As an example, the connection electrodes CNE may include a transparent conductive material, and the light emitted from the light emitting elements ED may be transmitted through the connection electrodes CNE and then emitted.

The third insulating layer PAS3 is disposed on the second connection electrode CNE2 and the second insulating layer PAS2. The third insulating layer PAS3 may be entirely disposed on the second insulating layer PAS2 so as to cover (or overlap) the second connection electrode CNE2, and the first connection electrode CNE1 may be disposed on the third insulating layer PAS3. The third insulating layer PAS3 may be entirely disposed on the via layer VIA except for an area in which the first connection electrode CNE1 is disposed. The third insulating layer PAS3 may insulate the first connection electrode CNE1 and the second connection electrode CNE2 from each other so that the first connection electrode CNE1 does not directly contact the second connection electrode CNE2.

Although not illustrated in the drawings, another insulating layer may be further disposed on the third insulating layer PAS3 and the first connection electrode CNE1. Such an insulating layer may serve to protect members disposed on the first substrate SUB from an external environment.

Each of the first insulating layer PAS1, the second insulating layer PAS2, and the third insulating layer PAS3 described above may include an inorganic insulating material or an organic insulating material. As an example, each of the first insulating layer PAS1, the second insulating layer PAS2, and the third insulating layer PAS3 may include an inorganic insulating material, or the first insulating layer PAS1 and the third insulating layer PAS3 may include an inorganic insulating material, but the second insulating layer PAS2 may include an organic insulating material. Each or at least one of the first insulating layer PAS1, the second insulating layer PAS2, and the third insulating layer PAS3 may be formed in a structure in which insulating layers are alternately or repeatedly stacked. In an embodiment, each of the first insulating layer PAS1, the second insulating layer PAS2, and the third insulating layer PAS3 may be made of (or include) at least one of silicon oxide ($SiO_x$), silicon nitride ($SiN_x$), and silicon oxynitride ($SiO_xN_y$). The first insulating layer PAS1, the second insulating layer PAS2, and the third insulating layer PAS3 may be made of a same material, some of the first insulating layer PAS1, the second insulating layer PAS2, and the third insulating layer PAS3 may be made of a same material and some thereof may be made of different materials, or the first insulating layer PAS1, the second insulating layer PAS2, and the third insulating layer PAS3 may be made of different materials.

Figure 7:
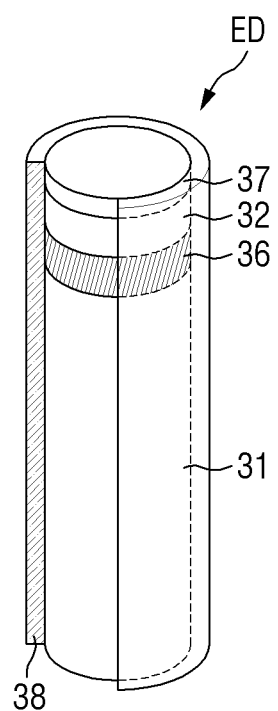
FIG. 7 is a schematic view of a light emitting element according to an embodiment.

FIG. 7 is a schematic view of a light emitting element according to an embodiment.

Referring to FIG. 7, the light emitting element ED may be a light emitting diode. Specifically, the light emitting element ED may be an inorganic light emitting diode having a size of a nanometer to a micrometer scale and may be made of an inorganic material. The light emitting element ED may be aligned between two electrodes in which polarities are formed in case that an electric field is formed in a specific direction between the two electrodes facing each other.

The light emitting element ED according to an embodiment may extend in a direction. The light emitting element ED may have a shape such as a cylindrical shape, a rod shape, a wire shape, or a tube shape. However, the light emitting element ED is not limited to having the shape described above, and may have various shapes. For example, the light emitting element ED may have a polygonal prismatic shape such as a cubic shape, a rectangular parallelepiped shape, or a hexagonal prismatic shape, or have a shape in which it extends in a direction and has a partially inclined outer surface.

The light emitting element ED may include a semiconductor layer doped with a conductivity-type (e.g., p-type or n-type) dopant. The semiconductor layer may receive an electrical signal applied from an external power source to emit light of a specific wavelength band. The light emitting element ED may include a first semiconductor layer 31, a second semiconductor layer 32, a light emitting layer 36, an electrode layer 37, and an insulating film 38.

The first semiconductor layer 31 may be an n-type semiconductor. The first semiconductor layer 31 may include a semiconductor material having a chemical formula of $Al_xGa_yIn_{1-x-y}N$ ($0 \leq x \leq 1$, $0 \leq y \leq 1$, and $0 \leq x+y \leq 1$). For example, the semiconductor material of the first semiconductor layer 31 may be one or more of AlGaInN, GaN, AlGaN, InGaN, AlN, and InN doped with an n-type dopant. The n-type dopant doped in the first semiconductor layer 31 may be Si, Ge, Sn, or the like.

The second semiconductor layer 32 is disposed on the first semiconductor layer 31 with the light emitting layer 36 interposed therebetween. The second semiconductor layer 32 may be a p-type semiconductor and may include a semiconductor material having a chemical formula of $Al_xGa_yIn_{1-x-y}N$ ($0 \leq x \leq 1$, $0 \leq y \leq 1$, and $0 \leq x+y \leq 1$). For example, the semiconductor material of the second semiconductor layer 32 may be one or more of AlGaInN, GaN, AlGaN, InGaN, AlN, and InN doped with a p-type dopant. The p-type dopant doped in the second semiconductor layer 32 may be Mg, Zn, Ca, Ba, or the like.

FIG. 7 illustrates that each of the first semiconductor layer 31 and the second semiconductor layer 32 is configured as one layer, but the disclosure is not limited thereto. Each of the first semiconductor layer 31 and the second semiconductor layer 32 may further include a larger number of layers, for example, a clad layer or a tensile strain barrier reducing (TSBR) layer, according to a material of the light emitting layer 36.

The light emitting layer 36 may be disposed between the first semiconductor layer 31 and the second semiconductor layer 32. The light emitting layer 36 may include a material having a single or multiple quantum well structure. In case that the light emitting layer 36 includes the material having the multiple quantum well structure, the light emitting layer 36 may have a structure in which quantum layers and well layers are alternately stacked. The light emitting layer 36 may emit light by combination of electron-hole pairs due to an electrical signal applied through the first semiconductor layer 31 and the second semiconductor layer 32. The light emitting layer 36 may include a material such as AlGaN or AlGaInN. In particular, in case that the light emitting layer 36 has the multiple quantum well structure, for example, the structure in which the quantum layers and the well layers are alternately stacked, the quantum layers may include a material such as AlGaN or AlGaInN, and the well layers may include a material such as GaN or AlInN.

The light emitting layer 36 may have a structure in which semiconductor materials having large band gap energy and semiconductor materials having small band gap energy are alternately stacked, and may include any other Group III to Group V semiconductor materials according to a wavelength band of emitted light. The light emitted by the light emitting layer 36 is not limited to light of a blue wavelength band, and in some embodiments, the light emitting layer 36 may emit light of a red or green wavelength band.

The electrode layer 37 may be an ohmic connection electrode. However, the disclosure is not limited thereto, and the electrode layer 37 may also be a Schottky connection electrode. The light emitting element ED may include at least one electrode layer 37. The light emitting element ED may include one or more electrode layers 37, but the disclosure is not limited thereto, and the electrode layers 37 may also be omitted.

The electrode layer 37 may decrease resistance between the light emitting element ED and the electrode or the connection electrode in case that the light emitting element ED is electrically connected to the electrode or the connection electrode in the display device 10. The electrode layer 37 may include a metal having conductivity. The electrode layer 37 may include at least one of aluminum (Al), titanium (T1), indium (In), gold (Au), silver (Ag), ITO, IZO, and ITZO.

The insulating film 38 is disposed to surround outer surfaces of the semiconductor layers and the electrode layer described above. For example, the insulating film 38 may be disposed to surround at least an outer surface of the light emitting layer 36, but may be formed to expose both ends of the light emitting element ED in a length direction. The insulating film 38 may also be formed so that an upper surface thereof is rounded in cross section in an area adjacent to at least one end of the light emitting element ED.

The insulating film 38 may include materials having insulating properties, such as silicon oxide ($SiO_x$), silicon nitride ($SiN_x$), silicon oxynitride ($SiO_xN_y$), aluminum nitride ($AlN_x$), and aluminum oxide ($AlO_x$). FIG. 7 illustrates that the insulating film 38 is formed as a single layer, but the disclosure is not limited thereto, and in some embodiments, the insulating film 38 may also be formed in a multilayer structure in which layers are stacked.

The insulating film 38 may serve to protect the semiconductor layers and the electrode layer of the light emitting element ED. The insulating film 38 may prevent an electrical short circuit that may occur in the light emitting layer 36 in case that the light emitting layer 36 directly contacts an electrode through which an electrical signal is transferred to the light emitting element ED. The insulating film 38 may prevent a decrease in luminous efficiency of the light emitting element ED.

An outer surface of the insulating film 38 may be surface-treated. The light emitting elements ED may be jetted or sprayed onto electrodes in a state in which they are dispersed in ink and be aligned. Here, in order to maintain the light emitting elements ED in a state in which the light emitting elements ED are dispersed without being agglomerated with other adjacent light emitting elements ED in the ink, a hydrophobic or hydrophilic treatment may be performed on a surface of the insulating film 38.

Figure 8:
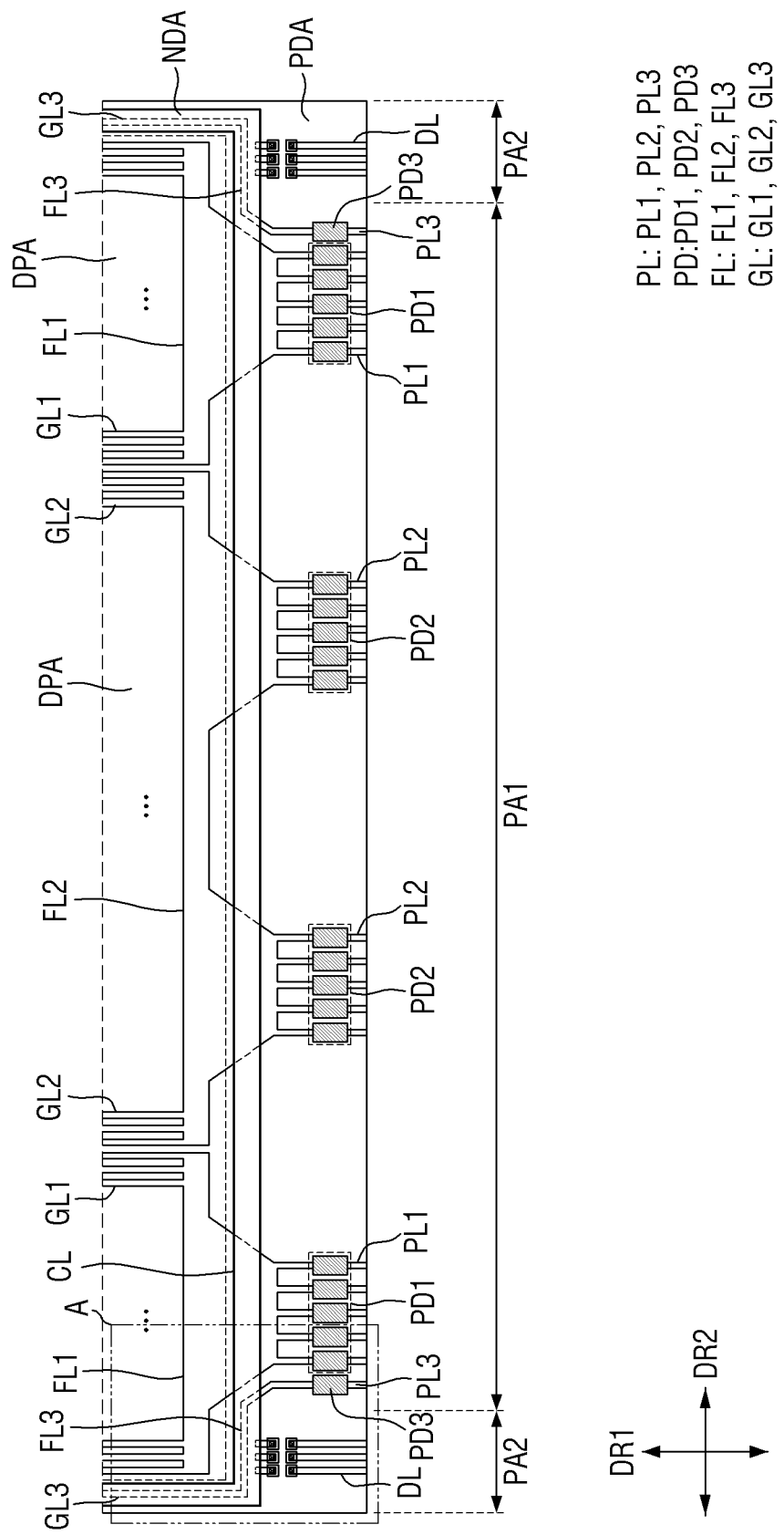
FIG. 8 is a schematic plan view illustrating lines and pads disposed in a non-display area of the display device according to an embodiment.
Figure 9:
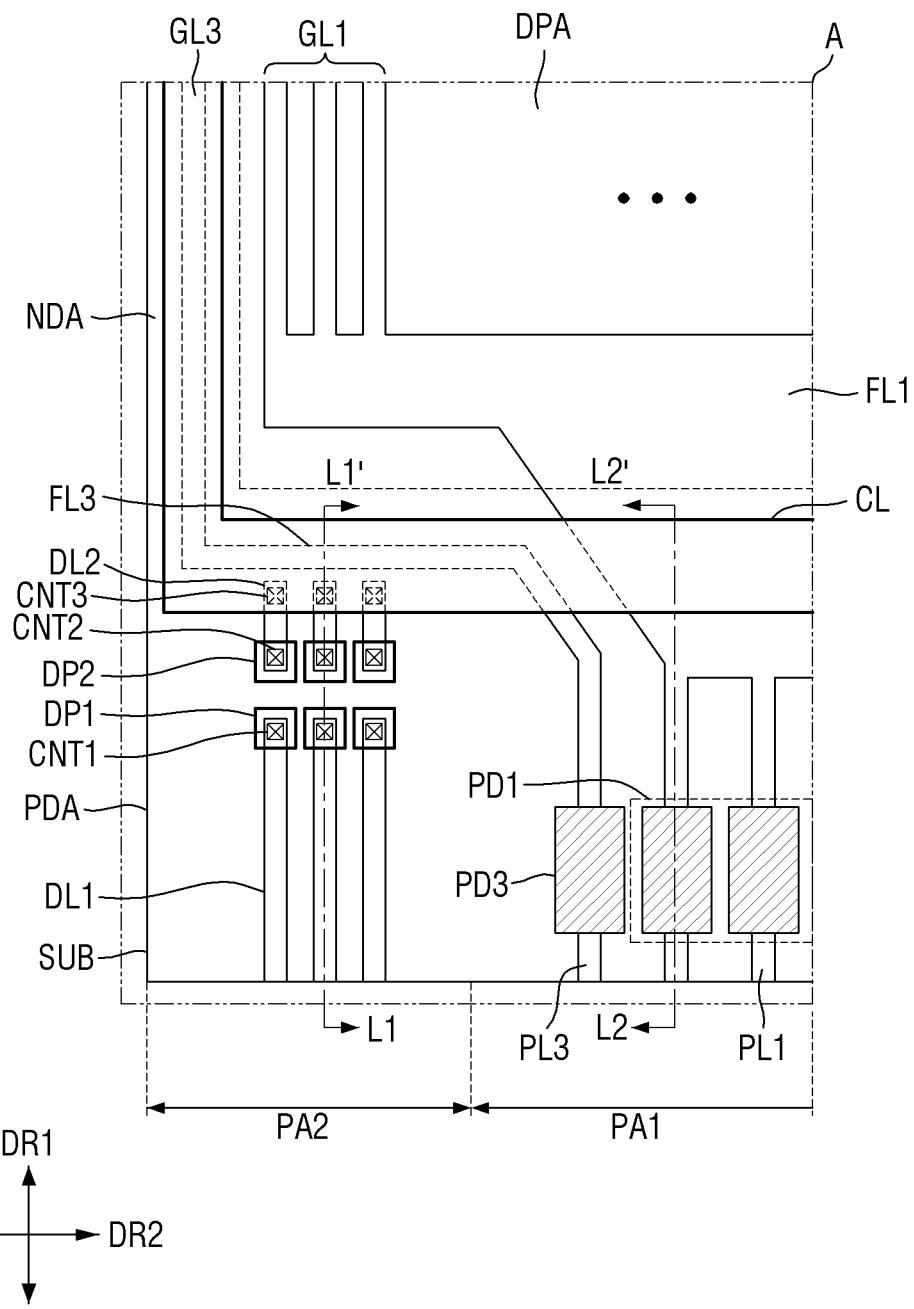
FIG. 9 is a schematic enlarged view of portion A of FIG. 8.

FIG. 8 is a schematic plan view illustrating lines and pads disposed in the non-display area of the display device according to an embodiment. FIG. 9 is a schematic enlarged view of portion A of FIG. 8. FIG. 8 illustrates a portion of the non-display area NDA disposed on the lower side of the display area DPA among the non-display areas NDA of the display device 10.

Referring to FIGS. 8 and 9, the display device 10 according to an embodiment may include pads PD (e.g., PD1, PD2, and PD3) and outer lines PL, DL, and FL disposed in the pad area PDA. Some of the pads PD and the outer lines PL, DL, and FL may be electrically connected to some of inner lines GL (GL1, GL2, and GL3) disposed in the display area DPA. The display device 10 may include outer lines PL, DL, and FL disposed on the lower side of the display area DPA in the first direction DR1 among the non-display areas NDA and inner lines GL1, GL2, and GL3 disposed inside the outer lines PL, DL, and FL in the first direction DR1. Some of the outer lines PL, DL, and FL may be disposed in the non-display area NDA and the others of the outer lines PL, DL, and FL may be disposed over the display area DPA and the non-display area NDA. Some of the inner lines GL1, GL2, and GL3 may be disposed in the display area DPA, and the others of the inner lines GL1, GL2, and GL3 may be disposed on both sides of the display area DPA in the second direction DR2 among the non-display areas NDA. The inner lines GL1, GL2, and GL3 may be electrically connected to the pads PD through some of the outer lines PL, FL, and DL.

Lines disposed on the left side and the right side of the display device 10, which are both sides of the display device 10 in the second direction DR2, may be disposed to be symmetrical to each other with respect to a line crossing the center of the display device 10 in the first direction DR1. The lines disposed on the left side and the right side of the center of the display device 10 may be disposed in a same order from the center of the display device 10 to both sides of the display device 10 in the second direction DR2. For example, a line adjacent to the center of the display device 10 on the left side of the display device 10 and a line adjacent to the center of the display device 10 on the right side of the display device 10 may be the same as each other, and lines disposed on the left side of the display device 10 may be the same as lines disposed on the right side of the display device 10. However, the disclosure is not limited thereto.

The display device 10 may include first inner lines GL1 and second inner lines GL2, and a third inner line GL3 as the inner lines GL1, GL2, and GL3. The respective inner lines GL1, GL2, and GL3 may extend in the first direction DR1 and may be spaced apart from each other in the second direction DR2. The first inner lines GL1 and second inner lines GL2 may be disposed in the display area DPA, and the third inner line GL3 may be disposed in the non-display area NDA positioned outside the display area DPA in the second direction DR2. The first inner lines GL1 may be disposed outside a line crossing the center of the display area DPA in the first direction DR1, and the second inner lines GL2 may be disposed inside the first inner lines GL1. The second inner lines GL2 of the inner lines GL1, GL2, and GL3 may be inner lines of the display area DPA, the first inner lines GL1 of the inner lines GL1, GL2, and GL3 may be outer lines of the display area DPA, and the third inner line GL3 of the inner lines GL1, GL2, and GL3 may be the outermost inner line disposed in the non-display area NDA.

The inner lines GL1, GL2, and GL3 may be any of the lines described above with reference to FIG. 2. Although not illustrated in the drawings, the inner lines GL1, GL2, and GL3 extending in the first direction DR1 may be formed of any of the first to third conductive layers, and some of the inner lines GL1, GL2, and GL3 may be any of the scan lines SL1 and SL2, the data lines DTL1, DTL2, and DTL3, or the voltage lines VL1 and VL2. As described below, the inner lines GL1, GL2, and GL3 may be electrically connected to fan-out lines FL1, FL2, and FL3 to be described below, respectively, and the inner lines GL1, GL2, and GL3 and the fan-out lines FL1, FL2, and FL3 may be disposed on a same layer or different layers. In case that the inner lines GL1, GL2, and GL3 and the fan-out lines FL1, FL2, and FL3 are disposed on a same layer, the inner lines GL1, GL2, and GL3 and the fan-out lines FL1, FL2, and FL3 may be integrated with each other, and in case that the inner lines GL1, GL2, and GL3 and the fan-out lines FL1, FL2, and FL3 are disposed on different layers, the inner lines GL1, GL2, and GL3 and the fan-out lines FL1, FL2, and FL3 may be electrically connected to each other through contact holes. FIG. 8 illustrates that the inner lines GL1, GL2, and GL3 are integrated with the fan-out lines FL1, FL2, and FL3 in order to schematically express a relationship between the inner lines GL1, GL2, and GL3 and the fan-out lines FL1, FL2, and FL3, but the disclosure is not limited thereto.

The display device 10 may include pad lines PL, fan-out lines FL, and dummy lines DL as the outer lines PL, FL, and DL. The pad lines PL and the dummy lines DL may be disposed in the pad area PDA of the non-display area NDA, and some of the fan-out lines FL may be disposed in the display area DPA.

The pad lines PL may include first pad lines PL1, second pad lines PL2 disposed inside the first pad lines PL1, and third pad lines PL3 disposed outside the first pad lines PL1. The respective pad lines PL1, PL2, and PL3 may extend in the first direction DR1, and have one sides (or first sides) extending to a lower side of the first substrate SUB and the other sides (or second sides) each electrically connected to different fan-out lines FL. The pad lines PL1, PL2, and PL3 may be spaced apart from each other in the second direction DR2, and intervals between the pad lines PL1, PL2, and PL3 may be the same as or different from each other. For example, intervals between the first pad lines PL1 and intervals between the second pad lines PL2 may be the same as each other, respectively, but an interval between the first pad lines PL1 and the second pad lines PL2 may be greater than the intervals between the first pad lines PL1. On the other hand, an interval between the third pad line PL3 and the first pad line PL1 most adjacent to the third pad line PL3 may be the same as the intervals between the first pad lines PL1. The first pad lines PL1 and second pad lines PL2 may be disposed adjacent to each other, respectively, to form pad line groups, and the third pad line PL3 may be spaced apart from the first pad line PL1 in the second direction DR2 and be disposed at an outermost portion. The first pad lines PL1 may be outer pad lines disposed outside the center of the pad area PDA, the second pad lines PL2 may be inner pad lines disposed between the first pad lines PL1, and the third pad lines PL3 may be the outermost pad lines.

As described above, the lines disposed on the left side and the right side of the display device 10 may be disposed to be symmetrical to each other with respect to the center of the display device 10, and the first pad lines PL1, the second pad lines PL2, and the third pad lines PL3 disposed on the left side of the display device 10 may be disposed to be symmetrical to the first pad lines PL1, the second pad lines PL2, and the third pad lines PL3 disposed on the right side of the display device 10. The second pad lines PL2, the first pad lines PL1, and the third pad line PL3 may be disposed from the center of the display device 10 toward both sides of the display device 10 in the second direction DR2.

The pad lines PL1, PL2, and PL3 may be electrically connected to the pads PD1, PD2, and PD3 disposed thereon, respectively. The first pad lines PL1 may be electrically connected to first pads PD1 disposed thereon, respectively, the second pad lines PL2 may be electrically connected to second pads PD2 disposed thereon, respectively, and the third pad lines PL3 may be electrically connected to third pads PD3 disposed thereon, respectively. Each of the pads PD1, PD2, and PD3 may be any of the wiring pads WPD described above with reference to FIG. 2, and the pads PD1, PD2, and PD3 may be electrically connected to an external device. In the display device 10, a conductive film may be attached onto the pad area PDA, and an external device disposed on the conductive film may be electrically connected to the pads PD1, PD2, and PD3.

For example, in the display device 10, conductive films may be attached onto the pad area PDA, and each of the conductive films may be disposed on first pads PD1, second pads PD2, and third pads PD3. In an embodiment in which the lines and pads disposed in the pad area PDA of the display device 10 are disposed to be symmetrical to each other with respect to the center of the display device 10, two different conductive films may be disposed in the pad area PDA of the display device 10. Any of the conductive films may be disposed on the pads PD disposed on one side of the center of the display device 10 in the second direction DR2.

One side (or first side) of the first pad line PL1 may be electrically connected to a fan-out line FL1 (see FIG. 8) disposed at outer sides of the pad area PDA and the display area DPA, one side (or first side) of the second pad line PL2 may be electrically connected to a fan-out line FL2 (see FIG. 8) disposed at inner sides of the pad area PDA and the display area DPA, and one side (or first side) of the third pad line PL3 may be electrically connected to a fan-out line FL3 (see FIG. 8) disposed in the outermost portions of the non-display area NDA and the pad area PDA. The other sides (or second sides) of each of the pad lines PL1, PL2, and PL3 may extend to an edge of a lower side of the first substrate SUB. The pad lines PL1, PL2, and PL3 may be disposed to extend from a mother substrate to the first substrate SUB during the processes of manufacturing the display device 10, and may be electrically disconnected in a process of separating the first substrate SUB from the mother substrate. Accordingly, the other sides (or second sides) of the pad lines PL1, PL2, and PL3 may extend to the edge of the lower side of the first substrate SUB.

Fan-out lines FL1, FL2, and FL3 may include first fan-out lines FL1, a second fan-out line FL2 disposed inside the first fan-out lines FL1, and third fan-out lines FL3 disposed outside the first fan-out lines FL1. The first fan-out line FL1 may be electrically connected to the first pad lines PL1, the second fan-out line FL2 may be electrically connected to the second pad lines PL2, and the third fan-out line FL3 may be electrically connected to the third pad line PL3. Each of the fan-out lines FL1, FL2, and FL3 may be disposed to be spaced apart from the pads PD by a predetermined interval in the pad area PDA, and may extend in the first direction DR1 to be partially disposed in the display area DPA or the non-display area NDA positioned outside the display area DPA in the second direction DR2.

The fan-out lines FL1, FL2, and FL3 may be electrically connected to the inner lines GL1, GL2, and GL3, respectively. The first fan-out line FL1 may be electrically connected to the first inner lines GL1, the second fan-out line FL2 may be electrically connected to the second inner lines GL2, and the third fan-out line FL3 may be electrically connected to the third inner line GL3. The first fan-out lines FL1 may be outer fan-out lines disposed at left and right outer sides of the display area DPA, the second fan-out line FL2 may be an inner fan-out line disposed inside the first fan-out lines FL1, and the third fan-out line FL3 may be the outermost fan-out line disposed in the non-display area NDA.

The number of first pad lines PL1 electrically connected to the first fan-out line FL1 may be smaller than the number of first inner lines GL1 electrically connected to the first fan-out line FL1, and an upper side of the first fan-out line FL1, which is one side (or first side) of the first fan-out line FL1 in the first direction DR1, may have a greater width than a lower side thereof, which is the other side (or second side) thereof. The first fan-out line FL1 may have a width increasing from the lower side thereof toward the upper side thereof in the second direction DR2. Similarly, the number of second pad lines PL2 electrically connected to the second fan-out line FL2 may be smaller than the number of second inner lines GL2 electrically connected to the second fan-out line FL2. The second pad lines PL2 may be divided into second pad line groups electrically connected to the second pads PD2 electrically connected to different conductive films, respectively, and the second fan-out line FL2 may be electrically connected to each of different second pad line groups. The second fan-out line FL2 may include portions having a width smaller than that of an upper side thereof, and the portions having the smaller width may be electrically connected to the second pad lines PL2, respectively.

Each of the first fan-out line FL1 and the second fan-out line FL2 may be disposed over the display area DPA and the pad area PDA. Portions of the first fan-out line FL1 and the second fan-out line FL2 electrically connected to the pad lines PL may be disposed in the pad area PDA, and portions of the first fan-out line FL1 and the second fan-out line FL2 electrically connected to the inner lines GL1 and GL2 may be disposed in the display area DPA.

Each of the third fan-out lines FL3 may be electrically connected to a third pad line PL3 and a third inner line GL3. The third fan-out line FL3 may have a predetermined width, may extend in the first direction DR1, may be bent in the second direction DR2, and may be bent again in the first direction DR1. The third fan-out line FL3 may be electrically connected to the third pad line PL3 and may be bent from the pad area PDA to the non-display area NDA positioned outside the display area DPA in the second direction DR2 and extend.

However, shapes of the fan-out lines FL1, FL2, and FL3 are not limited thereto. For example, each of the first fan-out line FL1 and the second fan-out line FL2 may be divided into lines having the same width as the pad lines PL, and the divided lines may be electrically connected to the pad lines PL so as to correspond to the pad lines PL, respectively.

The dummy lines DL are outer lines disposed at the outermost portion of the pad area PDA and may be spaced apart from the third pad lines PL3 in the second direction DR2. The dummy lines DL may be disposed at the left and right outermost portions in the pad area PDA of the display device 10 so as to be spaced apart from each other.

The dummy lines DL may include first dummy lines DL1 extending in the first direction DR1 and spaced apart from each other in the second direction DR2 and second dummy lines DL2 respectively spaced apart from the first dummy lines DL1 in the first direction DR1. First dummy lines DL1 and second dummy lines DL2 disposed on both sides of the pad area PDA in the second direction DR2 may be disposed adjacent to each other and may form dummy line groups.

Similar to the pad lines PL, the dummy lines DL1 and DL2 may be disposed to extend from the mother substrate to the first substrate SUB, and may be electrically disconnected in the process of separating the first substrate SUB from the mother substrate. Accordingly, the other sides (or second sides) of the first dummy lines DL1 of the dummy lines DL in the first direction DR1 may extend to the edge of the lower side of the first substrate SUB. One sides (or first sides) of the first dummy lines DL1 in the first direction DR1 may be spaced apart from and face the other sides (or second sides) of the second dummy lines DL2 in the first direction DR1. One sides (or first sides) of the second dummy lines DL2 in the first direction DR1 may be electrically connected to other lines disposed up to the display area DPA. For example, the second dummy lines DL2 may partially overlap and be electrically connected to a connection line CL disposed on a different layer.

The connection line CL may be disposed to extend in the second direction DR2 in the pad area PDA and may be disposed to extend in the first direction DR1 in the non-display areas NDA positioned on both sides of the display area DPA in the second direction DR2. A portion of the connection line CL extending in the second direction DR2 in the pad area PDA may overlap the fan-out lines FL1, FL2, and FL3 and the second dummy lines DL2 in the thickness direction. A portion of the connection line CL extending in the first direction DR1 may overlap the third inner lines GL3 in the thickness direction in the non-display areas NDA. The connection line CL may be electrically connected to the second dummy lines DL2 and may be electrically connected to the electrodes RME of the display area DPA.

According to an embodiment, the display device 10 may include dummy patterns DP (DP1, DP2) disposed on both side portions on which the first dummy lines DL1 and the second dummy lines DL2 are spaced apart from and face each other. The dummy patterns DP may be electrically connected to at least one dummy line DL1 and DL2, and the dummy patterns DP electrically connected to different dummy lines DL1 and DL2 may be spaced apart from each other. For example, any dummy pattern (e.g., first dummy pattern DP1 in FIG. 10) electrically connected to the first dummy line DL1 may be spaced apart from another dummy pattern (e.g., second dummy pattern DP2 in FIG. 10) electrically connected to the second dummy line DL2.

The pad lines PL and dummy lines DL of the display device 10 may be utilized as lines for applying an alignment signal of the light emitting elements ED during the processes of manufacturing the display device 10. For example, the pad lines PL and the first dummy lines DL1 of the dummy lines DL may be disposed from the mother substrate, on which the processes of manufacturing the display device 10 are performed, to the first substrate SUB. The pad lines PL may be electrically connected to the inner lines GL1, GL2 and GL3, and the first dummy lines DL1 may be formed in a state in which they are electrically connected to the second dummy lines DL2 and the connection line CL during the processes of manufacturing the display device 10. The alignment signal applied to the mother substrate may be transferred to the electrode RME of each sub-pixel SPXn through the pad lines PL and the dummy lines DL, and the light emitting elements ED may be aligned on the electrodes RME.

After the processes of manufacturing the display device 10 are performed on the mother substrate, the pad lines PL and the first dummy lines DL may be separated at the edge of the lower side of the first substrate SUB while the first substrate SUB is separated from the mother substrate. Accordingly, side surfaces of the pad lines PL and the first dummy lines DL1 may be exposed to the outside at the edge of the lower side of the first substrate SUB.

The pad area PDA of the display device 10 may include an inner pad area PA1 in which the pads PD are disposed and an outer pad area PA2 in which the pads PD are not disposed and the dummy lines DL are disposed. The conductive film on which the external device is mounted may be disposed in the inner pad area PA1, and the conductive film may not be disposed in the outer pad area PA2. Since the conductive film on which the external device is mounted is attached to the pad lines PL disposed in the inner pad area PA1, portions of the edge of the lower side of the first substrate SUB where the pad lines PL are exposed may be covered (or overlapped) by an insulating member. Accordingly, outside air may not permeate into the pad lines PL. On the other hand, portions of the first dummy lines DL1 exposed to the outside may not be covered by the insulating member, and the outside air may permeate into the first dummy lines DL1 exposed to the outside.

In the display device 10 according to an embodiment, the first dummy lines DL1 exposed to the outside may not be electrically connected to lines disposed in the display area DPA or lines electrically connected thereto. The first dummy lines DL1 may be formed in a state in which they are electrically connected to the second dummy lines DL2, and may be separated from the second dummy lines DL2 by a process of separating the first dummy lines DL2 from the second dummy lines DL2 after the light emitting elements ED are aligned. In the display device 10, damage to the lines of the display area DPA due to the outside air may be prevented even though the first dummy lines DL1 are exposed to the outside.

Figure 10:
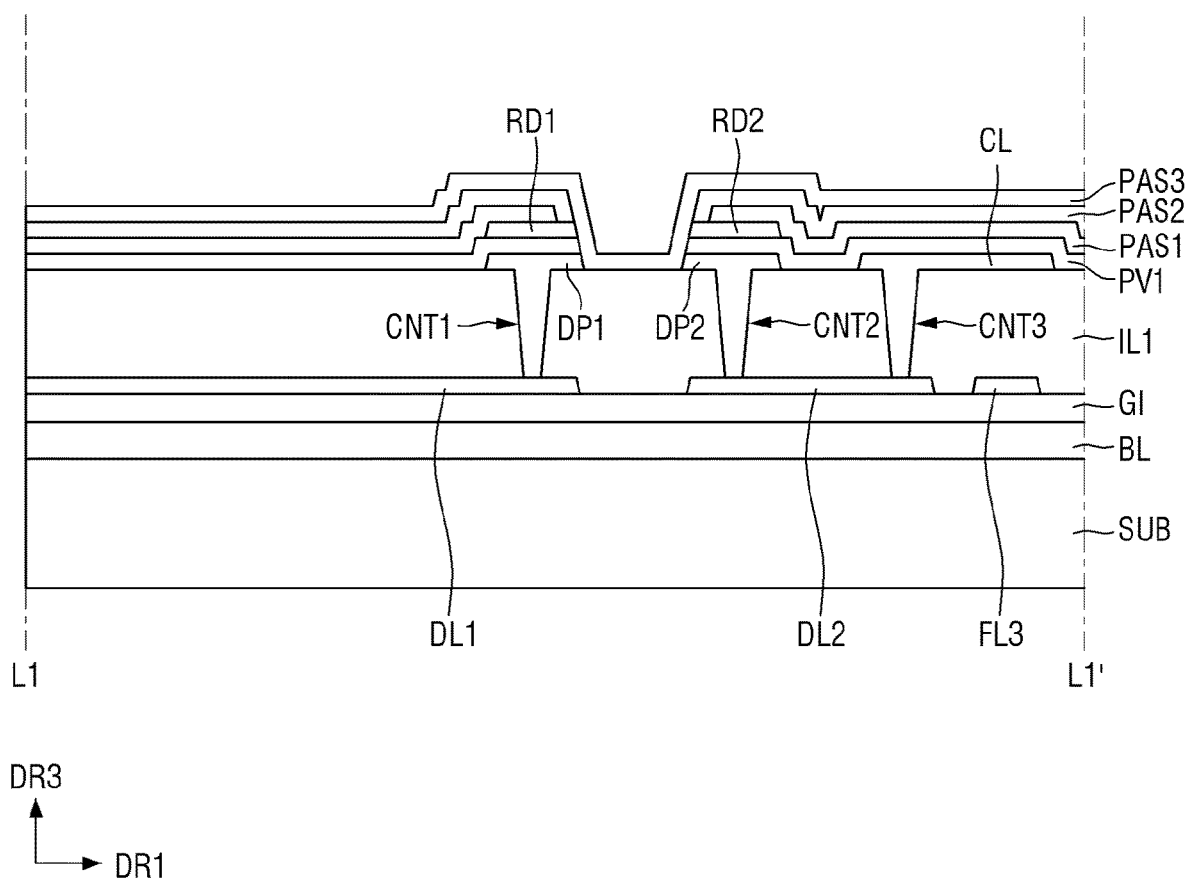
FIG. 10 is a schematic cross-sectional view taken along line L1-L1' of FIG. 9.
Figure 11:
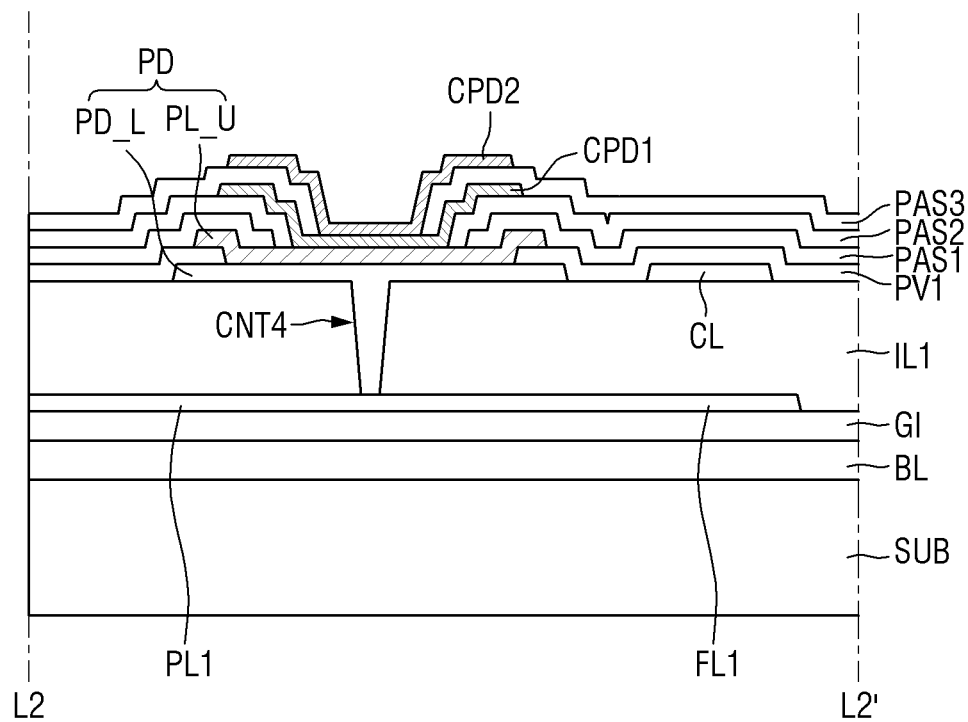
FIG. 11 is a schematic cross-sectional view taken along line L2-L2' of FIG. 9.

FIG. 10 is a schematic cross-sectional view taken along line L1-L1' of FIG. 9. FIG. 11 is a schematic cross-sectional view taken along line L2-L2' of FIG. 9. FIG. 10 illustrates a cross section crossing the first dummy line DL1 and the second dummy line DL2 disposed in the outer pad area PA2, and FIG. 11 illustrates a cross section crossing the first pad line PL1 and the pad PD disposed in the inner pad area PA1.

Referring to FIGS. 10 and 11 in conjunction with FIG. 9, in an embodiment, the dummy lines DL (e.g., DL1 and DL2) and the pad line PL may be formed of the second conductive line disposed on the first gate insulating layer GI. The first dummy line DL1 and the second dummy line DL2 may extend in the first direction DR1 and may be spaced apart from each other in the first direction DR1. The first dummy line DL1 and the second dummy line DL2 disposed on a same layer may be spaced apart and separated from each other.

The pad line (e.g., the first pad line PL1) may also be formed of the second conductive layer and extend in the first direction DR1. The fan-out line FL electrically connected to the pad line PL may also be formed of the second conductive layer, and the pad lines PL and the fan-out line FL may be integrated with each other.

The dummy patterns DP (e.g., DP1 and DP2) formed of the third conductive layer, and dummy electrodes RD (e.g., RD1 and RD2) disposed on the dummy patterns DP and the first passivation layer PV1 may be disposed in the outer pad area PA2. The dummy patterns DP1 and DP2 may be electrically connected to different dummy lines DL1 and DL2, respectively, and the dummy electrodes RD1 and DR2 may be disposed on different dummy patterns DP1 and DP2, respectively.

For example, the dummy patterns DP may include a first dummy pattern DP1 electrically connected to the first dummy line DL1 and a second dummy pattern DP2 electrically connected to the second dummy line DL2. The first dummy pattern DP1 may directly contact and may be electrically connected to the first dummy line DL1 through a first contact hole CNT1 penetrating through the first interlayer insulating layer IL1. The second dummy pattern DP2 may directly contact and may be electrically connected to the second dummy line DL2 through a second contact hole CNT2 penetrating through the first interlayer insulating layer IL1. The first dummy pattern DP1 and the second dummy pattern DP2 may be spaced apart and separated from each other in the first direction DR1.

The dummy electrodes RD1 and RD2 may include a first dummy electrode RD1 disposed on the first dummy pattern DP1 and a second dummy electrode RD2 disposed on the second dummy pattern DP2. The first dummy electrode RD1 and the second dummy electrode RD2 may be directly disposed on the first passivation layer PV1 disposed on the third conductive layer, and may be electrically insulated from the dummy patterns DP1 and DP2. The first dummy electrode RD1 and the second dummy electrode RD2 may be spaced apart and separated from each other in the first direction DR1.

According to an embodiment, inner sides of the first dummy electrode RD1 and the second dummy electrode RD2 facing each other may be, respectively, side by side (or aligned with) inner sides of the first dummy pattern DP1 and the second dummy pattern DP2 facing each other. The first dummy electrode RD1 and the second dummy electrode RD2, and the first dummy pattern DP1 and the second dummy pattern DP2 may be formed in a state in which they are electrically connected to each other, respectively, in the processes of manufacturing the display device 10, and may be separated together by a same patterning process. Accordingly, the inner sides of the dummy patterns DP1 and DP2 facing each other and the inner sides of the dummy electrodes RD1 and RD2 facing each other may be side by side with each other, respectively.

The connection line CL may be formed of the third conductive layer and may be electrically connected to the second dummy line DL2. For example, the connection line CL may directly contact and may be electrically connected to the second dummy line DL2 through a third contact hole CNT3 penetrating through the first interlayer insulating layer IL1.

The pad line PL and the fan-out line FL may be electrically connected to each other, and the pad line PL may be electrically connected to the pad PD disposed thereon. The pad PD may include a pad base layer PD_L formed of the third conductive layer and a pad upper layer PD_U disposed on the pas base layer PD_L. The pad base layer PD_L may be electrically connected to the pad line PL through a fourth contact hole CNT4 penetrating through the first interlayer insulating layer ILL and the pad upper layer PD_U disposed on the first passivation layer PV1 may be directly disposed on the pad base layer PD_L through an opening of the first passivation layer PV1. The pad upper layer PD_U, the dummy electrode RD, and the electrode RME disposed in the display area DPA may be made of a same material.

The first insulating layer PAS1, the second insulating layer PAS2, and the third insulating layer PAS3 may be disposed on the dummy electrode RD and the pad PD of the pad area PDA, similar to the display area DPA. In the outer pad area PA2, the first insulating layer PAS1, the second insulating layer PAS2, and the third insulating layer PAS3 may be sequentially disposed on the dummy electrodes RD. In an embodiment, the first insulating layer PAS1 and the second insulating layer PAS2 may expose a portion where the first dummy pattern DP1 and the second dummy pattern DP2 are spaced apart from each other, and the third insulating layer PAS3 may cover the portion where the first dummy pattern DP1 and the second dummy pattern DP2 are spaced apart from each other.

As described below, the dummy patterns DP1 and DP2 and the dummy electrodes RD1 and RD2 may be patterned and separated from each other after a process of forming the second insulating layer PAS2. The first insulating layer PAS1 and the second insulating layer PAS2 may be disposed so as not to cover portions where the dummy patterns DP and the dummy electrodes RD in an electrically connected state are separated from each other, and portions exposed by the first insulating layer PAS1 and the second insulating layer PAS2 may be patterned. The third insulating layer PAS3 formed after the patterning may be disposed to cover the portions where the dummy patterns DP and the dummy electrodes RD are spaced apart from each other, and the third insulating layer PAS3 may contact each of the first interlayer insulating layer ILL the dummy patterns DP1 and DP2, and the dummy electrodes RD1 and RD2. An upper surface of the first interlayer insulating layer IL1 at the portion where the dummy patterns DP1 and DP2 are spaced apart from each other may contact the third insulating layer PAS3, and the inner sides of the dummy patterns DP1 and DP2 facing each other and the inner sides of the dummy electrodes RD1 and RD2 facing each other may contact the third insulating layer PAS3.

Pad capping layers CPD1 and CPD2 may be respectively disposed on the pads PD of the inner pad area PA1, and the pad capping layers CPD1 and CPD2 and the connection electrode CNE may be formed of a same material. A first pad capping layer CPD1 may be disposed on the second insulating layer PAS2, and thus the first pad capping layer CPD1 and the second connection electrode CNE2 may be disposed on substantially a same layer, and the second pad capping layer CPD2 may be disposed on the third insulating layer PAS3, and thus the second pad capping layer CPD2 and the first connection electrode CNE1 may be disposed on substantially a same layer. The first pad capping layer CPD1 may contact the pad upper layer PD_U through a contact hole penetrating through the first insulating layer PAS1 and the second insulating layer PAS2, and the second pad capping layer CPD2 may contact the first pad capping layer CPD1 through a contact hole penetrating through the third insulating layer PAS3. The second insulating layer PAS2 may be disposed between the first pad capping layer CPD1 and the first insulating layer PAS1, and the third insulating layer PAS3 may be disposed between the first pad capping layer CPD1 and the second pad capping layers CPD2.

As described below, the first dummy pattern DP1 and the second dummy pattern DP2, and the first dummy electrode RD1 and the second dummy electrode DR2 may be formed in a state in which they are electrically connected to each other, respectively, while the processes of manufacturing the display device 10 are performed on the mother substrate. Even though the first dummy line DL1 and the second dummy line DL2 are formed in a state in which they are spaced apart and separated from each other, the first dummy line DL1 and the second dummy line DL2 may be formed in a state in which they are electrically connected to each other through the dummy patterns DP1 and DP2 and the dummy electrodes RD1 and RD2.

The first dummy line DL1 and the second dummy line DL2 may be utilized as lines to which the alignment signal for aligning the light emitting elements ED is applied. The alignment signal applied to the first dummy line DL1 may be transferred to the connection line CL through the second dummy line DL2. The connection line CL may be electrically connected to the electrodes RME of the display area DPA, and the alignment signal may be transferred to the electrodes RME. In a process after aligning the light emitting elements ED, the dummy patterns DP and the dummy electrodes RD may be separated from each other.

In the outer pad area PA2, even though the outside air permeates into the first dummy line DL1 due to exposure of the first dummy line DL1 to the outside, the first dummy pattern DP1 and the second dummy pattern DP2 are spaced apart from each other, such that a permeation path of the outside air may be blocked. Accordingly, even though the outside air permeates into the first dummy line DL1 exposed to the outside, the outside air may no longer flow into the second dummy line DL2 and the inside of the second dummy line DL2. In the inner pad area PA1, even though the pad lines PL are electrically connected to the fan-out line FL, the conductive film may be disposed on the pad lines PL, and the pad lines PL may be covered by the insulating member under the inner pad area PA1 of the first substrate SUB. In the display device 10 according to an embodiment, even though some of the dummy lines DL are exposed to the outside while the first substrate SUB is separated from the mother substrate, the outside air permeating from the outside may not flow into the display area DPA, and damage to the lines disposed in the display area DPA may be prevented.

Figure 12:
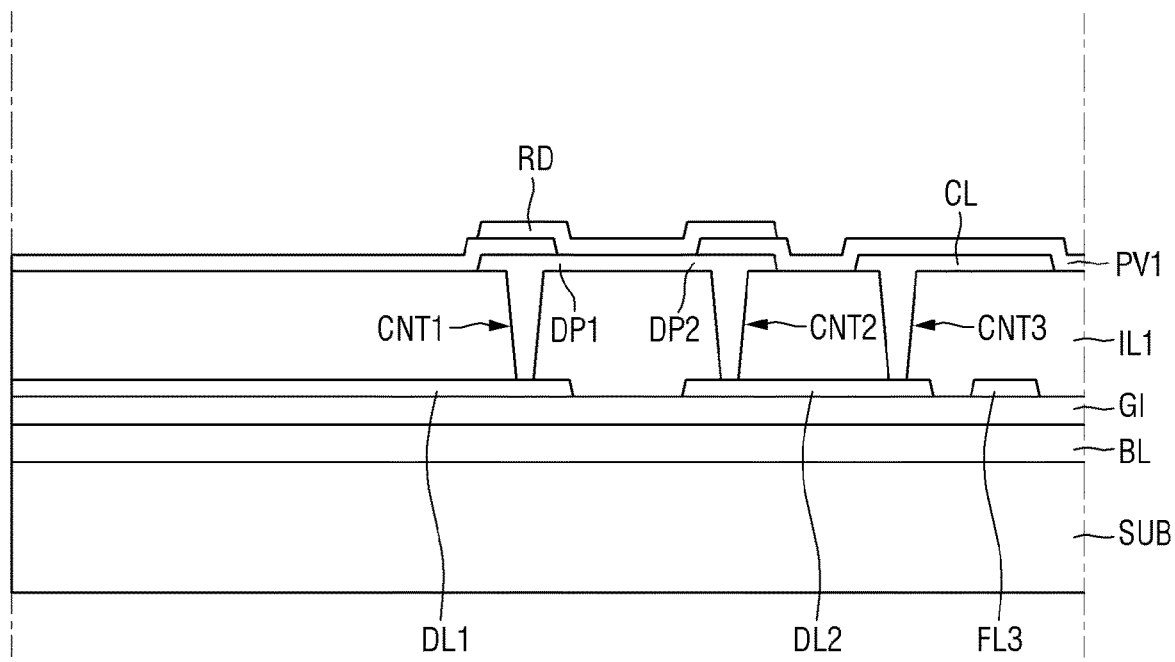
FIGS. 12 to 14 are schematic cross-sectional views illustrating a process of forming dummy lines among processes of manufacturing the display device according to an embodiment.
Figure 12:
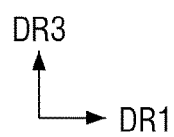
Figure 13:
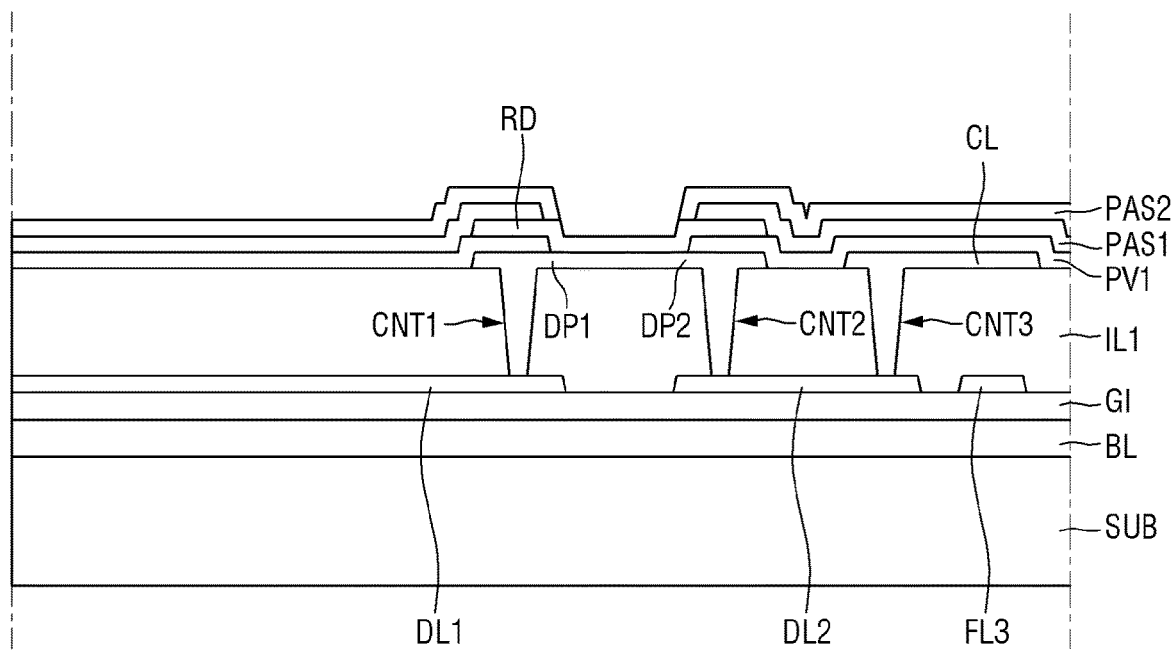
Figure 14:
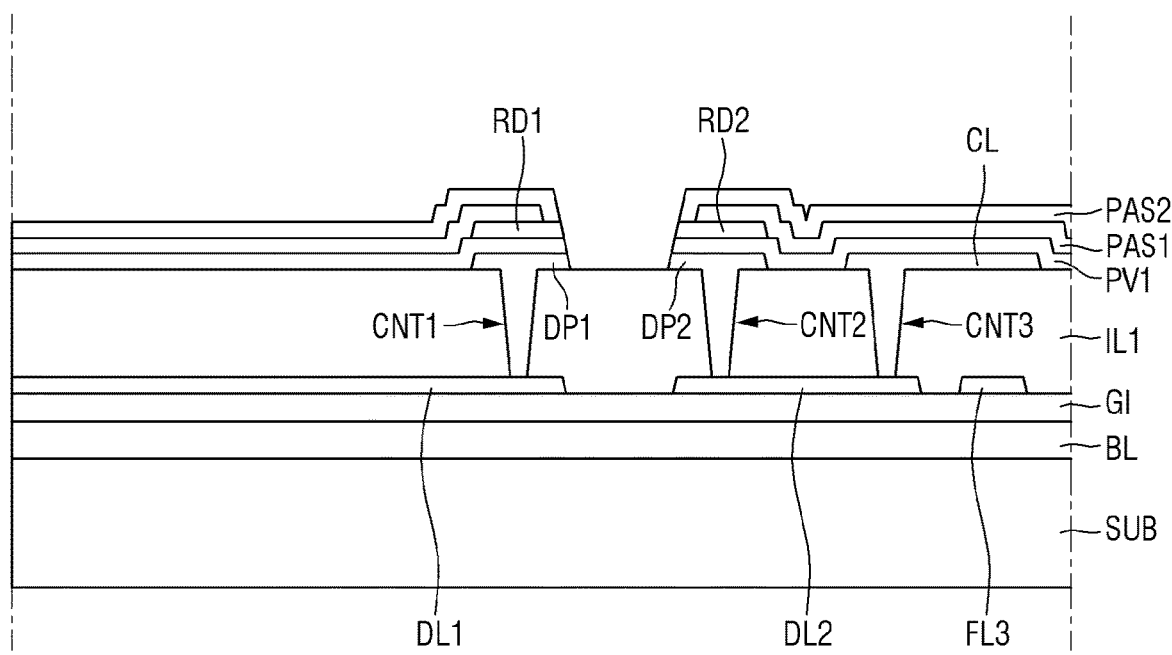

FIGS. 12 to 14 are schematic cross-sectional views illustrating a process of forming dummy lines among processes of manufacturing the display device according to an embodiment.

In FIGS. 12 to 14, structures according to the formation order of the dummy lines DL (e.g., DL1 and DL2) and the dummy patterns DP (e.g., DP1 and DP2) in the display device 10 are illustrated as cross-sectional views, respectively. FIGS. 12 to 14 illustrate the formation order of the dummy lines DL, the dummy patterns DP, and the dummy electrodes RD disposed in the pad area PDA by way of example, and the dummy lines DL, the dummy patterns DP, and the dummy electrodes RD may correspond to the structure illustrated in FIG. 10. A process of forming each layer may be performed as a general patterning process. Hereinafter, a formation method of each process will be briefly described, and the formation order will be mainly described.

Referring to FIG. 12, the first substrate SUB is prepared, and first to third conductive layers, the buffer layer BL, the first gate insulating layer GI, the first interlayer insulating layer ILL the first passivation layer PV1, and the dummy electrode RD are formed on the first substrate SUB. Each of the first to third conductive layers and the electrodes RME1 and RME2 disposed on the first substrate SUB may be formed by depositing a material forming each layer, for example, a metal material, and performing a patterning process on such a material using a mask. Each of the buffer layer BL, the first gate insulating layer GI, the first interlayer insulating layer ILL and the via layer VIA disposed on the first substrate SUB may be formed by applying a material forming each layer, for example, an insulating material, or performing a patterning process on such a material using a mask, if desired.

The first dummy line DL1 and the second dummy line DL2 may be disposed on a same layer, but may be spaced apart and separated from each other, and may be each electrically connected to the dummy pattern DP. A dummy pattern DP may be electrically connected to each of different dummy lines DL1 and DL2 and may be electrically connected to the dummy electrode RD disposed thereon. The first dummy line DL1 and the second dummy line DL2 may be formed in a state in which they are spaced apart from each other, but may be electrically connected to each other through the dummy pattern DP and the dummy electrode RD. The second dummy line DL2 may be electrically connected to the connection line CL electrically connected to the electrodes RME of the display area DPA.

Referring to FIG. 13, the first insulating layer PAS1 is formed on the dummy electrode RD, a process of aligning the light emitting elements ED in the display area DPA is performed, and the second insulating layer PAS2 disposed on the light emitting elements ED is formed. The process of aligning the light emitting elements ED may be performed by applying the alignment signal from the mother substrate to the pad line PL and the first dummy line DL1 disposed on the first substrate SUB. The alignment signal may be transferred to the electrodes RME disposed in the display area DPA through the first dummy line DL1 and the pad line PL, and may generate an electric field on the electrodes RME. The light emitting elements ED may be disposed on the electrodes RME by the electric field generated on the electrodes RME.

After the light emitting elements ED are disposed, a process for separating the dummy pattern DP and the dummy electrode RD in the pad area PDA may be performed. Openings exposing a portion of an upper surface of the dummy electrode RD may be formed in the first insulating layer PAS1 and the second insulating layer PAS2 disposed on the dummy electrode RD.

Referring to FIG. 14, the dummy electrodes RD1 and RD2 and the dummy patterns DP1 and DP2 spaced apart from each other are formed by partially patterning the dummy electrode RD and the dummy pattern DP through the openings of the first insulating layer PAS1 and the second insulating layer PAS2. By the patterning process, a dummy pattern DP may be separated into the first dummy pattern DP1 and the second dummy pattern DP2 respectively electrically connected to the dummy lines DL1 and DL2 spaced apart from each other, and the dummy electrode RD may be separated into the first dummy electrode RD1 and the second dummy electrode RD2 respectively disposed on the dummy patterns DP1 and DP2 separated from each other.

A process of separating the dummy pattern DP and the dummy electrode RD may be performed as a patterning process using the second insulating layer PAS2 exposing a portion of the upper surface of the dummy electrode RD as a mask. In an embodiment, portions of the dummy pattern DP and the dummy electrode RD may be patterned at the same time, and as described above, the inner sides of the dummy patterns DP1 and DP2 spaced apart from and facing each other and the inner sides of the dummy electrodes RD1 and RD2 spaced apart from and facing each other may be formed side by side with each other, respectively.

In case that the first substrate SUB is separated from the mother substrate after the processes of manufacturing the display device 10 are finished, the first dummy line DL1 may be exposed. Nevertheless, the outside air that has permeated in the first dummy line DL1 may no longer flow into the display device 10 because the first dummy pattern DP1 is separated from the second dummy pattern DP2. Accordingly, in the display device 10, even though the first dummy line DL1 is exposed at the edge of the lower side in the first direction DR1, outside air flowing inside from the first dummy line DL1 may be prevented from permeating into the display area DPA.

Although not illustrated in FIG. 14, the connection electrodes CNE1 and CNE2 and the third insulating layer PAS3 disposed on the second insulating layer PAS2 may be formed to manufacture the display device 10.

According to an embodiment, the display device 10 may further include color control structures TPL, WCL1, and WCL2 (see FIG. 15) and color filter layers CFL1, CFL2, and CFL3 (see FIG. 15) disposed on the light emitting elements ED. Light emitted from the light emitting elements ED may be emitted through the color control structures TPL, WCL1, and WCL2 and the color filter layers CFL1, CFL2, and CFL3, and even though a same type of light emitting elements ED are disposed for each sub-pixel SPXn, colors of the emitted light may be different for each sub-pixel SPXn.

Figure 15:
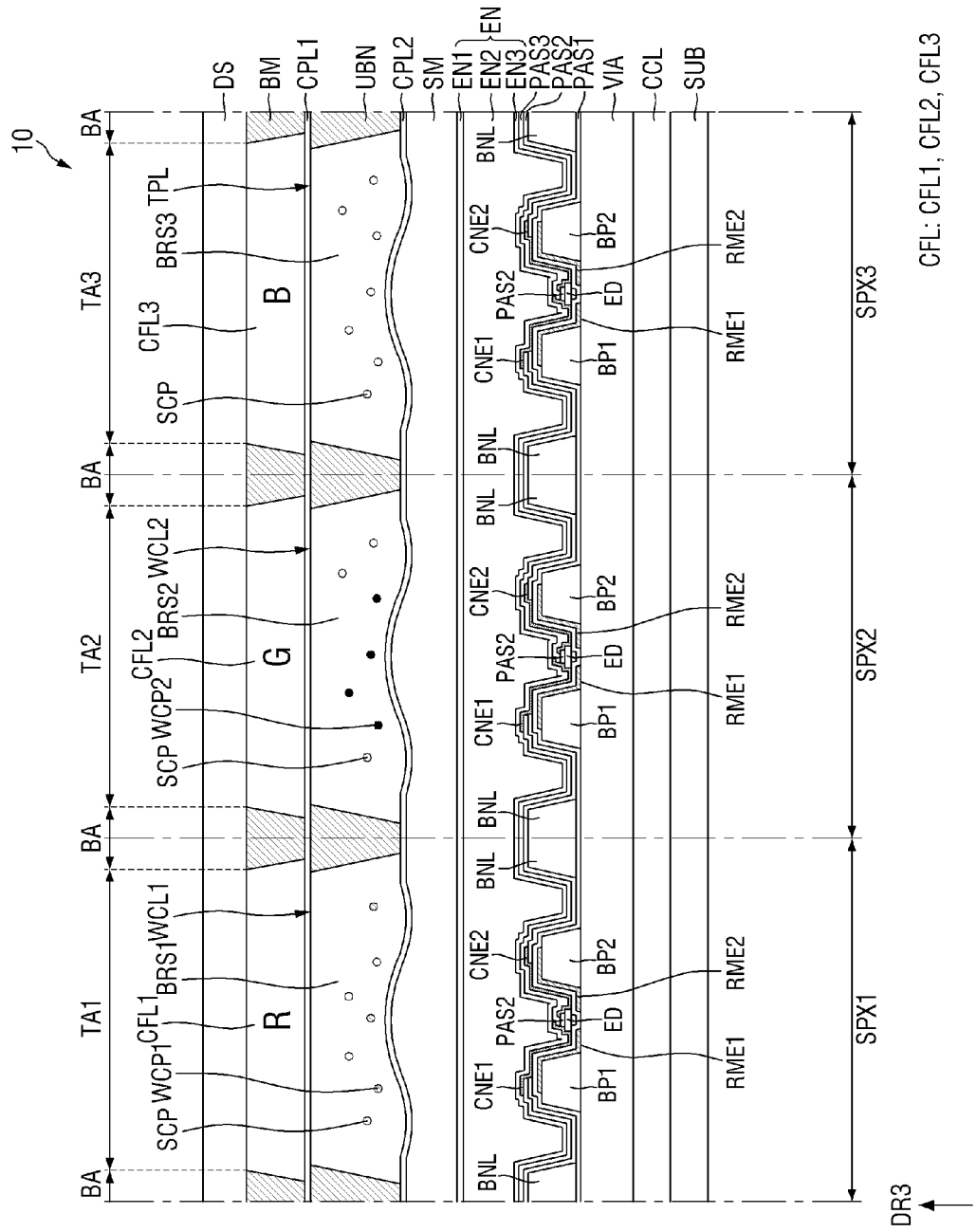
FIG. 15 is a schematic cross-sectional view of the display device according to an embodiment.

FIG. 15 is a schematic cross-sectional view of the display device according to an embodiment.

Referring to FIG. 15, the display device 10 may include a second substrate DS opposing the first substrate SUB, and include the color filter layers CFL1, CFL2, and CFL3 and the color control structures TPL, WCL1, and WCL1 disposed on a surface of the second substrate DS. The display device 10 may include encapsulation layers EN (e.g., EN1, EN2, and EN3) disposed on the third insulating layer PAS3 and the connection electrodes CNE1 and CNE2, on the first substrate SUB. The first substrate SUB and the second substrate DS may be bonded to each other by a sealing member SM.

The encapsulation layer EN disposed on the first substrate SUB may be disposed on the light emitting elements ED so as to cover the third insulating layer PAS3 and the connection electrodes CNE1 and CNE2. The encapsulation layer EN may be entirely disposed on the first substrate SUB and may completely cover members disposed on the first substrate SUB.

The encapsulation layer EN may include a first encapsulation layer EN1, a second encapsulation layer EN2, and a third encapsulation layer EN3 sequentially stacked on the third insulating layer PAS3. The first encapsulation layer EN1 and the third encapsulation layer EN3 may include an inorganic insulating material, and the second encapsulation layer EN2 may include an organic insulating material. For example, each of the first encapsulation layer EN1 and the third encapsulation layer EN3 may include at least one of silicon nitride, aluminum nitride, zirconium nitride, titanium nitride, hafnium nitride, tantalum nitride, silicon oxide, aluminum oxide, titanium oxide, tin oxide, cerium oxide, silicon oxynitride ($SiO_xN_y$), and lithium fluoride. The second encapsulation layer EN2 may include at least one of an acrylic resin, a methacrylic resin, polyisoprene, a vinyl resin, an epoxy resin, a urethane resin, a cellulose resin, and a perylene resin. However, a stacked structure and materials of the encapsulation layer EN are not limited to those described above, and may be variously modified.

The color filter layers CFL1, CFL2, and CFL3 and the color control structures TPL, WCL,1 and WCL2 on the second substrate DS may be disposed on the encapsulation layer EN. In an embodiment of FIG. 15, each of the color filter layers CFL1, CFL2, and CFL3 and the color control structures TPL, WCL1, and WCL2 may be formed on a surface of the second substrate DS, and the second substrate DS may be bonded to the first substrate SUB on which the light emitting elements ED are disposed, by the sealing member SM.

The display device 10 may include light-transmitting areas TA1, TA2, and TA3 in which the color filter layers CFL1, CFL2, and CFL3 are disposed and the light is emitted and light-blocking areas BA which is disposed between the light-transmitting areas TA1, TA2, and TA3 and from which the light is not emitted. The light-transmitting areas TA1, TA2, and TA3 may be positioned to correspond to portions of the emission areas EMA of each sub-pixel SPXn, and the light-blocking areas BA may be areas other than the light-transmitting areas TA1, TA2 and TA3. As described below, the light-transmitting areas TA1, TA2, and TA3 and the light-blocking areas BA may be divided by a light blocking member BM.

The second substrate DS may be spaced apart from and oppose the first substrate SUB. The second substrate DS may be made of a light-transmitting material. In some embodiments, the second substrate DS may include a glass substrate or a plastic substrate. As another example, the second substrate DS may further include a separate layer positioned on the glass substrate or the plastic substrate, for example, an insulating layer such as an inorganic film.

Light-transmitting areas TA1, TA2, and TA3 and light-blocking areas BA may be defined in the second substrate DS, as illustrated in FIG. 15.

The light blocking member BM may be disposed on a surface of the second substrate DS opposing the first substrate SUB, of both surfaces of the second substrate DS. The light blocking member BM may be formed as a lattice-shaped pattern partially exposing a surface of the second substrate DS. In the display device 10, the light blocking member BM may be disposed to cover the sub-areas SA of each sub-pixel SPXn in addition to the bank layers BNL in a plan view. Areas in which the light blocking member BM is not disposed may be the light-transmitting areas TA1, TA2 and TA3 in which the color filter layers CFL1, CFL2, and CFL3 are disposed and from which light is emitted, and areas in which the light blocking member BM is disposed may be the light-blocking areas BA in which the emission of the light is blocked.

The light blocking member BM may include an organic material capable of absorbing light. The light blocking member BM may reduce distortion of colors due to reflection of external light by absorbing the external light. For example, the light blocking member BM may be made of a material used as a black matrix of the display device 10 and may absorb all of visible light wavelengths.

In some embodiments, in the display device 10, the light blocking member BM may be omitted and may be replaced with a material absorbing light of a specific wavelength of visible light wavelengths and transmitting light of another specific wavelength. The light blocking member BM may be replaced with a color pattern including the same material as at least one of the color filter layers CFL1, CFL2, and CFL3. For example, a color pattern including a material of any color filter layer may be disposed or color patterns may be stacked, in an area in which the light blocking member BM is disposed. For a description thereof, reference is made to another embodiment.

Color filter layers CFL1, CFL2, and CFL3 may be disposed on a surface of the second substrate DS. The color filter layers CFL1, CFL2, and CFL3 may be disposed on a surface of the second substrate DS so as to correspond to areas opened by the light blocking member BM, respectively. Different color filter layers CFL1, CFL2, and CFL3 may be spaced apart from each other with the light blocking member BM interposed therebetween, but the disclosure is not limited thereto. In some embodiments, the color filter layers CFL1, CFL2, and CFL3 may be partially disposed on the light blocking member BM to be spaced apart from each other on the light blocking member BM, and in an embodiment, the color filter layers CFL1, CFL2, and CFL3 may partially overlap each other.

The color filter layers CFL1, CFL2, and CFL3 may include a first color filter layer CFL1 disposed in the first sub-pixel SPX1, a second color filter layer CFL2 disposed in the second sub-pixel SPX2, and a third color filter layer CFL3 disposed in the third sub-pixel SPX3. The color filter layers CFL1, CFL2, and CFL3 may be formed as island-shaped patterns corresponding to the light-transmitting areas TA1, TA2, and TA3 or the emission areas EMA. However, the disclosure is not limited thereto. The color filter layers CFL1, CFL2, and CFL3 may also be formed in a linear pattern.

The color filter layers CFL1, CFL2, and CFL3 may include colorants such as dyes or pigments absorbing light of wavelength bands other than light of a specific wavelength band. The color filter layers CFL1, CFL2, and CFL3 may be disposed for each sub-pixel SPXn and transmit only some of light incident on the color filter layers CFL1, CFL2, and CFL3 in the corresponding sub-pixels SPXn. In each sub-pixel SPXn of the display device 10, only light transmitted through the color filter layers CFL1, CFL2, and CFL3 may be selectively displayed. In an embodiment, the first color filter layer CFL1 may be a red color filter layer, the second color filter layer CFL2 may be a green color filter layer, and the third color filter layer CFL3 may be a blue color filter layer. Light emitted from the light emitting elements ED may pass through the color control structures TPL, WCL1, and WCL2 and may be emitted through the color filter layers CFL1, CFL2, and CFL3.

A first capping layer CPL1 may be disposed on the color filter layers CFL1, CFL2, and CFL3 and the light blocking member BM. The first capping layer CPL1 may prevent impurities such as moisture or air from permeating from the outside to damage or contaminate the color filter layers CFL1, CFL2, and CFL3. The first capping layer CPL1 may be made of an inorganic insulating material.

An upper bank layer UBN may be disposed on a surface of the first capping layer CPL1 so as to overlap the light blocking member BM. The upper bank layer UBN may be disposed as a lattice-shaped pattern by including portions extending in the first direction DR1 and the second direction DR2. The upper bank layer UBN may surround portions where the color control structures TPL, WCL1, and WCL2 are disposed to correspond to the light transmitting areas TA1, TA2, and TA3. The upper bank layer UBN may form areas in which the color control structures TPL, WCL1, and WCL2 are disposed.

The color control structures TPL, WCL1, and WCL2 may be disposed in areas surrounded by the upper bank layer UBN on a surface of the first capping layer CPL1. The color control structures TPL, WCL1, and WCL2 may be disposed, respectively, in the light-transmitting areas TA1, TA2, and TA3 surrounded by the upper bank layer UBN to form an island-shaped pattern in the display area DPA. However, the disclosure is not limited thereto, and the color control structures TPL, WCL1 and WCL2 may also extend in a direction and be disposed over the sub-pixels SPXn to form a linear pattern.

In an embodiment in which the light emitting elements ED of each sub-pixel SPXn emit blue light of a third color, the color control structures TPL, WCL1, and WCL2 may include a first wavelength conversion layer WCL1 disposed in the first sub-pixel SPX1 so as to correspond to a first light-transmitting area TA1, a second wavelength conversion layer WCL2 disposed in the second sub-pixel SPX2 so as to correspond to a second light-transmitting area TA2, and a light transmitting layer TPL disposed in the third sub-pixel SPX3 so as to correspond to a third light-transmitting area TA3.

The first wavelength conversion layer WCL1 may include a first base resin BRS1 and first wavelength conversion materials WCP1 disposed in the first base resin BRS1. The second wavelength conversion layer WCL2 may include a second base resin BRS2 and second wavelength conversion materials WCP2 disposed in the second base resin BRS2. The first wavelength conversion layer WCL1 and the second wavelength conversion layer WCL2 convert a wavelength of the blue light of the third color incident from the light emitting element ED and transmit the light having the converted wavelength therethrough. The first wavelength conversion layer WCL1 and the second wavelength conversion layer WCL2 may further include scatterers SCP included in each base resin, and the scatterers SCP may increase wavelength conversion efficiency.

The light transmitting layer TPL may include a third base resin BRS3 and scatterers SCP disposed in the third base resin BRS3. The light transmitting layer TPL transmits the blue light of the third color incident from the light emitting element ED, therethrough while maintaining the wavelength of the blue light of the third color. The scatterers SCP of the light transmitting layer TPL may serve to adjust an emission path of the light emitted through the light transmitting layer TPL. The light transmitting layer TPL may not include a wavelength conversion material.

The scatterers SCP may be metal oxide particles or organic particles. Examples of metal oxide of the metal oxide particle may include titanium oxide ($TiO_2$), zirconium oxide ($ZrO_2$), aluminum oxide ($Al_2O_3$), indium oxide ($In_2O_3$), zinc oxide (ZnO), tin oxide ($SnO_2$), or the like, and examples of a material of the organic particle may include an acrylic resin, a urethane resin, or the like.

The first to third base resins BRS1, BRS2, and BRS3 may include a light-transmitting organic material. For example, the first to third base resins BRS1, BRS2, and BRS3 may include an epoxy resin, an acrylic resin, a cardo-based resin, an imide-based resin, or the like. All of the first to third base resins BRS1, BRS2, and BRS3 may be made of a same material, but are not limited thereto.

The first wavelength conversion material WCP1 may be a material converting the blue light of the third color into red light of a first color, and the second wavelength conversion material WCP2 may be a material converting the blue light of the third color into green light of a second color. The first wavelength conversion material WCP1 and the second wavelength conversion material WCP2 may be quantum dots, quantum rods, phosphors, or the like. The quantum dot may include group IV nanocrystals, group II-VI compound nanocrystals, group III-V compound nanocrystals, group IV-VI compound nanocrystals, or combinations thereof.

FIG. 15 illustrates an example in which upper surfaces of the respective layers of the color control structures TPL, WCL1, and WCL2 are formed to be curved and edge portions of the upper surfaces adjacent to the upper bank layer UBN are higher than central portions thereof, but the disclosure is not limited thereto. Upper surfaces the respective layers of the color control structures TPL, WCL1, and WCL2 may be formed to be flat, or central portions of the upper surfaces may be higher than the edge portions thereof unlike FIG. 15.

The light emitting elements ED of each sub-pixel SPXn may emit blue light of a same third color, and light emitted from each sub-pixel SPXn may be light of different colors. For example, light emitted from the light emitting element ED disposed in the first sub-pixel SPX1 is incident on the first wavelength conversion layer WCL1, light emitted from the light emitting element ED disposed in the second sub-pixel SPX2 is incident on the second wavelength conversion layer WCL2, and light emitted from the light emitting element ED disposed in the third sub-pixel SPX3 is incident on the light transmitting layer TPL. The light incident on the first wavelength conversion layer WCL1 may be converted into the red light, the light incident on the second wavelength conversion layer WCL2 may be converted into the green light, and the light incident on the light transmitting layer TPL may be transmitted as same blue light without wavelength conversion. Even though the respective sub-pixels SPXn include the light emitting elements ED emitting light of a same color, the respective sub-pixels SPXn may emit light of different colors according to a layout of the color control structures TPL, WCL1, and WCL2 disposed above the light emitting elements ED.

The light emitting element ED disposed in the first sub-pixel SPX1 may emit the blue light of the third color, which may pass through the encapsulation layer EN and a second capping layer CPL2 and be incident on the first wavelength conversion layer WCL1. The first base resin BRS1 of the first wavelength conversion layer WCL1 may be made of a transparent material, and some of the light may be transmitted through the first base resin BRS1 and be then incident on the first capping layer CPL1 disposed on the first base resin BRS1. However, at least some of the light may be incident on the scatterers SCP and the first wavelength conversion materials WCP1 disposed in the first base resin BRS1, be scattered and wavelength-converted, and be then incident on the first capping layer CPL1 as red light. The light incident on the first capping layer CPL1 may be incident on the first color filter layer CFL1, and the first color filter layer CFL1 may block transmission of light other than the red light. Accordingly, the red light may be emitted from the first sub-pixel SPX1.

Similarly, the light emitted from the light emitting element ED disposed in the second sub-pixel SPX2 may pass through the encapsulation layer EN, the second capping layer CPL2, the second wavelength conversion layer WCL2, the first capping layer CPL1, and the second color filter layer CFL2 and be then emitted as green light.

The light emitting element ED disposed in the third sub-pixel SPX3 may emit the blue light of the third color, which may pass through the encapsulation layer EN and the second capping layer CPL2 and be then incident on the light transmitting layer TPL. The third base resin BRS3 of the light transmitting layer TPL may be made of a transparent material, and some of the light may be transmitted through the third base resin BRS3 and be then incident on the first capping layer CPL1 disposed on the third base resin BRS3. The light incident on the first capping layer CPL1 may pass through the first capping layer CPL1 and be then incident on the third color filter layer CFL3, and the third color filter layer CFL3 may block transmission of light other than the blue light. Accordingly, the blue light may be emitted from the third sub-pixel SPX3.

The display device 10 according to an embodiment may include the color control structures TPL, WCL1, and WCL2 and the color filter layers CFL1, CFL2, and CFL3 disposed above the light emitting elements ED to display light of different colors even though a same type of light emitting elements ED are disposed for each sub-pixel SPXn.

FIG. 15 illustrates an embodiment in which the color filter layers CFL1, CFL2, and CFL3 and the color control structures TPL, WCL1 and WCL2 are formed on the second substrate DS and the second substrate DS is bonded to the first substrate SUB by the sealing member SM, but the disclosure is not limited thereto. According to an embodiment, the color control structures TPL, WCL1, and WCL2 may be directly formed on the first substrate SUB or the color filter layers CFL1, CFL2, and CFL3 may also be formed on the first substrate SUB, such that the second substrate DS may be omitted.

In an embodiment in which the display device 10 includes the second substrate DS disposed above the first substrate SUB, the portion where the dummy lines DL1 and DL2 are spaced apart from each other and the area where the dummy patterns DP are disposed may be disposed under the second substrate DS or disposed outside the second substrate DS.

Figure 16:
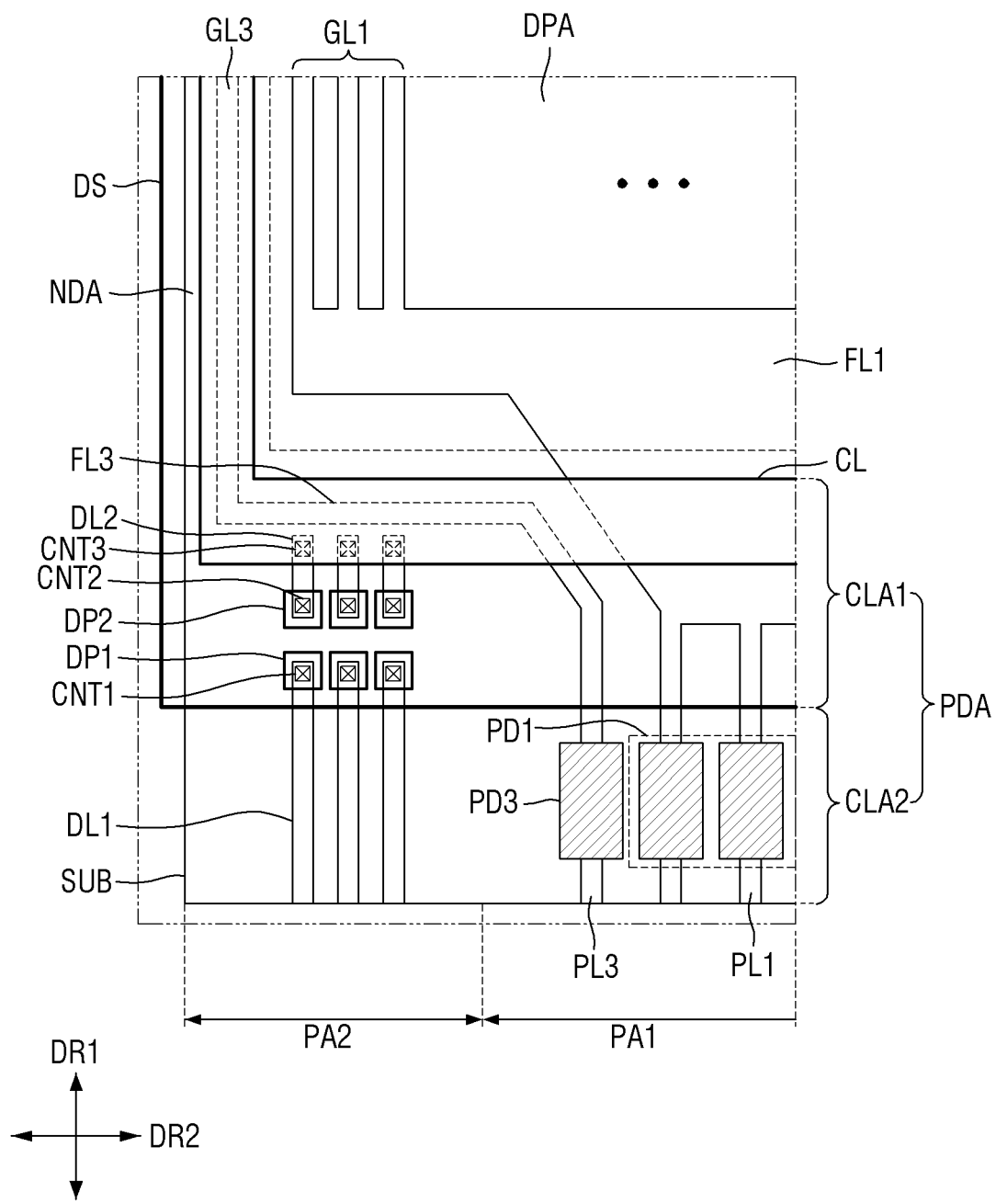
FIG. 16 is a schematic plan view illustrating a portion where the dummy lines of the display device according to an embodiment are disposed.

FIG. 16 is a schematic plan view illustrating a portion where the dummy lines of the display device according to an embodiment are disposed.

Referring to FIG. 16, the display device 10 may include a first area CLA1 that overlaps the second substrate DS and a second area CLA2 that does not overlap the second substrate DS, in the pad area PDA, and the dummy patterns DP may be disposed in the first area CLA1 and the pads PD may be disposed in the second area CLA2. According to an embodiment, a portion where the first dummy line DL1 and the second dummy line DL2 are spaced apart from each other and the dummy patterns DP may be disposed to overlap the second substrate DS. The first dummy line DL1 may be disposed over the first area CLA1 and the second area CLA2, and each of the second dummy line DL2, the first dummy pattern DP1, and the second dummy pattern DP2 may be disposed in the first area CLA1. Although not illustrated in FIG. 16, each of the first dummy electrode RD1 and the second dummy electrode RD2 may also be disposed in the first area CLA1.

The pads PD may be disposed in the second area CLA2 and may be disposed so as not to overlap the second substrate DS. A portion where the dummy patterns DP and dummy lines DL disposed in the first area CLA1 are spaced apart from each other may be disposed so as not to be side by side with the pads PD in the second direction DR2. For example, the pads PD and dummy patterns DP may be disposed so as not to be side by side with each other in the second direction DR2, and in the non-display area NDA, the dummy patterns DP may be disposed inside the pads PD. An interval between the dummy patterns DP and the display area DPA may be smaller than an interval between the pads PD and the display area DPA. However, the disclosure is not limited thereto.

As illustrated in FIG. 15, the encapsulation layers EN1, EN2, and EN3 and the sealing member SM may be disposed between the first substrate SUB and the second substrate DS. The first area CLA1 may be covered by the encapsulation layer EN and the sealing member SM, and the second area CLA2 may not be covered by the encapsulation layer EN and the sealing member SM. In case that the dummy patterns DP are disposed in the first area CLA1 and the dummy lines DL1 and DL2 are spaced apart from each other in the first area CLA1, the portion where the dummy lines DL1 and DL2 are spaced apart from each other may be protected by the encapsulation layer EN and the sealing member SM. In the display device 10, the portion where the dummy patterns DP1 and DP2 and the dummy lines DL1 and DL2 are spaced apart from each other may not be exposed to the outside in the second area CLA2, and the outside air flowing inside from the first dummy line DL1 may be more effectively prevented from flowing inward.

However, the disclosure is not limited thereto. As described above, the third insulating layer PAS3 is disposed on the portion where the dummy patterns DP1 and DP2 are spaced apart from each other and on the dummy electrodes RD1 and RD2, and thus, the permeation of the outside air may be completely prevented by the third insulating layer PAS3. In this case, the dummy patterns DP may be disposed in each of the first area CLA1 and the second area CLA2 or be disposed in the second area CLA2.

Figure 17:
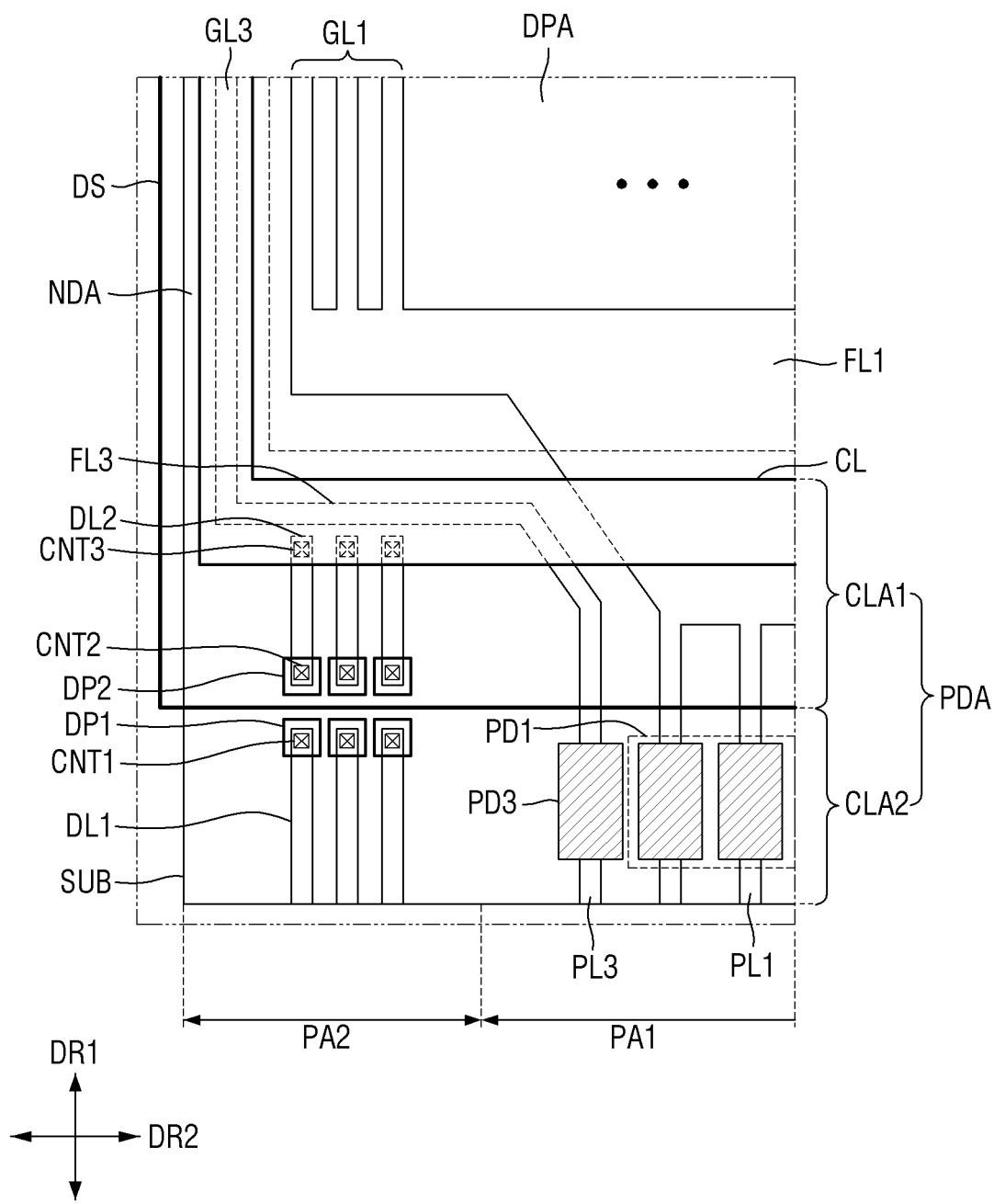
FIGS. 17 and 18 are schematic plan views illustrating portions where dummy lines of a display device according to another embodiment are disposed.
Figure 18:
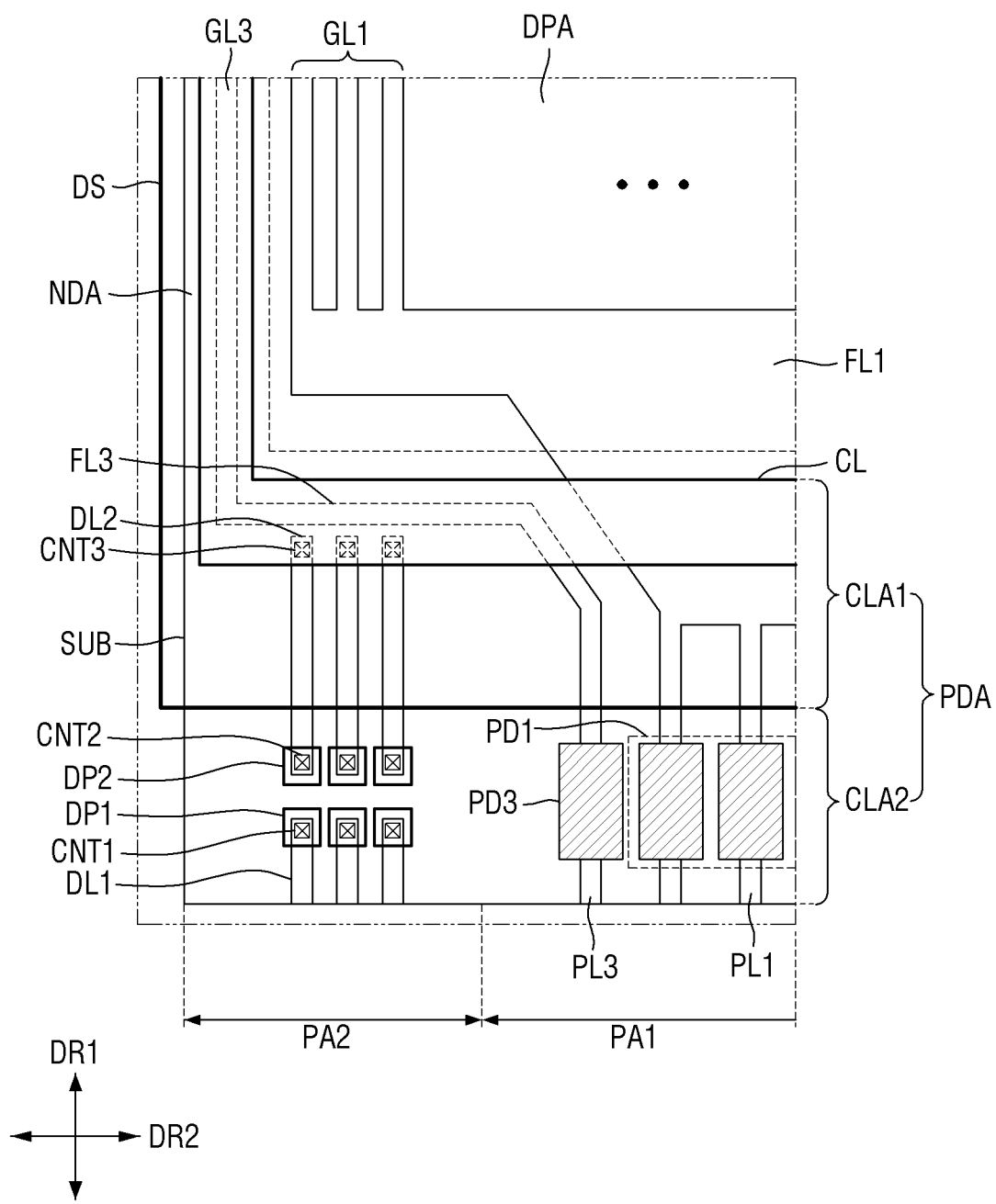

FIGS. 17 and 18 are schematic plan views illustrating portions where dummy lines of a display device according to another embodiment are disposed.

Referring to FIG. 17, in a display device 10 according to an embodiment, the first dummy line DL1 and the second dummy line DL2 may be spaced apart from each other at a boundary between the first area CLA1 and the second area CLA2. Unlike an embodiment of FIG. 16, the first dummy line DL1, the first dummy pattern DP1, and the first dummy electrode RD1 may be disposed in the second area CLA2, and the second dummy line DL2, the second dummy pattern DP2, and the second dummy electrode RD2 may be disposed in the first area CLA1. The first dummy line DL1, the first dummy pattern DP1, and the first dummy electrode RD1 may not overlap the second substrate DS in the thickness direction, but the second dummy line DL2, the second dummy pattern DP2, and the second dummy electrode RD2 may overlap the second substrate DS in the thickness direction.

Referring to FIG. 18, in a display device 10 according to another embodiment, the first dummy line DL1 and the second dummy line DL2 may be spaced apart from each other in the second area CLA2. Unlike another embodiment of FIG. 17, the first dummy line DL1, the first dummy pattern DP1, and the first dummy electrode RD1 may be disposed in the second area CLA2, the second dummy line DL2 may be disposed over the first area CLA1 and the second area CLA2, and the second dummy pattern DP2 and the second dummy electrode RD2 may be disposed in the second area CLA2. The first dummy line DL1, the first dummy pattern DP1, the first dummy electrode RD1, the second dummy pattern DP2, and the second dummy electrode RD2 may not overlap the second substrate DS in the thickness direction, but the second dummy line DL2 may partially overlap the second substrate DS in the thickness direction.

The dummy patterns DP and dummy lines DL disposed in the second area CLA1 may be disposed adjacent to the pads PD. For example, the pads PD and dummy patterns DP may be disposed side by side with each other in the second direction DR2. An interval between the dummy patterns DP and the display area DPA may be the same as an interval between the pads PD and the display area DPA. However, the disclosure is not limited thereto. The dummy patterns DP may be disposed outside the pads PD in the non-display area NDA while being disposed so as not to be side by side with the pads PD in the second direction DR2. In this case, an interval between the dummy patterns DP and the display area DPA may be greater than an interval between the pads PD and the display area DPA.

Figure 19:
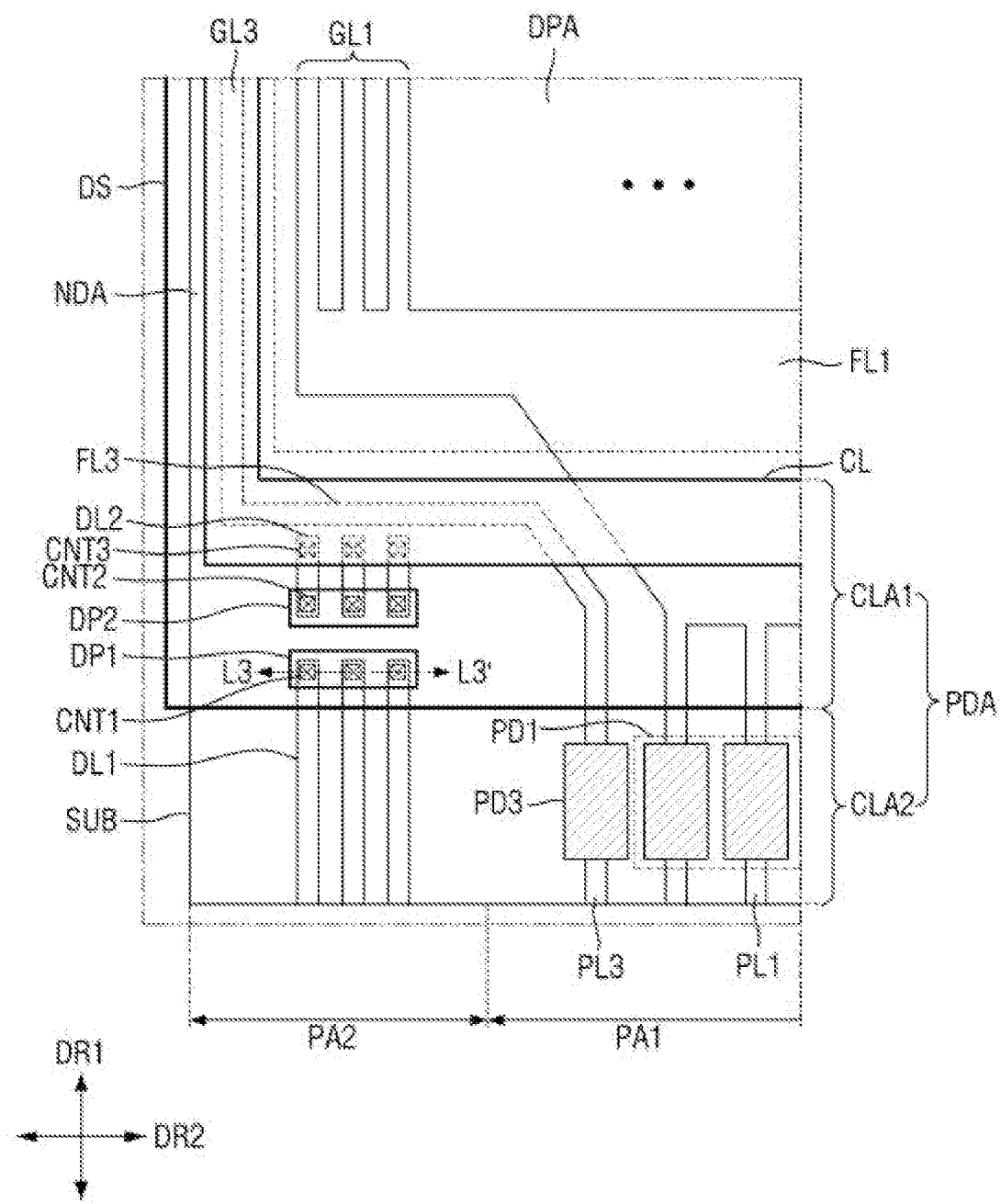
FIG. 19 is a schematic plan view illustrating a portion where dummy lines of a display device according to still another embodiment are disposed.
Figure 20:
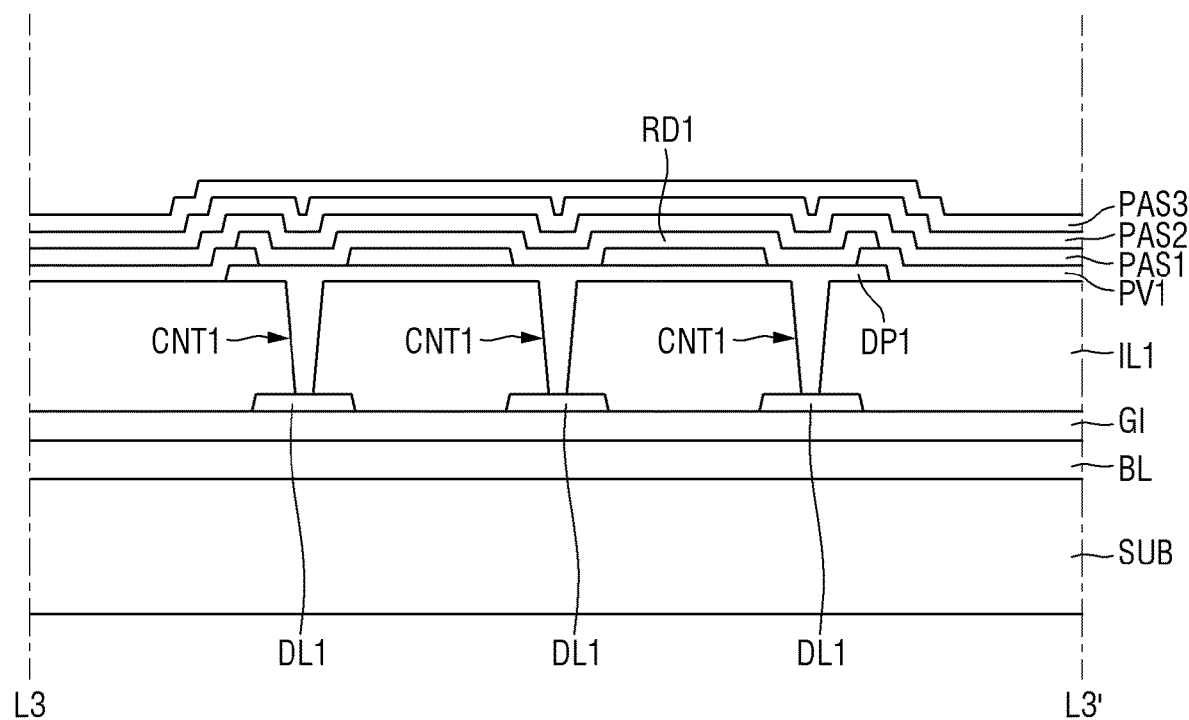
FIG. 20 is a schematic cross-sectional view taken along line L3-L3' of FIG. 19.
Figure 20:
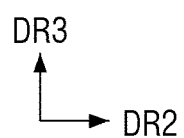

FIG. 19 is a schematic plan view illustrating a portion where dummy lines of a display device according to still another embodiment are disposed. FIG. 20 is a schematic cross-sectional view taken along line L3-L3' of FIG. 19. FIG. 20 illustrates a cross section crossing the first dummy pattern DP1 in the second direction DR2 in the display device 10 of FIG. 19.

Referring to FIGS. 19 and 20, in the display device 10 according to still another embodiment, a dummy pattern DP1 and DP2 may be electrically connected to dummy lines DL1 and DL2, respectively. For example, a first dummy pattern DP1 may be electrically connected to each of first dummy lines DL1 through first contact holes CNT1, and a second dummy pattern DP2 may be electrically connected to each of second dummy lines DL2 through second contact holes CNT2. Signals for driving the light emitting elements ED in the display device 10 may not be applied to the first dummy lines DL1 and the second dummy lines DL2, and a same alignment signal may be applied to the first dummy lines DL1 and the second dummy lines DL2 in the processes of manufacturing the display device 10. Accordingly, the first dummy lines DL1 and the second dummy lines DL2 may be disposed to be spaced apart from each other in the second direction DR2, respectively, but may also be electrically connected to each other.

As in the embodiments of FIGS. 9 and 10, the dummy patterns DP1 and DP2 electrically connecting the first dummy line DL1 and the second dummy line DL2 to each other may be formed as patterns, respectively, so as to correspond to a dummy line DL1 and DL2 in the processes of manufacturing the display device 10, but the disclosure is not limited thereto. As in the embodiment, a dummy pattern DP1 and DP2 may be simultaneously electrically connected to the dummy lines DL1 and DL2, respectively, and the numbers of dummy lines DL1 and DL2 may not coincide with (or match) the numbers of dummy patterns DP1 and DP2. For example, in the embodiments of FIGS. 9 and 10, the number of first dummy lines DL1 and the number of second dummy lines DL2 may be the same as the number of first dummy patterns DP1 and the number of second dummy patterns (or lines) DP2, respectively. However, the disclosure is not limited thereto. As in still another embodiment of FIGS. 19 and 20, the number of first dummy lines DL1 and the number of second dummy lines DL2 may be different from the number of first dummy patterns DP1 and the number of second dummy patterns DP2, respectively, and the numbers of dummy lines DL1 and DL2 may be greater than the numbers of dummy patterns DP1 and DP2.

Hereinafter, other embodiments of the display device 10 will be described with reference to other drawings.

Figure 21:
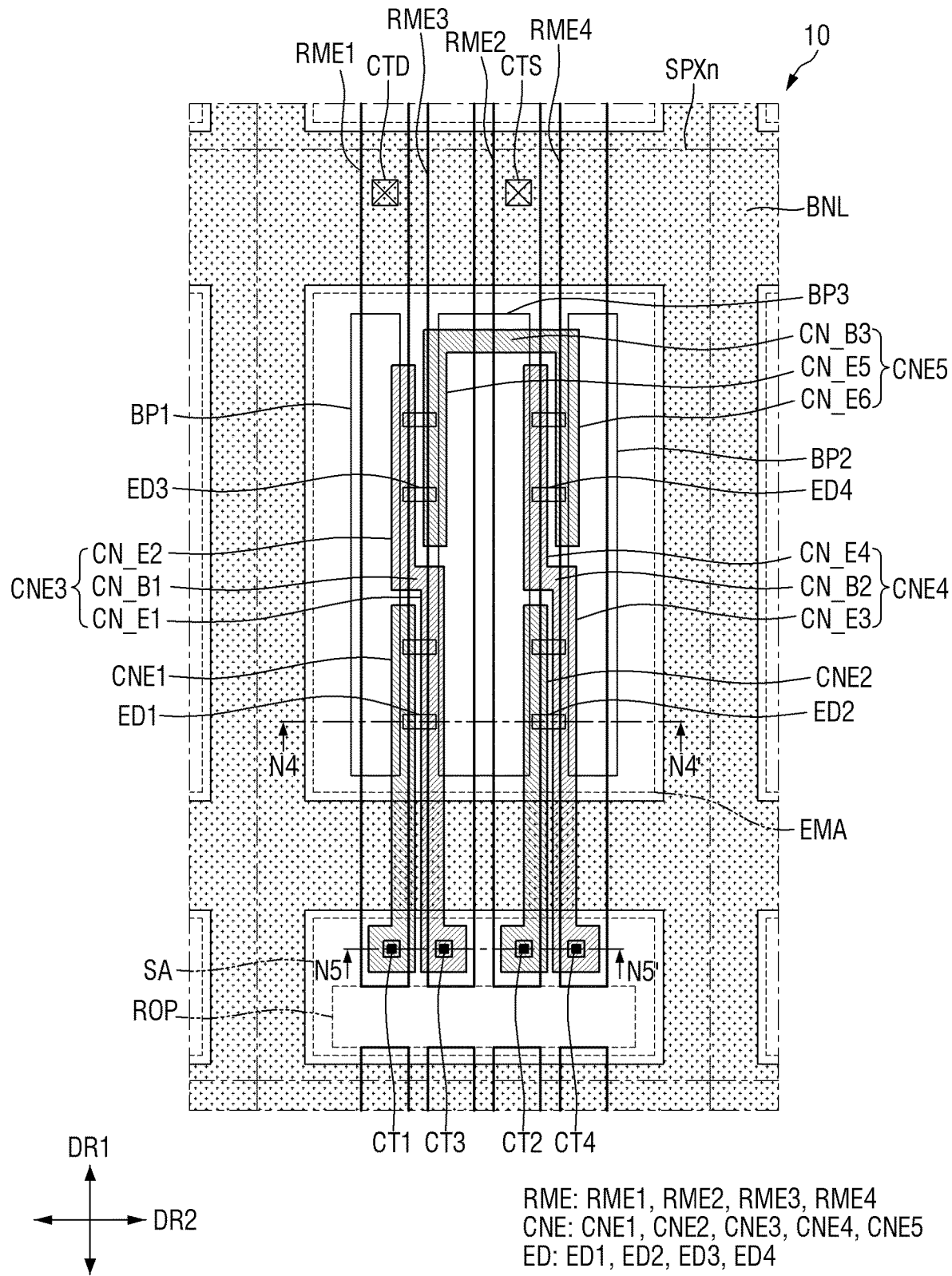
FIG. 21 is a schematic plan view illustrating one sub-pixel of a display device according to another embodiment.
Figure 22:
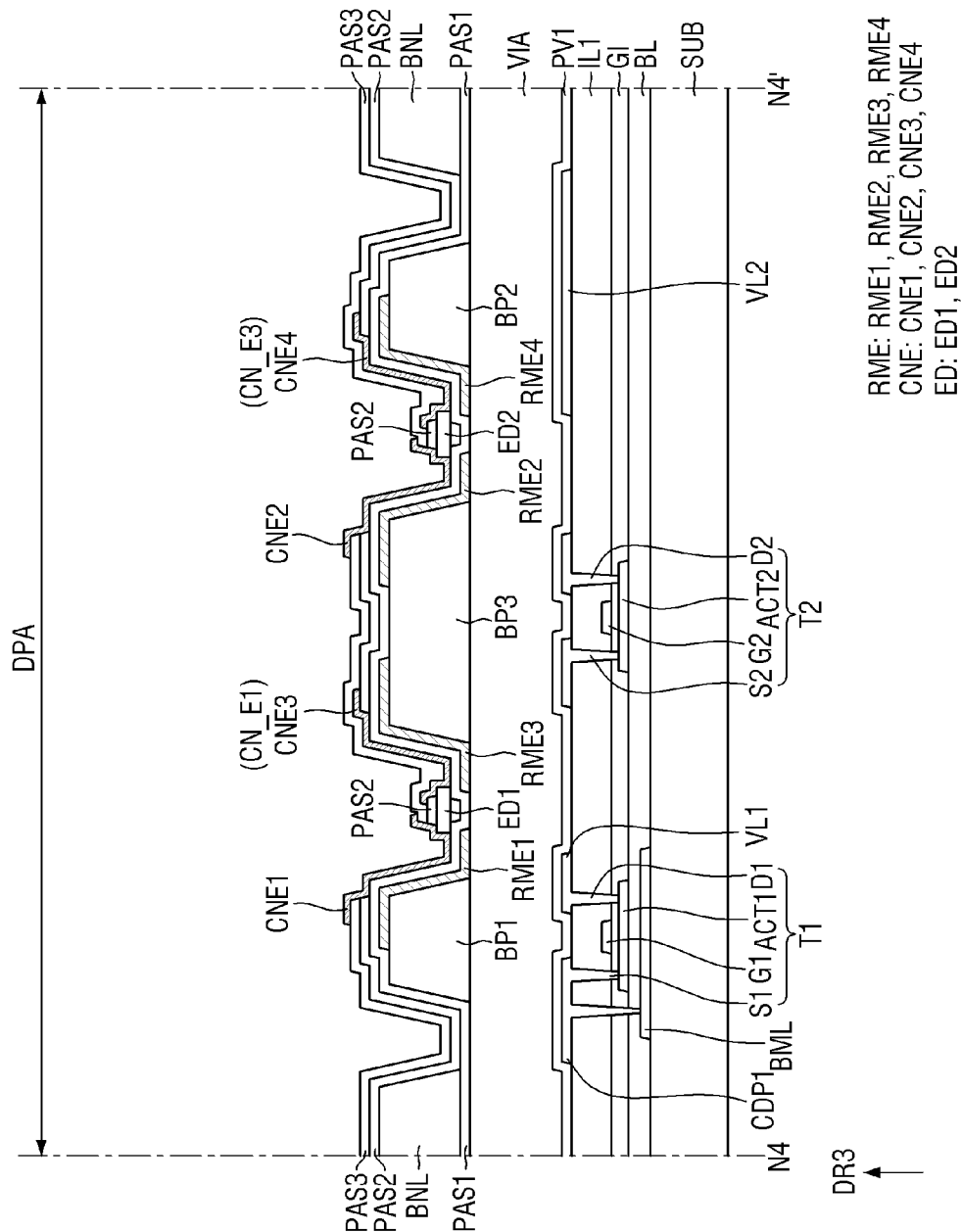
FIG. 22 is a schematic cross-sectional view taken along line N4-N4' of FIG. 21.
Figure 23:
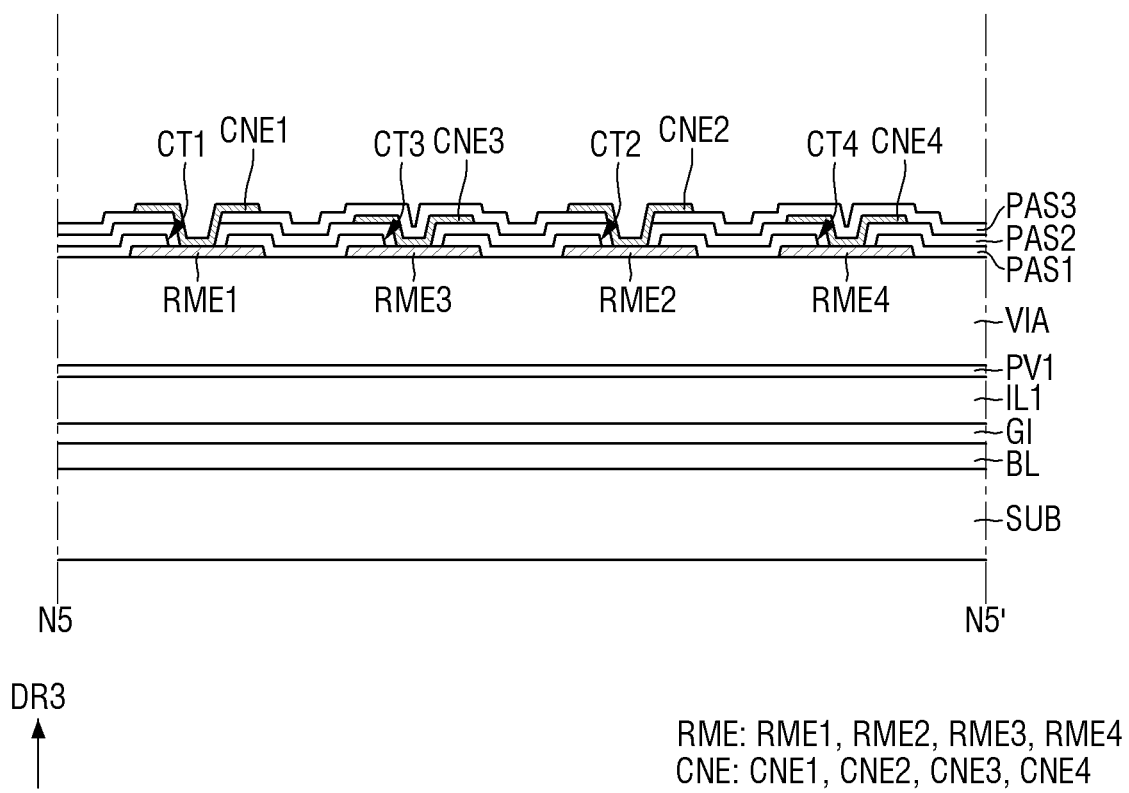
FIG. 23 is a schematic cross-sectional view taken along line N5-N5' of FIG. 21.

FIG. 21 is a schematic plan view illustrating a sub-pixel of a display device according to another embodiment. FIG. 22 is a schematic cross-sectional view taken along line N4-N4' of FIG. 21. FIG. 23 is a schematic cross-sectional view taken along line N5-N5' of FIG. 21. FIG. 21 illustrates a layout, in a plan view, of electrodes RME (e.g., RME1, RME2, RME3, and RME4), bank patterns BP1, BP2, and BP3, a bank layer BNL, light emitting elements ED, and connection electrodes CNE (e.g., CNE1, CNE2, CNE3, CNE4, and CNE5) disposed in a pixel PX of the display device 10. FIG. 22 illustrates a cross section crossing both ends of each of the light emitting elements ED (e.g., ED1, ED2, ED3, and ED4) disposed on different electrodes RME, and FIG. 23 illustrates a cross section crossing contact parts CT1, CT2, CT3, and CT4.

Referring to FIGS. 21 to 23, the display device 10 according to another embodiment includes a larger number of electrodes RME (e.g., RME1, RME2, RME3, and RME4), bank patterns BP1, BP2, and BP3, light emitting elements ED (e.g., ED1, ED2, ED3, and ED4), and connection electrodes CNE (e.g., CNE1, CNE2, CNE3, CNE4, and CNE5). The display device 10 according to the embodiment is different from the display device 10 according to an embodiment of FIG. 4 in that a larger number of electrodes and light emitting elements are included in each sub-pixel SPXn. Hereinafter, a description for contents overlapping those described above will be omitted, and contents different from those described above will be mainly described.

The bank patterns BP1, BP2, and BP3 may further include a third bank pattern BP3 disposed between the first bank pattern BP1 and the second bank pattern BP2. The first bank pattern BP1 may be disposed on the left side of the center of the emission area EMA, the second bank pattern BP2 may be disposed on the right side of the center of the emission area EMA, and the third bank pattern BP3 may be disposed at the center of the emission area EMA. A width of the third bank pattern BP3 measured in the second direction DR2 may be greater than that of the first bank pattern BP1 and the second bank pattern BP2. An interval between the respective bank patterns BP1, BP2, and BP3 spaced apart from each other in the second direction DR2 may be greater than an interval between the respective electrodes RME. The first bank pattern BP1 may be disposed to partially overlap a first electrode RME1, and the second bank pattern BP2 may be disposed to partially overlap a fourth electrode RME4. The third bank pattern BP3 may be disposed to partially overlap a second electrode RME2 and a third electrode RME3. The respective electrodes RME may be disposed such that at least portions thereof do not overlap the bank patterns BP1, BP2, and BP3.

The electrodes RME disposed for each sub-pixel SPXn may further include the third electrode RME3 and the fourth electrode RME4, in addition to the first electrode RME1 and the second electrode RME2.

The third electrode RME3 may be disposed between the first electrode RME1 and the second electrode RME2, and the fourth electrode RME4 may be disposed to be spaced from the third electrode RME3 in the second direction DR2 with the second electrode RME2 interposed therebetween. In the electrodes RME, the first electrode RME1, the third electrode RME3, the second electrode RME2, and the fourth electrode RME4 may be sequentially disposed from the left of the sub-pixel SPXn toward the right of the sub-pixel SPXn. The respective electrodes RME may be spaced apart from and face each other in the second direction DR2. The electrodes RME may be spaced apart from electrodes RME of another sub-pixel SPXn adjacent to the sub-pixel SPXn in the first direction DR1, in the separation part ROP of the sub-area SA.

The first electrode RME1 and the second electrode RME2 of the electrodes RME may contact the first conductive pattern CDP1 and the second voltage line VL2 through the electrode contact holes CTD and CTS disposed under the bank layer BNL, respectively, while the third electrode RME3 and the fourth electrode RME4 of the electrodes RME may not contact the first conductive pattern CDP1 and the second voltage line VL2.

The first insulating layer PAS1 may be disposed in a structure similar to that of the above-described embodiments. The first insulating layer PAS1 may be entirely disposed in the display area DPA and may cover the electrodes RME and the bank patterns BP1, BP2, and BP3.

The light emitting elements ED may be disposed between the bank patterns BP1, BP2, and BP3 or on different electrodes RME. Some of the light emitting elements ED may be disposed between the first bank pattern BP1 and the third bank pattern BP3, and the others of the light emitting elements ED may be disposed between the third bank pattern BP3 and the second bank pattern BP2. According to another embodiment, the light emitting elements ED may include first light emitting elements ED1 and third light emitting elements ED3 disposed between the first bank pattern BP1 and the third bank pattern BP3 and second light emitting elements ED2 and fourth light emitting elements ED4 disposed between the bank pattern BP3 and the second bank pattern BP2. The first light emitting elements ED1 and the third light emitting elements ED3 may be disposed on the first electrode RME1 and the third electrode RME3, respectively, and the second light emitting elements ED2 and the fourth light emitting elements ED4 may be disposed on the second electrode RME2 and the fourth electrode RME4, respectively. The first light emitting element ED1 and the second light emitting element ED2 may be disposed adjacent to a lower side in the emission area EMA of the corresponding sub-pixel SPXn or to the sub-area SA, and the third light emitting element ED3 and the fourth light emitting element ED4 may be disposed adjacent to an upper side in the emission area EMA of the corresponding sub-pixel SPXn.

However, the respective light emitting elements ED are not divided according to positions at which they are disposed in the emission area EMA, and may be divided according to connection relationships with connection electrodes CNE to be described below. The respective light emitting elements ED may contact different connection electrodes CNE at both ends of each of the light emitting elements ED according to layout structures of the connection electrodes CNE, and may be divided into different light emitting elements ED according to types of connection electrodes CNE which they contact.

The connection electrodes CNE may further include a third connection electrode CNE3, a fourth connection electrode CNE4, and a fifth connection electrode CNE5 disposed over the electrodes RME, in addition to the first connection electrode CNE1 disposed on the first electrode RME1 and the second connection electrode CNE2 disposed on the second electrode RME2.

Unlike the embodiments of FIGS. 4 to 6, each of the first connection electrode CNE1 and the second connection electrode CNE2 may have a relatively small length extending in the first direction DR1. The first connection electrode CNE1 and the second connection electrode CNE2 may be disposed on the lower side with respect to the center of the emission area EMA. The first connection electrode CNE1 and the second connection electrode CNE2 may be disposed over the emission area EMA and the sub-area SA of the corresponding sub-pixel SPXn, and may directly contact the electrodes RME through the contact parts CT1 and CT2 formed in the sub-area SA, respectively. The first connection electrode CNE1 may directly contact the first electrode RME1 through a first contact part CT1 penetrating through the first insulating layer PAS1, the second insulating layer PAS2, and the third insulating layer PAS3 in the sub-area SA, and the second connection electrode CNE2 may directly contact the second electrode RME2 through a second contact part CT2 penetrating through the first insulating layer PAS1, the second insulating layer PAS2, and the third insulating layer PAS3 in the sub-area SA.

The third connection electrode CNE3 may include a first extension part CN_E1 disposed on the third electrode RME3, a second extension part CN_E2 disposed on the first electrode RME1, and a first connection part CN_B1 connecting the first extension part CN_E1 and the second extension part CN_E2 to each other. The first extension part CN_E1 may be spaced apart from and face the first connection electrode CNE1 in the second direction DR2, and the second extension part CN_E2 may be spaced apart from the first connection electrode CNE1 in the first direction DR1. The first extension part CN_E1 may be disposed at a lower side of the emission area EMA of the corresponding sub-pixel SPXn, and the second extension part CN_E2 may be disposed at an upper side of the emission area EMA of the corresponding sub-pixel SPXn. The first extension part CN_E1 and the second extension part CN_E2 may be disposed in the emission area EMA. The first connection part CN_B1 may be disposed over the first electrode RME1 and the third electrode RME3 at a central portion of the emission area EMA. The third connection electrode CNE3 may generally extend in the first direction DR1, but may be bent in the second direction DR2 and extend again in the first direction DR1.

The fourth connection electrode CNE4 may include a third extension part CN_E3 disposed on the fourth electrode RME4, a fourth extension part CN_E4 disposed on the second electrode RME2, and a second connection part CN_B2 connecting the third extension part CN_E3 and the fourth extension part CN_E4 to each other. The third extension part CN_E3 may be spaced apart from and face the second connection electrode CNE2 in the second direction DR2, and the fourth extension part CN_E4 may be spaced apart from the second connection electrode CNE2 in the first direction DR1. The third extension part CN_E3 may be disposed at the lower side of the emission area EMA of the corresponding sub-pixel SPXn, and the fourth extension part CN_E4 may be disposed at the upper side of the emission area EMA of the corresponding sub-pixel SPXn. The third extension part CN_E3 and the fourth extension part CN_E4 may be disposed in the emission area EMA. The second connection part CN_B2 may be adjacent to the center of the emission area EMA and be disposed over the second electrode RME2 and the fourth electrode RME4. The fourth connection electrode CNE4 may generally extend in the first direction DR1, but may be bent in the second direction DR2 and extend again in the first direction DR1.

The fifth connection electrode CNE5 may include a fifth extension part CN_E5 disposed on the third electrode RME3, a sixth extension part CN_E6 disposed on the fourth electrode RME4, and a third connection part CN_B3 connecting the fifth extension part CN_E5 and the sixth extension part CN_E6 to each other. The fifth extension part CN_E5 may be spaced apart from and face the second extension part CN_E2 of the third connection electrode CNE3 in the second direction DR2, and the sixth extension part CN_E6 may be spaced apart from and face the fourth extension part CN_E4 of the fourth connection electrode CNE4 in the second direction DR2. Each of the fifth extension part CN_E5 and the sixth extension part CN_E6 may be disposed at the upper side of the emission area EMA, and the third connection part CN_B3 may be disposed over the third electrode RME3, the second electrode RME2, and the fourth electrodes RME4. The fifth connection electrode CNE5 may be disposed to surround the fourth extension part CN_E4 of the fourth connection electrode CNE4 in a plan view.

The third connection electrode CNE3 may directly contact the third electrode RME3 through a third contact part CT3 penetrating through the first insulating layer PAS1 and the second insulating layer PAS2 in the sub-area SA, and the fourth connection electrode CNE4 may directly contact the fourth electrode RME4 through a fourth contact part CT4 penetrating through the first insulating layer PAS1 and the second insulating layer PAS2 in the sub-area SA.

However, the disclosure is not limited thereto. In some embodiments, in the display device 10, some of the connection electrodes CNE may be directly electrically connected to the third conductive layer. For example, each of the first connection electrode CNE1 and the second connection electrode CNE2, which are first-type connection electrodes, may be directly electrically connected to the third conductive layer, and may not be electrically connected to the electrode RME. A second-type connection electrode and a third-type connection electrode are not electrically connected to the electrode RME, and may be electrically connected only to the light emitting elements ED.

The first connection electrode CNE1 and the second connection electrode CNE2 may be the first-type connection electrodes electrically connected to the electrodes RME1 and RME2 that are directly electrically connected to the third conductive layer, respectively, the third connection electrode CNE3 and the fourth connection electrode CNE4 may be the second-type connection electrodes electrically connected to the electrodes RME3 and RME4 that are not electrically connected to the third conductive layer, and the fifth connection electrode CNE5 may be the third-type connection electrode that is not electrically connected to the electrode RME. The fifth connection electrode CNE5 is not electrically connected to the electrode RME, and may contact the light emitting elements ED and may form an electrical connection circuit of the light emitting elements ED together with the other connection electrodes CNE.

The third connection electrode CNE3 and the fourth connection electrode CNE4, which are the second-type connection electrodes, may be connection electrodes of which electrode extension parts extending in the first direction DR1 are not side by side with each other in the second direction DR2, and the fifth connection electrode CNE5, which is the third-type connection electrode, may be a connection electrode of which electrode extension parts extending in the first direction DR1 are side by side with each other in the second direction DR2. The third connection electrode CNE3 and the fourth connection electrode CNE4 may extend in the first direction DR1, but are bent, and the fifth connection electrode CNE5 may surround portions of the other connection electrodes.

The light emitting elements ED may be divided into different light emitting elements ED according to the connection electrodes CNE which both ends of the light emitting elements ED contact in response to the layout structure of the connection electrodes CNE. The first light emitting element ED1 and the second light emitting element ED2 may have first ends contacting the first-type connection electrodes and second ends contacting the second-type connection electrodes. The first light emitting element ED1 may contact the first connection electrode CNE1 and the third connection electrode CNE3, and the second light emitting element ED2 may contact the second connection electrode CNE2 and the fourth connection electrode CNE4. The third light emitting element ED3 and the fourth light emitting element ED4 may have first ends contacting the second-type connection electrodes and second ends contacting the third-type connection electrodes. The third light emitting element ED3 may contact the third connection electrode CNE3 and the fifth connection electrode CNE5, and the fourth light emitting element ED4 may contact the fourth connection electrode CNE4 and the fifth connection electrode CNE5.

The light emitting elements ED may be electrically connected to each other in series through the connection electrodes CNE. The display device 10 according to the embodiment may include a larger number of light emitting elements ED for each sub-pixel SPXn, and the light emitting elements may be electrically connected in series, such that an amount of light emitted per unit area may be further increased.

Figure 24:
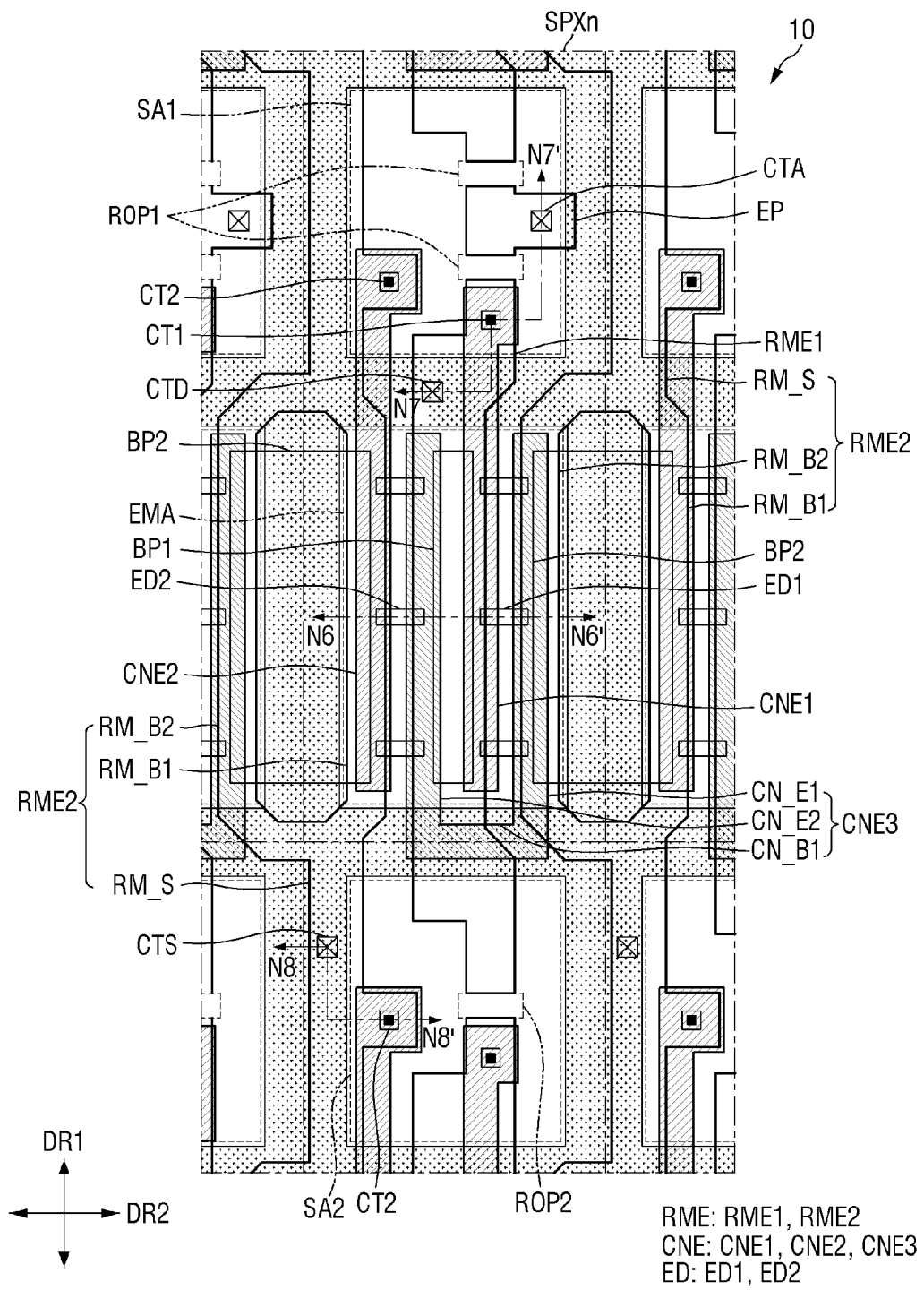
FIG. 24 is a schematic plan view illustrating one sub-pixel of a display device according to another embodiment.
Figure 25:
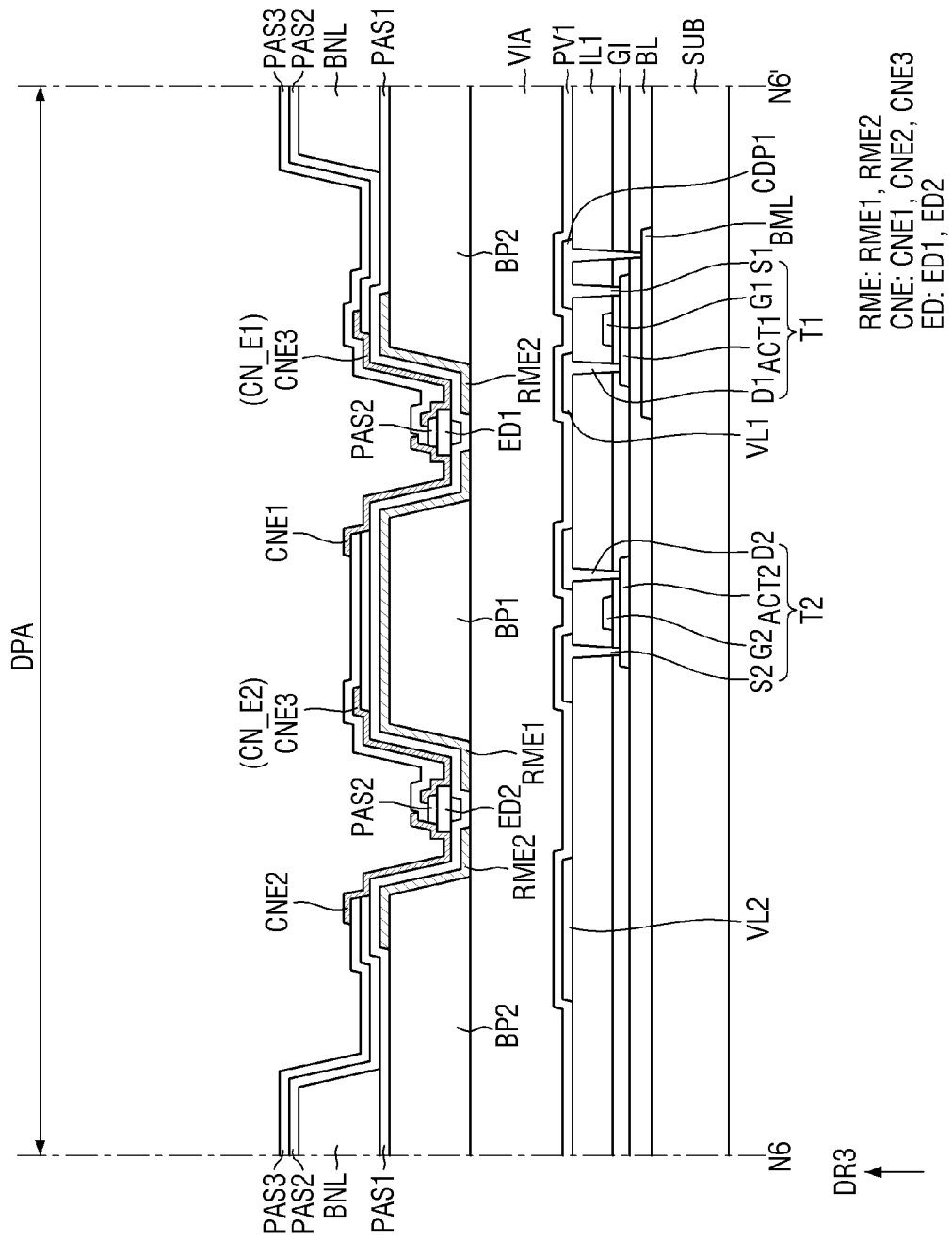
FIG. 25 is a schematic cross-sectional view taken along line N6-N6' of FIG. 24.
Figure 26:
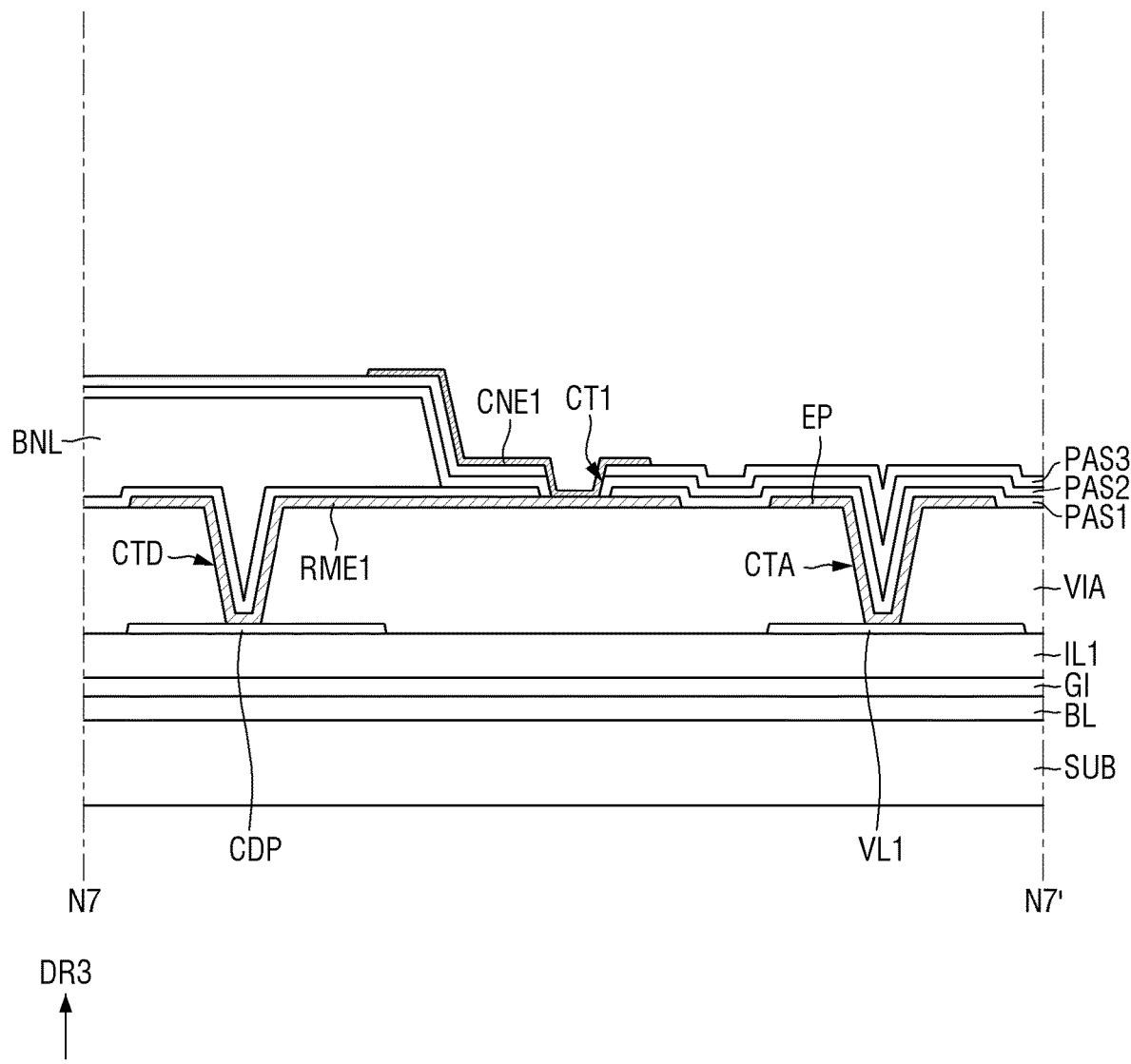
FIG. 26 is a schematic cross-sectional view taken along line N7-N7' of FIG. 24.
Figure 27:
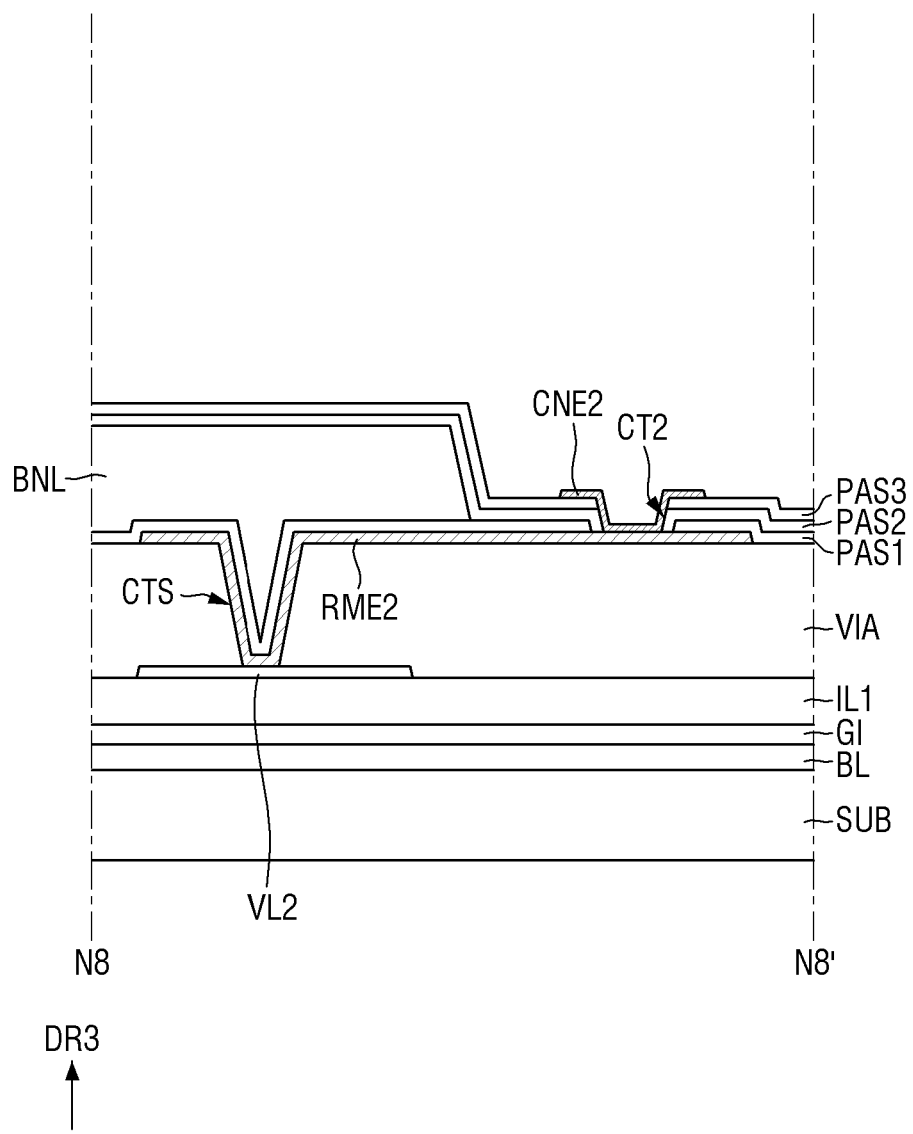
FIG. 27 is a schematic cross-sectional view taken along line N8-N8' of FIG. 24.

FIG. 24 is a schematic plan view illustrating a sub-pixel of a display device according to another embodiment. FIG. 25 is a schematic cross-sectional view taken along line N6-N6' of FIG. 24. FIG. 26 is a schematic cross-sectional view taken along line N7-N7' of FIG. 24. FIG. 27 is a schematic cross-sectional view taken along line N8-N8' of FIG. 24.

FIG. 24 illustrates a layout, in a plan view, of electrodes RME (e.g., RME1 and RME2), bank patterns BP1 and BP2, a bank layer BNL, light emitting elements ED, and connection electrodes CNE (e.g., CNE1, CNE2, and CNE3) disposed in a pixel PX of the display device 10. FIG. 25 illustrates a cross section crossing both ends of each of the light emitting elements ED (e.g., ED1 and ED2) disposed on different electrodes RME. FIGS. 26 and 27 illustrate cross sections crossing electrode contact holes CTD, CTS, and CTA and contact parts CT1 and CT2.

Referring to FIGS. 24 to 27, the display device 10 according to another embodiment may be different from the display devices 10 according to the above-described embodiments in structures of the electrodes RME, the connection electrodes CNE, and the bank patterns BP1 and BP2. Hereinafter, a description for contents overlapping those of above-described embodiments will be omitted, and contents different from those of above-described embodiments will be mainly described.

The bank patterns BP1 and BP2 may extend in the first direction DR1, but widths of the bank patterns BP1 and BP2 measured in the second direction DR2 may be different from each other, and any of the bank patterns BP1 and BP2 may be disposed over the sub-pixels SPXn adjacent to each other in the second direction DR2. For example, the bank patterns BP1 and BP2 may include a first bank pattern BP1 disposed in the emission area EMA of each sub-pixel SPXn and a second bank pattern BP2 disposed over the emission areas EMA of different sub-pixels SPXn.

The first bank pattern BP1 is disposed at a central portion of the emission area EMA, and the second bank patterns BP2 are disposed to be spaced apart from the first bank pattern BP1 with the first bank pattern BP1 therebetween. The first bank patterns BP1 and the second bank patterns BP2 may be alternately disposed in the second direction DR2. The light emitting elements ED may be disposed between the first bank pattern BP1 and the second bank pattern BP2 spaced apart from each other.

The first bank pattern BP1 and the second bank pattern BP2 may have a same length in the first direction DR1, but may have different widths measured in the second direction DR2. A portion of the bank layer BNL extending in the first direction DR1 may overlap the second bank pattern BP2 in the thickness direction. The first bank pattern BP1 may be disposed to overlap a first electrode RME1, and the second bank pattern BP2 may be disposed to overlap electrode branch parts RM_B1 and RM_B2 of a second electrode RME2 and the bank layer BNL.

The first bank pattern BP1 and the second bank pattern BP2 may have a same length in the first direction DR1, but may have different widths measured in the second direction DR2. A portion of the bank layer BNL extending in the first direction DR1 may overlap the second bank pattern BP2 in the thickness direction. The bank patterns BP1 and BP2 may be disposed in island-shaped patterns in the entirety of the display area DPA.

The electrodes RME include the first electrode RME1 disposed at a central portion of each sub-pixel SPXn and the second electrodes RME2 disposed over different sub-pixels SPXn. The first electrode RME1 and the second electrode RME2 may generally extend in the first direction DR1, but portions of the first electrode RME1 and the second electrode RME2 disposed in the emission area EMA may have different shapes.

The first electrode RME1 may be disposed at the center of the sub-pixel SPXn, and a portion of the first electrode RME1 disposed in the emission area EMA may be disposed on the first bank pattern BP1. The first electrode RME1 may extend from the sub-area SA in the first direction DR1 and extend up to the sub-area SA of another sub-pixel SPXn. The first electrode RME1 may have a width measured in the second direction DR2 and varying depending on positions thereof, and at least a portion of the first electrode RME1 overlapping the first bank pattern BP1 in the emission area EMA may have a width greater than that of the first bank pattern BP1.

The second electrode RME2 may include a portion extending in the first direction DR1 and portions branched in the vicinity of the emission area EMA. In another embodiment, the second electrode RME2 may include an electrode stem part RM_S extending in the first direction DR1 and electrode branch parts RM_B1 and RM_B2 branched from the electrode stem part RM_S, bent in the second direction DR2, and then extending again in the first direction DR1. The electrode stem part RM_S may be disposed to overlap a portion of the bank layer BNL extending in the first direction DR1, and may be disposed on a side of the sub-area SA in the second direction DR2. The electrode branch parts RM_B1 and RM_B2 may be branched from the electrode stem part RM_S disposed to overlap a portion of the bank layer BNL extending in the first direction DR1, and may be bent to both sides in the second direction DR2, respectively. The electrode branch parts RM_B1 and RM_B2 may be disposed to cross the emission area EMA in the first direction DR1, may be bent again, and may be then integrated with the electrode stem part RM_S to be connected to each other (or to be integral with each other). For example, the electrode branch parts RM_B1 and RM_B2 of the second electrode RME2 may be branched on the upper side of the emission area EMA of any sub-pixel SPXn, and then connected to each other (or integral with each other) again on the lower side of the emission area EMA.

The second electrode RME2 may include a first electrode branch part RM_B1 disposed on the left side of the first electrode RME1 and a second electrode branch part RM_B2 disposed on the right side of the first electrode RME1. The electrode branch parts RM_B1 and RM_B2 included in a second electrode RME2 may be disposed in the emission areas EMA of the sub-pixels SPXn adjacent to each other in the second direction DR2, respectively, and the electrode branch parts RM_B1 and RM_B2 of different second electrodes RME2 may be disposed in a sub-pixel SPXn. The first electrode branch part RM_B1 of a second electrode RME2 may be disposed on the left side of the first electrode RME1, and the second electrode branch part RM_B2 of another second electrode RME2 may be disposed on the right side of the first electrode RME1.

The respective electrode branch parts RM_B1 and RM_B2 of the second electrodes RME2 may overlap one sides (or first sides) of the second bank patterns BP2. The first electrode branch part RM_B1 may partially overlap the second bank pattern BP2 disposed on the left side of the first bank pattern BP1, and the second electrode branch part RM_B2 may partially overlap the second bank pattern BP2 disposed on the right side of the first bank pattern BP1. Both sides of the first electrode RME1 may be spaced apart from and face different electrode branch parts RM_B1 and RM_B2 of different second electrodes RME2, and an interval between the first electrode RME1 and the respective electrode branch parts RM_B1 and RM_B2 may be smaller than an interval between different bank patterns BP1 and BP2.

A width of the first electrode RME1 measured in the second direction DR2 may be greater than those of the electrode stem part RM_S and the electrode branch parts RM_B1 and RM_B2 of the second electrode RME2. The first electrode RME1 has a width greater than that of the first bank pattern BP1 and overlaps both sides of the first bank pattern BP1, while the second electrodes RME2 are formed to have a relatively small width, such that the electrode branch parts RM_B1 and RM_B2 may overlap only one sides (or first sides) of the second bank patterns BP2.

The first electrode RME1 may contact the first conductive pattern CDP1 of the third conductive layer through a first electrode contact hole CTD at a portion thereof overlapping a portion of the bank layer BNL extending in the second direction DR2. The second electrode RME2 may also contact the second voltage line VL2 of the third conductive layer through a second electrode contact hole CTS at the electrode stem part RM_S. The first electrode RME1 may be disposed to overlap a first contact part CT1 at a portion thereof disposed in the sub-area SA, and the second electrode RME2 may include a portion protruding from the electrode stem part RM_S in the second direction DR2 to be disposed in the sub-area SA and overlap a second contact part CT2 at the protruding portion.

The first electrode RME1 may be disposed up to separation parts ROP1 and ROP2 of the sub-areas SA, while the second electrodes RME2 may not be separated in the sub-area SA. A second electrode RME2 may include electrode stem parts RM_S and electrode branch parts RM_B1 and RM_B2 to extend in the first direction DR1 and may be branched in the vicinity of the emission area EMA of each sub-pixel SPXn. The first electrode RME1 may be disposed between the separation parts ROP1 and ROP2 disposed in different sub-areas SA1 and SA2 of each sub-pixel SPXn, and may be disposed to cross the emission area EMA.

According to an embodiment, the display device 10 may include a line connection electrode EP disposed in a first sub-area SA1 of sub-areas SA1 and SA2 of each sub-pixel SPXn to be disposed between the first electrodes RME1 of different sub-pixels SPXn. The line connection electrode EP is not disposed in the second sub-area SA2 of the sub-pixel SPXn, and the first electrodes RME1 of the different sub-pixels SPXn adjacent to each other in the first direction DR1 may be spaced apart from each other. In the sub-pixel SPXn illustrated in FIG. 24 among the sub-pixels SPXn, the first sub-area SA1 in which the line connection electrode EP is disposed may be disposed on the upper side of the emission area EMA, and the second sub-area SA2 may be disposed on the lower side of the emission area EMA. On the other hand, in a sub-pixel SPXn adjacent to the sub-pixel SPXn of FIG. 24 in the first direction DR1, the first sub-area SA1 in which the line connection electrode EP is disposed may be disposed on the lower side of the emission area EMA, and the second sub-area SA2 may be disposed on the upper side of the emission area EMA.

The first electrode RME1 may be spaced apart from the line connection electrode EP with the first separation part ROP1 interposed therebetween in the first sub-area SA1. Two first separation parts ROP1 may be disposed in a first sub-area SA1, and the line connection electrode EP may be spaced apart from the first electrode RME1 disposed in the corresponding sub-pixel SPXn with a lower first separation part ROP1 interposed therebetween and be spaced apart from the first electrode RME1 disposed in another sub-pixel SPXn with an upper first separation part ROP1 interposed therebetween. A second separation part ROP2 may be disposed in the second sub-area SA2, and different first electrodes RME1 may be spaced apart from each other in the first direction DR1.

In an embodiment, the line connection electrode EP may be electrically connected to the first voltage line VL1 of the third conductive layer through a third electrode contact hole CTA penetrating through the via layer VIA. The first electrode RME1 may be formed in a state in which it is electrically connected to the line connection electrode EP, and an electrical signal to align the light emitting elements ED may be applied from the first voltage line VL1 to the first electrode RME1 through the line connection electrode EP. In a process of aligning the light emitting element ED, signals may be applied to the first voltage line VL1 and the second voltage line VL2 and may be transferred to the first electrode RME1 and the second electrode RME2, respectively.

A second electrode contact hole CTS may have a relative disposition different from that of a third electrode contact hole CTA to be described below. The second electrode contact hole CTS may be disposed in a portion of the bank layer BNL surrounding the second sub-area SA2, and the third electrode contact hole CTA may be disposed in the first sub-area SA1. The second electrode contact hole CTS and the third electrode contact hole CTA expose upper surfaces of different voltage lines VL1 and VL2, respectively, and accordingly, positions of the second electrode contact hole CTS and the third electrode contact hole CTA may be determined.

The bank layer BNL may surround the emission area EMA and the sub-areas SA1 and SA2, similar to the above-described embodiment. However, in an embodiment in which the display device 10 includes the sub-areas SA1 and SA2 divided from each other, areas surrounded by the bank layer BNL may be divided from each other. The bank layer BNL is the same as that of the above-described embodiment except that it surrounds different sub-areas SA1 and SA2.

The light emitting elements ED may be disposed on different electrodes RME between different bank patterns BP1 and BP2. The light emitting elements ED may include first light emitting elements ED1 each having both ends disposed on the first electrode RME1 and the second electrode branch part RM_B2 of the second electrode RME2, respectively, and second light emitting elements ED2 each having both ends disposed on the first electrode RME1 and the first electrode branch part RM_B1 of the other second electrode RME2. The first light emitting elements ED1 may be disposed on the right side with respect to the first electrode RME1, and the second light emitting elements ED2 may be disposed on the left side with respect to the first electrode RME1. The first light emitting elements ED1 may be disposed on the first electrode RME1 and the second electrode RME2, and the second light emitting elements ED2 may be disposed on the first electrode RME1 and the second electrode RME2.

The connection electrodes CNE (e.g., CNE1, CNE2, and CNE3) may include a first connection electrode CNE1, a second connection electrode CNE2, and a third connection electrode CNE3.

The first connection electrode CNE1 may extend in the first direction DR1 and may be disposed on the first electrode RME1. A portion of the first connection electrode CNE1 disposed on the first bank pattern BP1 may overlap the first electrode RME1 and extend in the first direction DR1 to be disposed up to the first sub-area SA1 positioned on the upper side of the emission area EMA beyond the bank layer BNL. The first connection electrode CNE1 may contact the first electrode RME1 through the first contact part CT1 in the first sub-area SA1.

The second connection electrode CNE2 may extend in the first direction DR1 and may be disposed on the second electrode RME2. A portion of the second connection electrode CNE2 disposed on the second bank pattern BP2 may overlap the second electrode RME2 and extend in the first direction DR1 to be disposed up to the first sub-area SA1 positioned on the upper side of the emission area EMA beyond the bank layer BNL. The second connection electrode CNE2 may contact the second electrode RME2 through the second contact part CT2 in the first sub-area SA1.

In a sub-pixel SPXn adjacent to the sub-pixel SPXn of FIG. 24 in the first direction DR1, the first connection electrode CNE1 and the second connection electrode CNE2 may contact the first electrode RME1 and the second electrode RME2 through the contact parts CT1 and CT2 disposed in the second sub-area SA2, respectively.

The third connection electrode CNE3 may include extension parts CN_E1 and CN_E2 extending in the first direction DR1 and a first connection part CN_B1 connecting the extension parts CN_E1 and CN_E2 to each other. The first extension part CN_E1 faces the first connection electrode CNE1 in the emission area EMA and is disposed on the second electrode branch part RM_B2 of the second electrode RME2, and the second extension part CN_E2 faces the second connection electrode CNE2 in the emission area EMA and is disposed on the first electrode RME1. The first connection part CN_B1 may extend in the second direction DR2 on the bank layer BNL disposed on the lower side of the emission area EMA to connect the first extension part CN_E1 and the second extension part CN_E2 to each other. The third connection electrode CNE3 may be disposed in the emission area EMA and on the bank layer BNL, and may not be directly connected to the electrode RME. The second electrode branch part RM_B2 disposed under the first extension part CN_E1 may be electrically connected to the second voltage line VL2, but a second source voltage applied to the second electrode branch part RM_B2 may not be transferred to the third connection electrode CNE3.

Unlike an embodiment of FIG. 15, in the display device 10, layouts of the color control structures TPL, WCL1, and WCL2 and the color filter layers CFL1, CFL2, and CLF3 disposed on the first substrate SUB may be variously modified.

Figure 28:
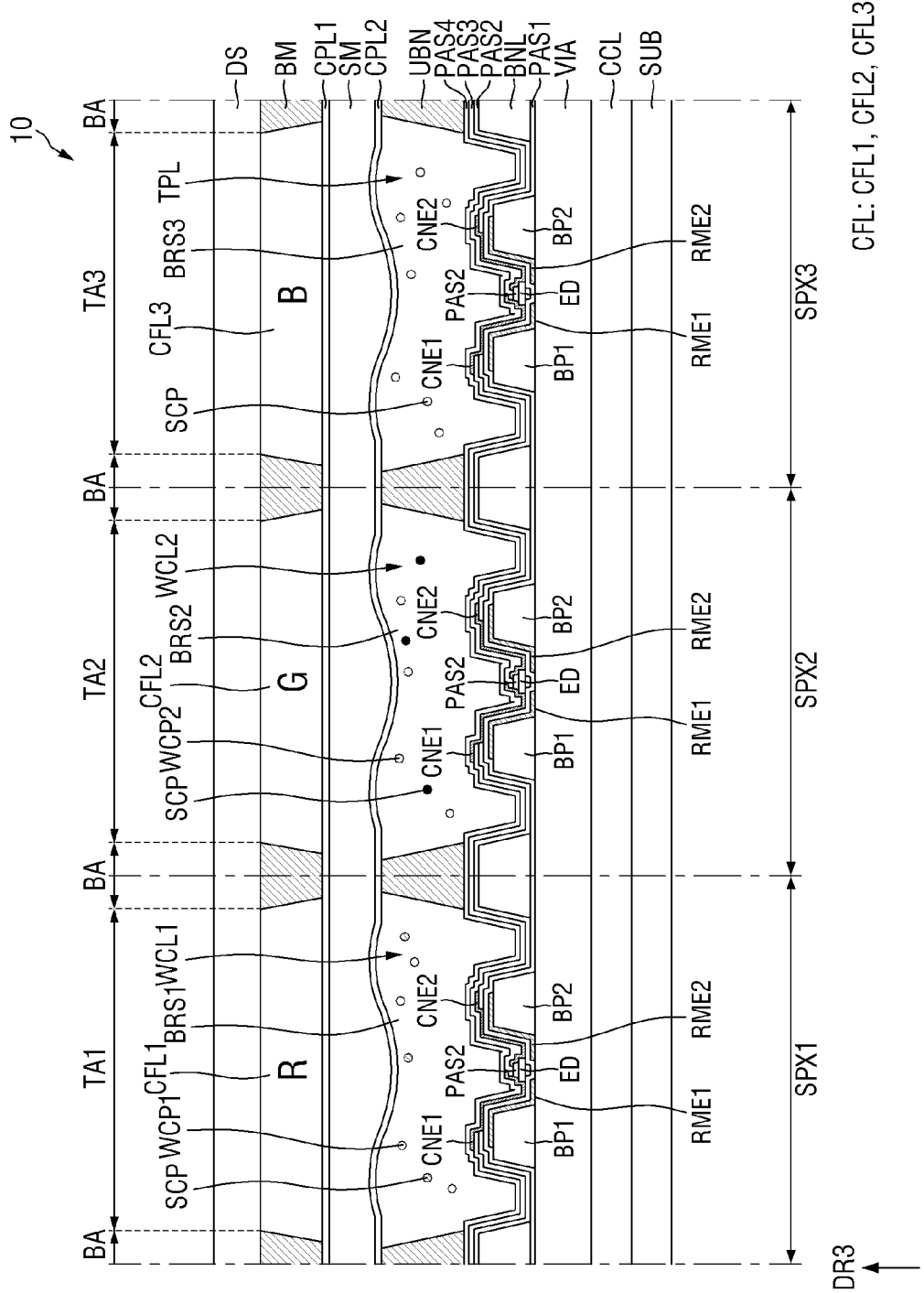
FIGS. 28 to 30 are schematic cross-sectional views of display devices according to other embodiments.
Figure 29:
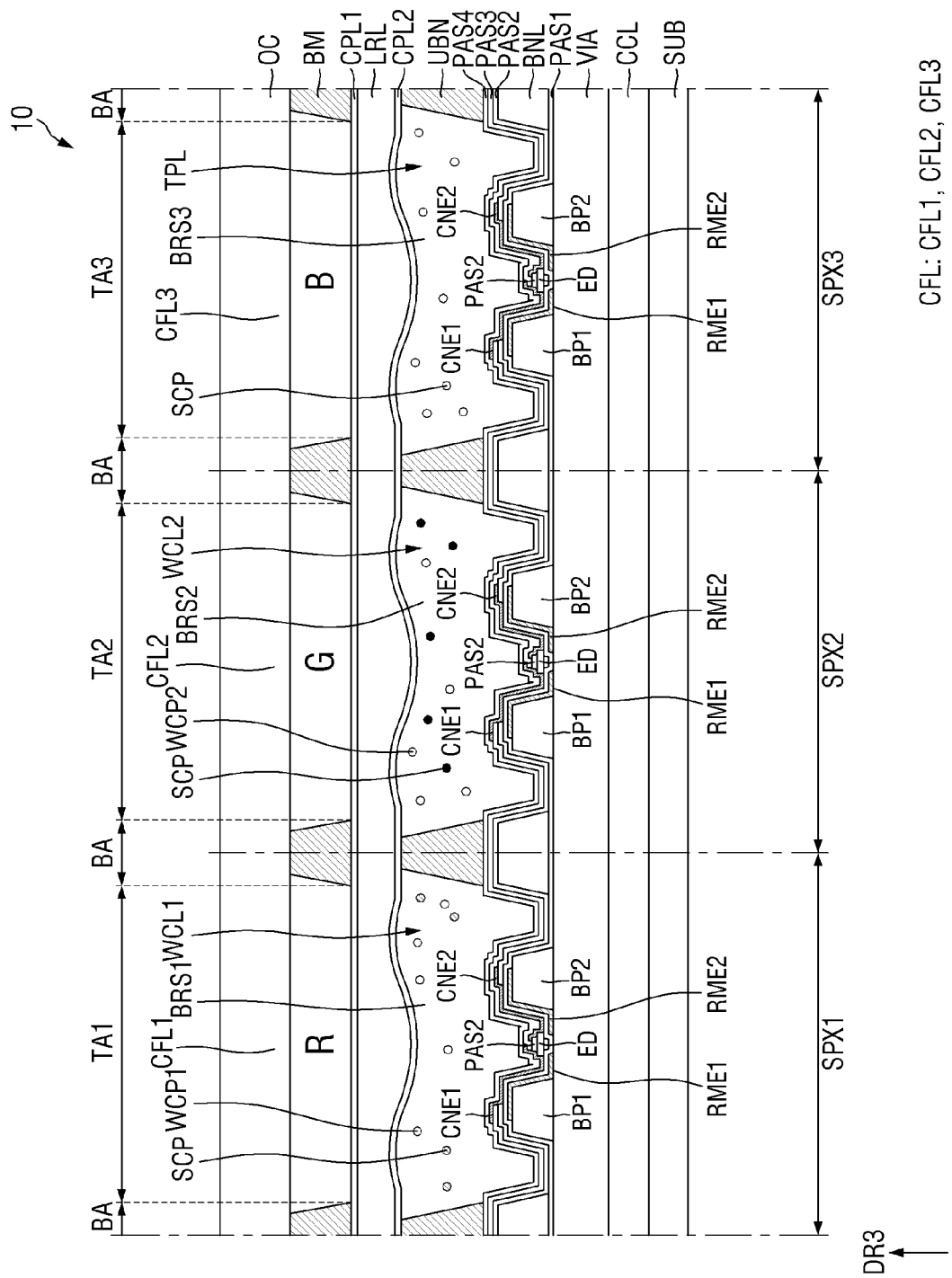
Figure 30:
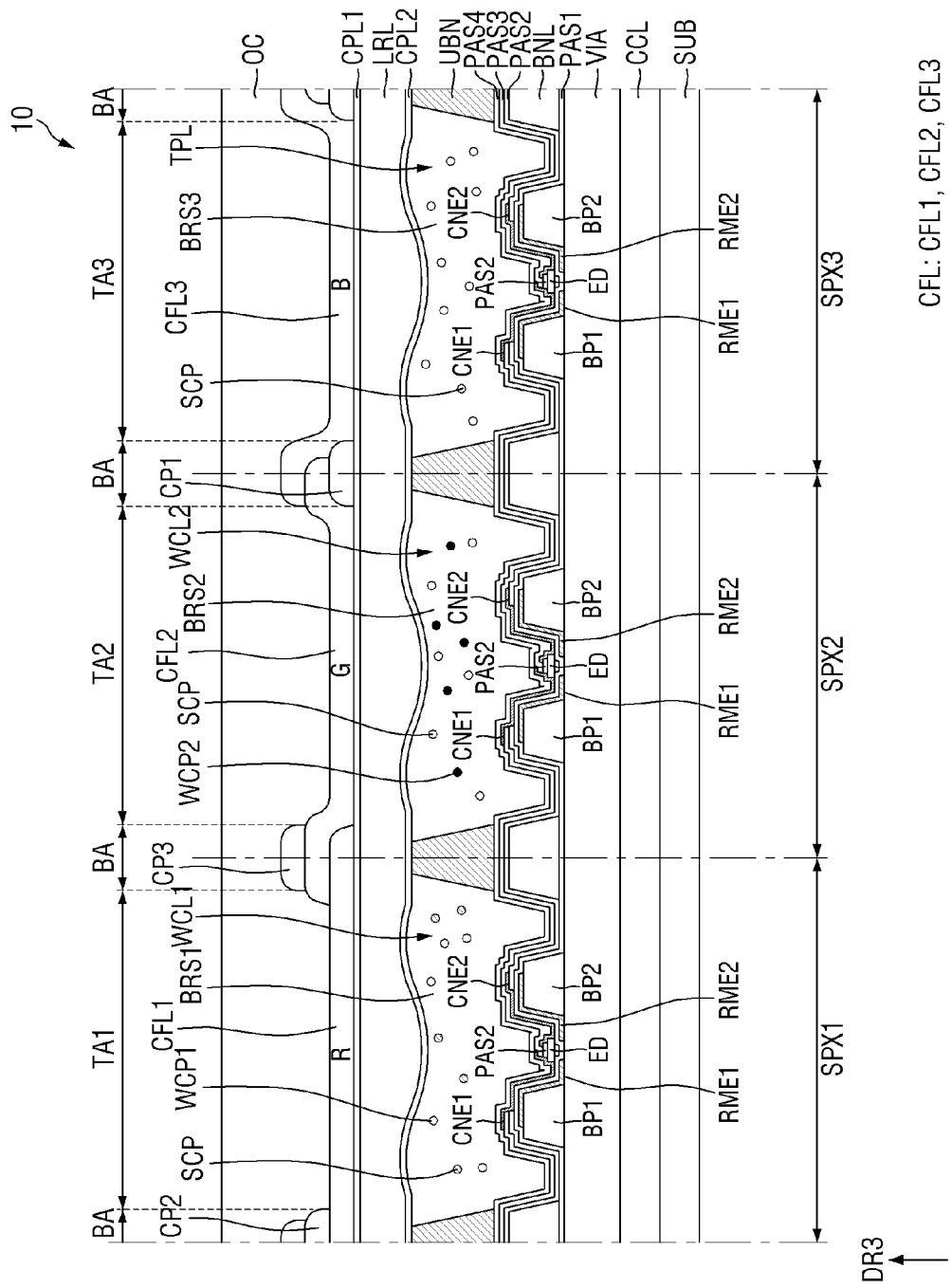

FIGS. 28 to 30 are schematic cross-sectional views of display devices according to other embodiments.

Referring to FIG. 28, in a display device 10, the color control structures TPL, WCL1, and WCL2 and the upper bank layer UBN may be formed on the first substrate SUB, and the color filter layers CFL1, CFL2, and CFL3 may be formed on the second substrate DS. The embodiment is different from an embodiment of FIG. 15 in a layout of the color control structures TPL, WCL1, and WCL2.

A fourth insulating layer PAS4 may be further disposed on the third insulating layer PASS3 the connection electrodes CNE1 and CNE2, and the bank layer BNL. The fourth insulating layer PAS4 may protect all layers disposed on the first substrate SUB, similar to the first encapsulation layer EN1 in an embodiment of FIG. 15. However, the fourth insulating layer PAS4 may be omitted.

The upper bank layer UBN is disposed directly on the fourth insulating layer PAS4 and overlaps the bank layer BNL in the thickness direction. The upper bank layer UBN may be disposed to surround at least the emission areas EMA, and the color control structures TPL, WCL1, and WCL2 may be disposed to correspond to the emission areas EMA. As another example, the color control structures TPL, WCL1, and WCL2 may be formed in linear patterns and may be disposed over the emission areas EMA.

The color control structures TPL, WCL1, and WCL2 may be directly disposed on the fourth insulating layer PAS4. In the display device 10, the light emitting elements ED emitting the light and the color control structures TPL, WCL1, and WCL2 may be continuously disposed on a first substrate SUB. The upper bank layer UBN may have a predetermined height and be disposed to surround areas in which the light emitting elements ED are disposed, and the base resins BRS1, BRS2, and BRS3 of the color control structures TPL, WCL1 and WCL2 may be directly disposed on the fourth insulating layer PAS4 in the areas surrounded by the upper bank layer UBN. The scatterers SCP and the wavelength conversion materials WCP1 and WCP2 of the color control structures TPL, WCL1, and WCL2 may be positioned around the light emitting element ED in the respective base resins BRS1, BRS2, and BRS3.

The second capping layer CPL2 is disposed on the upper bank layer UBN and the color control structures TPL, WCL1, and WCL2. After a process of forming a circuit layer CCL and a process of forming the light emitting elements ED and the electrodes RME are performed on the first substrate SUB, a process of forming the color control structures TPL, WCL1, and WCL2 may also be performed on the first substrate SUB. The color filter layers CFL1, CFL2, and CFL3, the light blocking member BM, and the first capping layer CPL1 may be disposed on a surface of the second substrate DS, and the second substrate DS may be bonded to the first substrate SUB on which the color control structure TPL, WCL1, and WCL2 are formed, by the sealing member SM. In the embodiment, an interval between the light emitting element ED and the color control structures TPL, WCL1, and WCL2 becomes narrower, and thus, color conversion efficiency increases. The color control structures TPL, WCL1, and WCL2 are directly disposed on the fourth insulating layer PAS4, and thus, the encapsulation layer EN may be omitted.

Referring to FIG. 29, in a display device 10, the light emitting elements ED may be disposed on the first substrate SUB, and the color control structures TPL, WCL1, and WCL2 and the color filter layers CFL1, CFL2, and CFL3 may be sequentially disposed on the light emitting elements ED. The embodiment is different from an embodiment of FIG. 28 in that all layers may be formed on the first substrate SUB without preparing a separate second substrate DS and the second substrate DS and the sealing member SM are omitted.

A low refractive index layer LRL may be disposed on the color control structures TPL, WCL1, and WCL2 and the upper bank layer UBN, and the first capping layer CPL1, the color filter layers CFL1, CFL2, and CFL3, the light blocking member BM, and an overcoat layer OC may be disposed on the low refractive index layer LRL.

The low refractive index layer LRL is an optical layer recycling light passing through the color control structures TPL, WCL1, and WCL2, and may improve light emission efficiency and color purity of the display device 10. The low refractive index layer LRL may be made of an organic material having a low refractive index, and may compensate for a step formed by the color control structures TPL, WCL1 and WCL2 and the upper bank layer UBN.

A description for the first capping layer CPL1, the color filter layers CFL1, CFL2, and CFL3, and the light blocking member BM is substantially the same as that described above except for positions where the first capping layer CPL1, the color filter layers CFL1, CFL2, and CFL3, and the light blocking member BM are disposed.

The first capping layer CPL1 may be disposed on the low refractive index layer LRL and may prevent impurities such as moisture or air from permeating from the outside to damage or contaminate the low refractive index layer LRL. The light blocking member BM is disposed on the first capping layer CPL1 so as to overlap the upper bank layer UBN. The light blocking member BM may be formed in a lattice-shaped pattern partially exposing a surface of the first capping layer CPL1. The color filter layers CFL1, CFL2, and CFL3 may be disposed on the first capping layer CPL1 so as to correspond to areas opened by the light blocking member BM.

The overcoat layer OC may be disposed on the color filter layer CFL and the light blocking member BM. The overcoat layer OC may be disposed over the entirety of the display area DPA, and a portion of the overcoat layer OC may also be disposed in the non-display area NDA. The overcoat layer OC may include an organic insulating material to protect members disposed in the display area DPA from the outside.

Referring to FIG. 30, in a display device 10, the light blocking member BM may be omitted, and color patterns CP1, CP2, and CP3 may be disposed. The embodiment is different from an embodiment of FIG. 29 in that the light blocking member BM is replaced with the color patterns CP1, CP2, and CP3.

The color patterns CP1, CP2, and CP3 and the light blocking member BM of FIG. 29 may be formed in substantially a same lattice-shaped pattern. However, the color patterns CP1, CP2, and CP3 and the color filter layers CFL1, CFL2, and CFL3 may include a same material and may be formed integrally with (or may be integral with) each other. Different color patterns CP1, CP2, and CP3 may be stacked and disposed in the light-blocking areas BA, and transmission of light may be blocked in the areas in which the different color patterns CP1, CP2, and CP3 are stacked.

A first color pattern CP1 and the first color filter layer CFL1 may include a same material, and the first color pattern CP1 may be disposed in the light-blocking area BA. The first color pattern CP1 may be directly disposed on the first capping layer CPL1 in the light-blocking area BA and may be integrated with the first color filter layer CFL1 in the light-blocking area BA adjacent to the first light-transmitting area TA1 of the first sub-pixel SPX1.

A second color pattern CP2 and the second color filter layer CFL2 may include a same material, and the second color pattern CP2 may be disposed in the light-blocking area BA. The second color pattern CP2 may be directly disposed on the first color pattern CP1 in the light-blocking area BA, and may be integrated with the second color filter layer CFL2 in the light-blocking area BA adjacent to the second light-transmitting area TA2 of the second sub-pixel SPX2. Similarly, a third color pattern CP3 and the third color filter layer CFL3 may include a same material, and the third color pattern CP3 may be disposed in the light-blocking area BA. The third color pattern CP3 may be directly disposed on the second color pattern CP2 in the light-blocking area BA, and may be integrated with the third color filter layer CFL3 in the light-blocking area BA adjacent to the third light-transmitting area TA3 of the third sub-pixel SPX3.

The display device 10 according to the embodiment has a structure in which the color patterns CP1, CP2, and CP3 are stacked, and the color patterns CP1, CP2, and CP3 and the light blocking member BM may have a same role or function, and thus, color mixing between neighboring areas due to materials having different colorants may be prevented. The color patterns CP1, CP2, and CP3 and the color filter layers CFL1, CFL2, and CFL3 include a same material, and thus, external light or reflected light transmitted through the light-blocking areas BA may have a wavelength band of a specific color. An eye color sensibility perceived by user's eyes is different depending on a color of light. In particular, light of a blue wavelength band may be perceived less sensitively by a user than light of a green wavelength band and light of a red wavelength band. Since the light blocking member BM is omitted in the light-blocking areas BA and the color patterns CP1, CP2, and CP3 are disposed in the light-blocking areas BA, transmission of light may be blocked and at the same time, the user may perceive the reflected light relatively less sensitively, and reflected light due to external light may be reduced by absorbing some of light flowing inside from the outside of the display device 10.

In concluding the detailed description, those skilled in the art will appreciate that many variations and modifications can be made to the embodiments without substantially departing from the principles of the disclosure. Therefore, the disclosed embodiments of the disclosure are used in a generic and descriptive sense only and not for purposes of limitation.

What is claimed is:

1. A display device comprising:
    a display area in which a plurality of pixels are arranged in a first direction and a second direction;
    a pad area disposed on a side of the display area in the first direction;
    a first electrode and a second electrode extending in the first direction in the display area and spaced apart from each other in the second direction;
    light emitting elements disposed on the first electrode and the second electrode in the display area;
    pad lines extending in the first direction in the pad area and spaced apart from each other in the second direction;
    dummy lines extending in the first direction in the pad area and spaced apart from the pad lines in the second direction; and
    dummy patterns electrically connected to and above at least part of the dummy lines in a thickness direction, wherein
    the dummy lines include first dummy lines and second dummy lines spaced apart from the first dummy lines in the first direction, and
    the dummy patterns include:
        a first dummy pattern electrically connected to the first dummy line; and
        a second dummy pattern electrically connected to the second dummy line and spaced apart from the first dummy pattern in the first direction.

2. The display device of claim 1, further comprising:
    a first dummy electrode disposed on the first dummy pattern; and
    a second dummy electrode disposed on the second dummy pattern and spaced apart from the first dummy electrode.

3. The display device of claim 2, wherein
    first dummy patterns and second dummy patterns are disposed to correspond to the first dummy lines and the second dummy lines, respectively, and
    the first dummy patterns and the second dummy patterns are spaced apart from each other in the second direction, respectively.

4. The display device of claim 2, wherein
    the first dummy pattern is electrically connected to the first dummy lines, and
    the second dummy pattern is electrically connected to the second dummy lines.

5. The display device of claim 2, wherein
    the first dummy electrode, the second dummy electrode, and the first electrode include a same material, or the first dummy electrode, the second dummy electrode, and the second electrode include a same material.

6. The display device of claim 1, further comprising:
    pads disposed on the pad lines and electrically connected to the pad lines, respectively.

7. The display device of claim 6, wherein
    the dummy lines are disposed on both sides of the pad area in the second direction, and
    the pad lines and the pads are disposed between the dummy lines disposed on the both sides of the pad area.

8. The display device of claim 6, wherein the dummy patterns are disposed so as not to be side by side with the pads in the second direction.

9. The display device of claim 8, wherein the dummy patterns are disposed more adjacent to the display area than the pads are.

10. The display device of claim 6, wherein the dummy patterns are disposed side by side with the pads in the second direction.

11. The display device of claim 1, further comprising:
    a connection line extending in the second direction and electrically connected to the second dummy lines,
    wherein the connection line is spaced apart from the pads in the first direction.

12. The display device of claim 11, wherein the pad lines include:
    first pad lines spaced apart from each other in the second direction,
    second pad lines disposed on a side of the first pad lines in the second direction, and
    a third pad line disposed between the first pad lines and the first dummy lines.

13. The display device of claim 12, further comprising:
    fan-out lines disposed on a side of the pad lines in the first direction and electrically connected to at least part of the pad lines,
    wherein the connection line overlaps the fan-out lines in a plan view.

14. The display device of claim 13, wherein the fan-out lines include:
    a first fan-out line electrically connected to the first pad lines;
    a second fan-out line electrically connected to the second pad lines and disposed inside the first fan-out line; and
    a third fan-out line electrically connected to the third pad line and disposed outside the first fan-out line.

15. A display device comprising:
    a gate insulating layer disposed on a substrate;
    a first conductive layer including:
        dummy lines disposed on the gate insulating layer; and
        pad lines spaced apart from the dummy lines;
    a first interlayer insulating layer disposed on the first conductive layer;
    a second conductive layer disposed on the first interlayer insulating layer and including dummy patterns electrically connected to at least part of the dummy lines and a pad base layer electrically connected to the pad line;
    a first passivation layer disposed on the second conductive layer;
    a third conductive layer including, on the first passivation layer:
        dummy electrodes disposed on the dummy patterns; and
        a pad upper layer disposed on the pad base layer; and
    a first insulating layer disposed on the third conductive layer, wherein the dummy lines include:
  a first dummy line; and
  a second dummy line spaced apart from the first dummy line, and
the dummy patterns include:
  a first dummy pattern electrically connected to the first dummy line through a first contact hole penetrating through the first interlayer insulating layer; and
  a second dummy pattern spaced apart from the first dummy pattern and electrically connected to the second dummy line through a second contact hole penetrating through the first interlayer insulating layer.

16. The display device of claim 15, wherein
the second conductive layer includes a connection line overlapping the second dummy line in a plan view, and
the connection line is electrically connected to the second dummy line through a third contact hole penetrating through the first interlayer insulating layer.

17. The display device of claim 15, wherein a side surface of the first dummy line is exposed at an edge of a side of the substrate.

18. The display device of claim 15, further comprising:
a second insulating layer disposed on the first insulating layer; and
a third insulating layer disposed on the second insulating layer, wherein
the first insulating layer and the second insulating layer expose a portion where the first dummy pattern and the second dummy pattern are spaced apart from each other, and
the third insulating layer overlaps in a plan view the portion where the first dummy pattern and the second dummy pattern are spaced apart from each other.

19. The display device of claim 18, further comprising:
a first pad capping layer disposed on the pad upper layer; and
a second pad capping layer disposed on the first pad capping layer, wherein
the second insulating layer is disposed between the first pad capping layer and the first insulating layer, and
the third insulating layer is disposed between the first pad capping layer and the second pad capping layer.

20. The display device of claim 18, wherein
the dummy electrode includes:
  a first dummy electrode disposed on the first dummy pattern; and
  a second dummy electrode disposed on the second dummy pattern, and
inner sides of the first dummy electrode and the second dummy electrode facing each other are side by side with inner sides of the first dummy pattern and the second dummy pattern facing each other, respectively.

* * * * *